US008717203B2

(12) United States Patent
Fallon

(10) Patent No.: US 8,717,203 B2
(45) Date of Patent: May 6, 2014

(54) DATA COMPRESSION SYSTEMS AND METHODS

(71) Applicant: James J. Fallon, Armonk, NY (US)

(72) Inventor: James J. Fallon, Armonk, NY (US)

(73) Assignee: Realtime Data, LLC, Armonk, NY (US)

( * ) Notice: Subject to any disclaimer, the term of this patent is extended or adjusted under 35 U.S.C. 154(b) by 0 days.

(21) Appl. No.: 14/035,561

(22) Filed: Sep. 24, 2013

(65) Prior Publication Data

US 2014/0022098 A1      Jan. 23, 2014

Related U.S. Application Data

(63) Continuation of application No. 13/154,211, filed on Jun. 6, 2011, which is a continuation of application No. 12/703,042, filed on Feb. 9, 2010, now Pat. No. 8,502,707, which is a continuation of application No. 11/651,366, filed on Jan. 8, 2007, now abandoned, which is a continuation of application No. 11/651,365, filed on Jan. 8, 2007, now Pat. No. 7,714,747, said application No. 11/651,366 is a continuation of application No. 10/668,768, filed on Sep. 22, 2003, now Pat. No. 7,161,506, which is a continuation of application No. 10/016,355, filed on Oct. 29, 2001, now Pat. No. 6,624,761, which is a continuation of application No. 09/705,446, filed on Nov. 3, 2000, now Pat. No. 6,309,424, which is a continuation of application No. 09/210,491, filed on Dec. 11, 1998, now Pat. No. 6,195,024.

(51) Int. Cl.
*H03M 7/34* (2006.01)

(52) U.S. Cl.
USPC .................. 341/51; 341/50; 341/65; 341/67; 341/87; 341/107

(58) Field of Classification Search
USPC .................... 341/51, 65, 67, 79, 87, 106, 107
See application file for complete search history.

(56) References Cited

U.S. PATENT DOCUMENTS 3,394,352 A   7/1968   Wernikoff et al.
3,490,690 A   1/1970   Apple et al.

(Continued)

FOREIGN PATENT DOCUMENTS

DE   4127518    2/1992
EP   0 164677   12/1985

(Continued)

OTHER PUBLICATIONS

Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, dated Jul. 27, 2009, 15 pages.

(Continued)

*Primary Examiner* — Linh Nguyen
(74) *Attorney, Agent, or Firm* — Sterne, Kessler, Goldstein & Fox, P.L.L.C

(57) ABSTRACT

Systems and methods for providing fast and efficient data compression using a combination of content independent data compression and content dependent data compression. In one aspect, a method for compressing data comprises the steps of: analyzing a data block of an input data stream to identify a data type of the data block, the input data stream comprising a plurality of disparate data types; performing content dependent data compression on the data block, if the data type of the data block is identified; performing content independent data compression on the data block, if the data type of the data block is not identified.

30 Claims, 34 Drawing Sheets

(56) References Cited

U.S. PATENT DOCUMENTS

| | | |
|---|---|---|
| 4,021,782 A | 5/1977 | Hoerning |
| 4,032,893 A | 6/1977 | Moran |
| 4,054,951 A | 10/1977 | Jackson et al. |
| 4,127,518 A | 11/1978 | Coy et al. |
| 4,302,775 A | 11/1981 | Widergren et al. |
| 4,325,085 A | 4/1982 | Gooch |
| 4,360,840 A | 11/1982 | Wolfrun et al. |
| 4,386,416 A | 5/1983 | Giltner et al. |
| 4,394,774 A | 7/1983 | Widergren et al. |
| 4,464,650 A | 8/1984 | Eastman |
| 4,494,108 A | 1/1985 | Langdon, Jr. et al. |
| 4,499,499 A | 2/1985 | Brickman et al. |
| 4,574,351 A | 3/1986 | Dang et al. |
| 4,593,324 A | 6/1986 | Ohkubo et al. |
| 4,626,829 A | 12/1986 | Hauck |
| 4,646,061 A | 2/1987 | Bledsoe |
| 4,682,150 A | 7/1987 | Mathes et al. |
| 4,701,745 A | 10/1987 | Waterworth |
| 4,729,020 A | 3/1988 | Schaphorst et al. |
| 4,730,348 A | 3/1988 | MacCrisken |
| 4,745,559 A | 5/1988 | Willis et al. |
| 4,748,638 A | 5/1988 | Freidman et al. |
| 4,750,135 A | 6/1988 | Boilen |
| 4,754,351 A | 6/1988 | Wright |
| 4,804,959 A | 2/1989 | Makansi et al. |
| 4,813,040 A | 3/1989 | Futato |
| 4,814,746 A | 3/1989 | Miller et al. |
| 4,862,167 A | 8/1989 | Copeland, III |
| 4,866,601 A | 9/1989 | DuLac et al. |
| 4,870,415 A | 9/1989 | Van Maren et al. |
| 4,872,009 A | 10/1989 | Tsukiyama et al. |
| 4,876,541 A | 10/1989 | Storer |
| 4,888,812 A | 12/1989 | Dinan et al. |
| 4,890,282 A | 12/1989 | Lambert et al. |
| 4,897,717 A | 1/1990 | Hamilton et al. |
| 4,906,991 A | 3/1990 | Fiala et al. |
| 4,906,995 A | 3/1990 | Swanson |
| 4,929,946 A | 5/1990 | O'Brien et al. |
| 4,953,324 A | 9/1990 | Hermann |
| 4,956,808 A | 9/1990 | Aakre et al. |
| 4,965,675 A | 10/1990 | Hori et al. |
| 4,988,998 A | 1/1991 | O'Brien |
| 5,003,307 A | 3/1991 | Whiting et al. |
| 5,016,009 A | 5/1991 | Whiting et al. |
| 5,027,376 A | 6/1991 | Freidman et al. |
| 5,028,922 A | 7/1991 | Huang |
| 5,045,848 A | 9/1991 | Fascenda |
| 5,045,852 A | 9/1991 | Mitchell et al. |
| 5,046,027 A | 9/1991 | Taaffe et al. |
| 5,049,881 A | 9/1991 | Gibson et al. |
| 5,079,630 A | 1/1992 | Golin |
| 5,091,782 A | 2/1992 | Krause et al. |
| 5,097,261 A | 3/1992 | Langdon, Jr. et al. |
| 5,103,306 A | 4/1992 | Weiman |
| 5,109,226 A | 4/1992 | MacLean, Jr. et al. |
| 5,109,433 A | 4/1992 | Notenboom |
| 5,113,522 A | 5/1992 | Dinwiddie, Jr. et al. |
| 5,115,309 A | 5/1992 | Hang |
| 5,121,342 A | 6/1992 | Szymborski |
| 5,126,739 A | 6/1992 | Whiting et al. |
| 5,128,963 A | 7/1992 | Akagiri |
| 5,132,992 A | 7/1992 | Yurt et al. |
| 5,146,221 A | 9/1992 | Whiting et al. |
| 5,150,430 A | 9/1992 | Chu |
| 5,155,484 A | 10/1992 | Chambers, IV |
| 5,159,336 A | 10/1992 | Rabin et al. |
| 5,167,034 A | 11/1992 | MacLean, Jr. et al. |
| 5,175,543 A | 12/1992 | Lantz |
| 5,179,651 A | 1/1993 | Taaffe et al. |
| 5,187,793 A | 2/1993 | Keith et al. |
| 5,191,431 A | 3/1993 | Hasegawa et al. |
| 5,204,756 A | 4/1993 | Chevion et al. |
| 5,209,220 A | 5/1993 | Hiyama et al. |
| 5,212,742 A | 5/1993 | Normile et al. |
| 5,226,176 A | 7/1993 | Westaway et al. |
| 5,227,893 A | 7/1993 | Ett |
| 5,231,492 A | 7/1993 | Dangi et al. |
| 5,237,460 A | 8/1993 | Miller et al. |
| 5,237,675 A | 8/1993 | Hannon, Jr. |
| 5,243,341 A | 9/1993 | Seroussi et al. |
| 5,243,348 A | 9/1993 | Jackson |
| 5,247,638 A | 9/1993 | O'Brien et al. |
| 5,247,646 A | 9/1993 | Osterlund et al. |
| 5,249,053 A | 9/1993 | Jain |
| 5,263,168 A | 11/1993 | Toms et al. |
| 5,267,333 A | 11/1993 | Aono |
| 5,270,832 A | 12/1993 | Balkanski et al. |
| 5,280,600 A | 1/1994 | Van Maren et al. |
| 5,287,420 A | 2/1994 | Barrett |
| 5,289,580 A | 2/1994 | Latif et al. |
| 5,293,379 A | 3/1994 | Carr |
| 5,293,576 A | 3/1994 | Mihm, Jr. et al. |
| 5,307,497 A | 4/1994 | Feigenbaum et al. |
| 5,309,555 A | 5/1994 | Akins et al. |
| 5,319,682 A | 6/1994 | Clark |
| 5,331,425 A | 7/1994 | Ozaki et al. |
| 5,341,440 A | 8/1994 | Earl et al. |
| 5,347,600 A | 9/1994 | Barnsley et al. |
| 5,353,132 A | 10/1994 | Katsuma |
| 5,354,315 A | 10/1994 | Armstrong |
| 5,355,498 A | 10/1994 | Provino et al. |
| 5,357,614 A | 10/1994 | Pattisam et al. |
| 5,367,629 A | 11/1994 | Chu et al. |
| 5,373,290 A | 12/1994 | Lempel et al. |
| 5,374,916 A | 12/1994 | Chu |
| 5,379,036 A | 1/1995 | Storer |
| 5,379,757 A | 1/1995 | Hiyama et al. |
| 5,381,145 A | 1/1995 | Allen et al. |
| 5,389,922 A | 2/1995 | Seroussi et al. |
| 5,394,534 A | 2/1995 | Kulakowski et al. |
| 5,396,228 A | 3/1995 | Garahi |
| 5,400,401 A | 3/1995 | Wasilewski et al. |
| 5,403,639 A | 4/1995 | Belsan et al. |
| 5,406,278 A | 4/1995 | Graybill et al. |
| 5,406,279 A | 4/1995 | Anderson et al. |
| 5,410,671 A | 4/1995 | Elgamal et al. |
| 5,412,384 A | 5/1995 | Chang et al. |
| 5,414,850 A | 5/1995 | Whiting |
| 5,420,639 A | 5/1995 | Perkins |
| 5,434,983 A | 7/1995 | Yaso et al. |
| 5,437,020 A | 7/1995 | Wells et al. |
| 5,452,287 A | 9/1995 | Dicecco et al. |
| 5,454,079 A | 9/1995 | Roper et al. |
| 5,454,107 A | 9/1995 | Lehman et al. |
| 5,455,576 A | 10/1995 | Clark, II et al. |
| 5,455,578 A | 10/1995 | Bhandari |
| 5,455,680 A | 10/1995 | Shin |
| 5,461,679 A | 10/1995 | Normile et al. |
| 5,463,390 A | 10/1995 | Whiting et al. |
| 5,467,087 A | 11/1995 | Chu |
| 5,471,206 A | 11/1995 | Allen et al. |
| 5,475,388 A | 12/1995 | Gormish et al. |
| 5,479,587 A | 12/1995 | Campbell et al. |
| 5,479,633 A | 12/1995 | Wells et al. |
| 5,483,470 A | 1/1996 | Alur et al. |
| 5,486,826 A | 1/1996 | Remillard |
| 5,488,364 A | 1/1996 | Cole |
| 5,488,365 A | 1/1996 | Seroussi et al. |
| 5,495,244 A | 2/1996 | Jeong et al. |
| 5,504,842 A | 4/1996 | Gentile |
| 5,506,844 A | 4/1996 | Rao |
| 5,506,872 A | 4/1996 | Mohler |
| 5,506,944 A | 4/1996 | Gentile |
| 5,521,940 A | 5/1996 | Lane et al. |
| 5,528,628 A | 6/1996 | Park et al. |
| 5,530,845 A | 6/1996 | Hiatt et al. |
| 5,533,051 A | 7/1996 | James |
| 5,535,311 A | 7/1996 | Zimmerman |
| 5,535,356 A | 7/1996 | Kim et al. |
| 5,535,369 A | 7/1996 | Wells et al. |
| 5,537,658 A | 7/1996 | Bakke et al. |
| 5,539,865 A | 7/1996 | Gentile |
| 5,542,031 A | 7/1996 | Douglass et al. |
| 5,544,290 A | 8/1996 | Gentile |

(56) References Cited

U.S. PATENT DOCUMENTS

| | | |
|---|---|---|
| 5,546,395 A | 8/1996 | Sharma et al. |
| 5,546,475 A | 8/1996 | Bolle et al. |
| 5,553,160 A | 9/1996 | Dawson |
| 5,557,551 A | 9/1996 | Craft |
| 5,557,668 A | 9/1996 | Brady |
| 5,557,749 A | 9/1996 | Norris |
| 5,561,421 A | 10/1996 | Smith et al. |
| 5,561,824 A | 10/1996 | Carreiro et al. |
| 5,563,961 A | 10/1996 | Rynderman et al. |
| 5,574,952 A | 11/1996 | Brady et al. |
| 5,574,953 A | 11/1996 | Rust et al. |
| 5,576,953 A | 11/1996 | Hugentobler |
| 5,577,248 A | 11/1996 | Chambers, IV |
| 5,581,715 A | 12/1996 | Verinsky et al. |
| 5,583,500 A | 12/1996 | Allen et al. |
| 5,586,264 A | 12/1996 | Belknap et al. |
| 5,586,285 A | 12/1996 | Hasbun et al. |
| 5,590,306 A | 12/1996 | Watanabe et al. |
| 5,596,674 A | 1/1997 | Bhandari et al. |
| 5,598,388 A | 1/1997 | Van Maren et al. |
| 5,604,824 A | 2/1997 | Chui et al. |
| 5,606,706 A | 2/1997 | Takamoto et al. |
| 5,610,657 A | 3/1997 | Zhang |
| 5,611,024 A | 3/1997 | Campbell et al. |
| 5,612,788 A | 3/1997 | Stone |
| 5,613,069 A | 3/1997 | Walker |
| 5,615,017 A | 3/1997 | Choi |
| 5,615,287 A | 3/1997 | Fu et al. |
| 5,619,995 A | 4/1997 | Lobodzinski |
| 5,621,820 A | 4/1997 | Rynderman et al. |
| 5,623,623 A | 4/1997 | Kim et al. |
| 5,623,701 A | 4/1997 | Bakke et al. |
| 5,627,534 A | 5/1997 | Craft |
| 5,627,995 A | 5/1997 | Miller et al. |
| 5,629,732 A | 5/1997 | Moskowitz et al. |
| 5,630,092 A | 5/1997 | Carreiro et al. |
| 5,635,632 A | 6/1997 | Fay et al. |
| 5,635,932 A | 6/1997 | Shinagawa et al. |
| 5,638,498 A | 6/1997 | Tyler et al. |
| 5,640,158 A | 6/1997 | Okayama et al. |
| 5,642,506 A | 6/1997 | Lee |
| 5,649,032 A | 7/1997 | Burt et al. |
| 5,652,795 A | 7/1997 | Dillon et al. |
| 5,652,857 A | 7/1997 | Shimoi et al. |
| 5,652,917 A | 7/1997 | Maupin et al. |
| 5,654,703 A | 8/1997 | Clark, II |
| 5,655,138 A | 8/1997 | Kikinis |
| 5,666,560 A | 9/1997 | Moertl et al. |
| 5,668,737 A | 9/1997 | Iler |
| 5,671,355 A | 9/1997 | Collins |
| 5,671,389 A | 9/1997 | Saliba |
| 5,671,413 A | 9/1997 | Shipman et al. |
| 5,673,370 A | 9/1997 | Laney |
| 5,675,333 A | 10/1997 | Boursier et al. |
| 5,675,789 A | 10/1997 | Ishii et al. |
| 5,686,916 A | 11/1997 | Bakhmutsky |
| 5,692,159 A | 11/1997 | Shand |
| 5,694,619 A | 12/1997 | Konno |
| 5,696,927 A | 12/1997 | MacDonald et al. |
| 5,703,793 A | 12/1997 | Wise et al. |
| 5,708,511 A | 1/1998 | Gandhi et al. |
| 5,715,477 A | 2/1998 | Kikinis |
| 5,717,393 A | 2/1998 | Nakano et al. |
| 5,717,394 A | 2/1998 | Schwartz et al. |
| 5,719,862 A | 2/1998 | Lee et al. |
| 5,721,958 A | 2/1998 | Kikinis |
| 5,724,475 A | 3/1998 | Kirsten |
| 5,729,228 A | 3/1998 | Franaszek et al. |
| 5,740,395 A | 4/1998 | Wells et al. |
| 5,742,773 A | 4/1998 | Blomfield-Brown et al. |
| 5,748,904 A | 5/1998 | Huang et al. |
| 5,757,852 A | 5/1998 | Jericevic et al. |
| 5,764,774 A | 6/1998 | Liu |
| 5,765,027 A | 6/1998 | Wang et al. |
| 5,767,898 A | 6/1998 | Urano et al. |
| 5,768,445 A | 6/1998 | Troeller et al. |
| 5,768,525 A | 6/1998 | Kralowetz et al. |
| 5,771,340 A | 6/1998 | Nakazato et al. |
| 5,774,715 A | 6/1998 | Madany et al. |
| 5,778,411 A | 7/1998 | DeMoss et al. |
| 5,781,767 A | 7/1998 | Inoue et al. |
| 5,784,572 A | 7/1998 | Rostoker et al. |
| 5,784,631 A * | 7/1998 | Wise .............................. 382/246 |
| 5,787,487 A | 7/1998 | Hashimoto et al. |
| 5,794,229 A | 8/1998 | French et al. |
| 5,796,864 A | 8/1998 | Callahan |
| 5,799,110 A | 8/1998 | Israelsen et al. |
| 5,805,834 A | 9/1998 | McKinley et al. |
| 5,805,932 A | 9/1998 | Kawashima et al. |
| 5,807,036 A * | 9/1998 | Lostlen .......................... 408/97 |
| 5,808,660 A | 9/1998 | Sekine et al. |
| 5,809,176 A | 9/1998 | Yajima |
| 5,809,299 A | 9/1998 | Cloutier et al. |
| 5,809,337 A | 9/1998 | Hannah et al. |
| 5,812,195 A | 9/1998 | Zhang |
| 5,812,789 A | 9/1998 | Diaz et al. |
| 5,818,368 A | 10/1998 | Langley |
| 5,818,369 A | 10/1998 | Withers |
| 5,818,530 A | 10/1998 | Canfield et al. |
| 5,819,215 A | 10/1998 | Dobson et al. |
| 5,822,781 A | 10/1998 | Wells et al. |
| 5,825,424 A | 10/1998 | Canfield et al. |
| 5,825,830 A | 10/1998 | Kopf |
| 5,832,037 A | 11/1998 | Park |
| 5,832,126 A | 11/1998 | Tanaka |
| 5,832,443 A | 11/1998 | Kolesnik et al. |
| 5,835,788 A | 11/1998 | Blumer et al. |
| 5,836,003 A | 11/1998 | Sadeh |
| 5,838,821 A | 11/1998 | Matsubara et al. |
| 5,838,927 A | 11/1998 | Gillon |
| 5,838,996 A | 11/1998 | deCarmo |
| 5,839,100 A | 11/1998 | Wegener |
| 5,841,979 A | 11/1998 | Schulhof et al. |
| 5,847,762 A | 12/1998 | Canfield et al. |
| 5,850,565 A | 12/1998 | Wightman |
| 5,856,797 A * | 1/1999 | Kawauchi ...................... 341/76 |
| 5,861,824 A | 1/1999 | Ryu et al. |
| 5,861,920 A | 1/1999 | Mead et al. |
| 5,864,342 A | 1/1999 | Kajiya et al. |
| 5,864,678 A | 1/1999 | Riddle |
| 5,867,167 A | 2/1999 | Deering |
| 5,867,602 A | 2/1999 | Zandi et al. |
| 5,870,036 A | 2/1999 | Franaszek et al. |
| 5,870,087 A | 2/1999 | Chau |
| 5,872,530 A | 2/1999 | Domyo et al. |
| 5,874,907 A | 2/1999 | Craft |
| 5,883,975 A | 3/1999 | Narita et al. |
| 5,884,269 A | 3/1999 | Cellier et al. |
| 5,886,655 A | 3/1999 | Rust |
| 5,887,165 A | 3/1999 | Martel et al. |
| 5,889,961 A | 3/1999 | Dobbek |
| 5,892,847 A | 4/1999 | Johnson |
| 5,907,801 A | 5/1999 | Albert et al. |
| 5,909,557 A | 6/1999 | Betker et al. |
| 5,909,559 A | 6/1999 | So |
| 5,915,079 A | 6/1999 | Vondran, Jr. et al. |
| 5,917,438 A | 6/1999 | Ando |
| 5,918,068 A | 6/1999 | Shafe |
| 5,918,225 A | 6/1999 | White et al. |
| 5,920,326 A | 7/1999 | Rentschler et al. |
| 5,923,860 A | 7/1999 | Olarig |
| 5,930,358 A | 7/1999 | Rao |
| 5,936,616 A | 8/1999 | Torborg, Jr. et al. |
| 5,938,737 A | 8/1999 | Smallcomb et al. |
| 5,943,692 A | 8/1999 | Marberg |
| 5,945,933 A | 8/1999 | Kalkstein |
| 5,949,355 A | 9/1999 | Panaoussis |
| 5,949,968 A | 9/1999 | Gentile |
| 5,951,623 A | 9/1999 | Reynar et al. |
| 5,955,976 A | 9/1999 | Heath |
| 5,956,490 A | 9/1999 | Buchholz et al. |
| 5,960,465 A | 9/1999 | Adams |
| 5,964,842 A | 10/1999 | Packard |
| 5,968,149 A | 10/1999 | Jaquette et al. |

(56) References Cited

U.S. PATENT DOCUMENTS

| | | | |
|---|---|---|---|
| 5,969,927 A | 10/1999 | Schirmer et al. | |
| 5,973,630 A * | 10/1999 | Heath | 341/87 |
| 5,974,235 A | 10/1999 | Nunally et al. | |
| 5,974,387 A | 10/1999 | Kageyama | |
| 5,974,471 A | 10/1999 | Belt | |
| 5,978,483 A | 11/1999 | Thompson, Jr. et al. | |
| 5,982,360 A | 11/1999 | Wu et al. | |
| 5,982,723 A | 11/1999 | Kamatani | |
| 5,982,937 A | 11/1999 | Accad | |
| 5,987,022 A | 11/1999 | Geiger et al. | |
| 5,987,432 A | 11/1999 | Zusman et al. | |
| 5,987,590 A | 11/1999 | So | |
| 5,990,884 A | 11/1999 | Douma et al. | |
| 5,991,515 A | 11/1999 | Fall et al. | |
| 5,996,033 A | 11/1999 | Chiu-Hao | |
| 6,000,009 A | 12/1999 | Brady | |
| 6,002,411 A | 12/1999 | Dye | |
| 6,003,115 A | 12/1999 | Spear et al. | |
| 6,008,743 A | 12/1999 | Jaquette | |
| 6,009,491 A | 12/1999 | Roppel et al. | |
| 6,011,901 A | 1/2000 | Kirsten | |
| 6,014,694 A | 1/2000 | Aharoni et al. | |
| 6,021,433 A | 2/2000 | Payne | |
| 6,023,755 A | 2/2000 | Casselman | |
| 6,026,217 A | 2/2000 | Adiletta | |
| 6,028,725 A | 2/2000 | Blumenau | |
| 6,031,939 A | 2/2000 | Gilbert et al. | |
| 6,032,148 A | 2/2000 | Wilkes | |
| 6,032,197 A | 2/2000 | Birdwell et al. | |
| 6,038,346 A | 3/2000 | Ratnakar | |
| 6,058,459 A | 5/2000 | Owen et al. | |
| 6,061,398 A | 5/2000 | Satoh et al. | |
| 6,061,473 A | 5/2000 | Chen et al. | |
| 6,070,179 A | 5/2000 | Craft | |
| 6,073,232 A | 6/2000 | Kroeker et al. | |
| 6,075,470 A | 6/2000 | Little et al. | |
| 6,078,958 A | 6/2000 | Echeita et al. | |
| 6,091,777 A | 7/2000 | Guetz et al. | |
| 6,092,123 A | 7/2000 | Steffan et al. | |
| 6,094,634 A | 7/2000 | Yahagi et al. | |
| 6,097,520 A | 8/2000 | Kadnier | |
| 6,097,845 A | 8/2000 | Ng et al. | |
| 6,098,114 A | 8/2000 | McDonald et al. | |
| 6,104,389 A | 8/2000 | Ando | |
| 6,105,130 A | 8/2000 | Wu et al. | |
| 6,115,384 A | 9/2000 | Parzych | |
| 6,128,412 A | 10/2000 | Satoh | |
| 6,134,631 A | 10/2000 | Jennings, III | |
| 6,141,053 A | 10/2000 | Saukkonen | |
| 6,145,020 A | 11/2000 | Barnett | |
| 6,145,069 A | 11/2000 | Dye | |
| 6,169,241 B1 | 1/2001 | Shimizu | |
| 6,170,007 B1 | 1/2001 | Venkatraman et al. | |
| 6,170,047 B1 | 1/2001 | Dye | |
| 6,170,049 B1 | 1/2001 | So | |
| 6,172,936 B1 | 1/2001 | Kitazaki | |
| 6,173,381 B1 | 1/2001 | Dye | |
| 6,175,650 B1 | 1/2001 | Sindhu et al. | |
| 6,175,856 B1 | 1/2001 | Riddle | |
| 6,182,125 B1 | 1/2001 | Borella et al. | |
| 6,185,625 B1 | 2/2001 | Tso et al. | |
| 6,185,659 B1 | 2/2001 | Milillo et al. | |
| 6,192,082 B1 | 2/2001 | Moriarty et al. | |
| 6,192,155 B1 | 2/2001 | Fan | |
| 6,195,024 B1 | 2/2001 | Fallon | |
| 6,195,125 B1 | 2/2001 | Udagawa et al. | |
| 6,195,391 B1 | 2/2001 | Hancock et al. | |
| 6,195,465 B1 | 2/2001 | Zandi et al. | |
| 6,198,842 B1 | 3/2001 | Yeo | |
| 6,198,850 B1 | 3/2001 | Banton | |
| 6,208,273 B1 | 3/2001 | Dye et al. | |
| 6,215,904 B1 | 4/2001 | Lavellee | |
| 6,219,754 B1 | 4/2001 | Belt et al. | |
| 6,222,886 B1 | 4/2001 | Yogeshwar | |
| 6,225,922 B1 | 5/2001 | Norton | |
| 6,226,667 B1 | 5/2001 | Matthews et al. | |
| 6,226,740 B1 | 5/2001 | Iga | |
| 6,230,223 B1 | 5/2001 | Olarig | |
| 6,237,054 B1 | 5/2001 | Freitag, Jr. | |
| 6,243,829 B1 | 6/2001 | Chan | |
| 6,253,264 B1 | 6/2001 | Sebastian | |
| 6,272,178 B1 | 8/2001 | Nieweglowski et al. | |
| 6,272,627 B1 | 8/2001 | Mann | |
| 6,272,628 B1 | 8/2001 | Aguilar et al. | |
| 6,282,641 B1 | 8/2001 | Christensen | |
| 6,285,458 B1 | 9/2001 | Yada | |
| 6,298,408 B1 | 10/2001 | Park | |
| 6,308,311 B1 | 10/2001 | Carmichael et al. | |
| 6,309,424 B1 | 10/2001 | Fallon | |
| 6,310,563 B1 | 10/2001 | Har et al. | |
| 6,317,714 B1 | 11/2001 | Del Castillo et al. | |
| 6,317,818 B1 | 11/2001 | Zwiegincew et al. | |
| 6,330,622 B1 | 12/2001 | Shaefer | |
| 6,333,745 B1 | 12/2001 | Shimomura et al. | |
| 6,336,153 B1 | 1/2002 | Izumida et al. | |
| 6,345,307 B1 | 2/2002 | Booth | |
| 6,356,589 B1 | 3/2002 | Gebler et al. | |
| 6,356,937 B1 | 3/2002 | Montville et al. | |
| 6,374,353 B1 | 4/2002 | Settsu et al. | |
| 6,388,584 B1 | 5/2002 | Dorward et al. | |
| 6,392,567 B2 | 5/2002 | Satoh | |
| 6,404,931 B1 | 6/2002 | Chen et al. | |
| 6,421,387 B1 | 7/2002 | Rhee | |
| 6,434,168 B1 | 8/2002 | Kari | |
| 6,434,695 B1 | 8/2002 | Esfahani et al. | |
| 6,442,659 B1 | 8/2002 | Blumenau | |
| 6,449,658 B1 | 9/2002 | Lafe et al. | |
| 6,449,682 B1 | 9/2002 | Toorians | |
| 6,452,602 B1 | 9/2002 | Morein | |
| 6,452,933 B1 | 9/2002 | Duffield et al. | |
| 6,459,429 B1 | 10/2002 | Deering | |
| 6,463,509 B1 | 10/2002 | Teoman et al. | |
| 6,487,640 B1 | 11/2002 | Lipasti | |
| 6,489,902 B2 | 12/2002 | Heath | |
| 6,505,239 B1 | 1/2003 | Kobata | |
| 6,513,113 B1 | 1/2003 | Kobayashi | |
| 6,523,102 B1 | 2/2003 | Dye et al. | |
| 6,526,174 B1 | 2/2003 | Graffagnino | |
| 6,529,633 B1 | 3/2003 | Easwar et al. | |
| 6,532,121 B1 | 3/2003 | Rust et al. | |
| 6,539,438 B1 | 3/2003 | Ledzius et al. | |
| 6,539,456 B2 | 3/2003 | Stewart | |
| 6,542,644 B1 | 4/2003 | Satoh | |
| 6,577,254 B2 | 6/2003 | Rasmussen | |
| 6,590,609 B1 | 7/2003 | Kitade et al. | |
| 6,597,812 B1 | 7/2003 | Fallon et al. | |
| 6,601,104 B1 | 7/2003 | Fallon | |
| 6,604,040 B2 | 8/2003 | Kawasaki et al. | |
| 6,604,158 B1 | 8/2003 | Fallon | |
| 6,606,040 B2 | 8/2003 | Abdat | |
| 6,606,413 B1 | 8/2003 | Zeineh | |
| 6,609,223 B1 | 8/2003 | Wolfgang | |
| 6,618,728 B1 | 9/2003 | Rail | |
| 6,624,761 B2 | 9/2003 | Fallon | |
| 6,633,244 B2 | 10/2003 | Avery | |
| 6,633,968 B2 | 10/2003 | Zwiegincew et al. | |
| 6,650,261 B2 | 11/2003 | Nelson et al. | |
| 6,661,839 B1 | 12/2003 | Ishida et al. | |
| 6,661,845 B1 | 12/2003 | Herath | |
| 6,704,840 B2 | 3/2004 | Nalawadi et al. | |
| 6,708,220 B1 | 3/2004 | Olin | |
| 6,711,709 B1 | 3/2004 | York | |
| 6,717,534 B2 | 4/2004 | Yokose | |
| 6,731,814 B2 | 5/2004 | Zeck et al. | |
| 6,745,282 B2 | 6/2004 | Okada et al. | |
| 6,748,457 B2 | 6/2004 | Fallon et al. | |
| 6,756,922 B2 | 6/2004 | Ossia | |
| 6,768,749 B1 | 7/2004 | Osler et al. | |
| 6,792,151 B1 | 9/2004 | Barnes et al. | |
| 6,810,434 B2 | 10/2004 | Muthujumaraswathy et al. | |
| 6,813,689 B2 | 11/2004 | Baxter, III | |
| 6,819,271 B2 | 11/2004 | Geiger et al. | |
| 6,822,589 B1 | 11/2004 | Dye et al. | |
| 6,856,651 B2 | 2/2005 | Singh | |

(56) References Cited

U.S. PATENT DOCUMENTS

| | | | |
|---|---|---|---|
| 6,862,278 B1 | 3/2005 | Chang et al. | |
| 6,879,266 B1 | 4/2005 | Dye et al. | |
| 6,885,316 B2 | 4/2005 | Mehring | |
| 6,885,319 B2* | 4/2005 | Geiger et al. | 341/51 |
| 6,888,893 B2 | 5/2005 | Li et al. | |
| 6,909,383 B2 | 6/2005 | Shokrollahi et al. | |
| 6,909,745 B1* | 6/2005 | Puri et al. | 375/240.01 |
| 6,944,740 B2 | 9/2005 | Abali et al. | |
| 6,952,409 B2 | 10/2005 | Jolitz | |
| 6,959,359 B1 | 10/2005 | Suzuki et al. | |
| 6,963,608 B1 | 11/2005 | Wu | |
| 6,990,247 B2 | 1/2006 | Schwartz | |
| 6,993,597 B2 | 1/2006 | Nakagawa et al. | |
| 7,007,099 B1 | 2/2006 | Donati et al. | |
| 7,024,460 B2 | 4/2006 | Koopmas | |
| 7,054,493 B2 | 5/2006 | Schwartz | |
| 7,069,342 B1 | 6/2006 | Biederman | |
| 7,089,391 B2 | 8/2006 | Geiger et al. | |
| 7,102,544 B1 | 9/2006 | Liu | |
| 7,127,518 B2 | 10/2006 | Vange et al. | |
| 7,129,860 B2 | 10/2006 | Alvarez, II | |
| 7,130,913 B2 | 10/2006 | Fallon | |
| 7,161,506 B2 | 1/2007 | Fallon | |
| 7,181,608 B2 | 2/2007 | Fallon et al. | |
| 7,190,284 B1 | 3/2007 | Dye et al. | |
| 7,319,667 B1 | 1/2008 | Biederman | |
| 7,321,937 B2 | 1/2008 | Fallon | |
| RE40,092 E | 2/2008 | Kang | |
| 7,327,287 B2* | 2/2008 | Martinian et al. | 341/51 |
| 7,330,912 B1 | 2/2008 | Fox et al. | |
| 7,352,300 B2 | 4/2008 | Fallon | |
| 7,358,867 B2 | 4/2008 | Fallon | |
| 7,376,772 B2 | 5/2008 | Fallon | |
| 7,378,992 B2 | 5/2008 | Fallon | |
| 7,386,046 B2 | 6/2008 | Fallon et al. | |
| 7,395,345 B2 | 7/2008 | Fallon | |
| 7,400,274 B2 | 7/2008 | Fallon et al. | |
| 7,415,530 B2 | 8/2008 | Fallon | |
| 7,417,568 B2 | 8/2008 | Fallon et al. | |
| 7,552,069 B2 | 6/2009 | Kepecs | |
| 7,565,441 B2 | 7/2009 | Romanik et al. | |
| 7,711,938 B2* | 5/2010 | Wise et al. | 712/300 |
| 7,714,747 B2 | 5/2010 | Fallon | |
| 7,777,651 B2 | 8/2010 | Fallon et al. | |
| 8,004,431 B2* | 8/2011 | Reznik | 341/67 |
| 8,054,879 B2 | 11/2011 | Fallon et al. | |
| 8,073,047 B2 | 12/2011 | Fallon et al. | |
| 8,090,936 B2 | 1/2012 | Fallon et al. | |
| 8,112,619 B2 | 2/2012 | Fallon et al. | |
| 8,275,897 B2 | 9/2012 | Fallon | |
| 8,502,707 B2 | 8/2013 | Fallon | |
| 8,504,710 B2 | 8/2013 | Fallon | |
| 8,553,759 B2 | 10/2013 | Fallon et al. | |
| 2001/0019630 A1* | 9/2001 | Johnson | 382/232 |
| 2001/0031092 A1* | 10/2001 | Zeck et al. | 382/239 |
| 2001/0032128 A1 | 10/2001 | Kepecs | |
| 2001/0047473 A1 | 11/2001 | Fallon | |
| 2001/0052038 A1 | 12/2001 | Fallon et al. | |
| 2001/0054131 A1 | 12/2001 | Alvarez, II et al. | |
| 2002/0037035 A1 | 3/2002 | Singh | |
| 2002/0069354 A1 | 6/2002 | Fallon et al. | |
| 2002/0080871 A1* | 6/2002 | Fallon et al. | 375/240 |
| 2002/0097172 A1 | 7/2002 | Fallon | |
| 2002/0101367 A1 | 8/2002 | Geiger et al. | |
| 2002/0104891 A1 | 8/2002 | Otto | |
| 2002/0126755 A1 | 9/2002 | Li et al. | |
| 2002/0169950 A1 | 11/2002 | Esfahani et al. | |
| 2002/0191692 A1 | 12/2002 | Fallon et al. | |
| 2003/0030575 A1 | 2/2003 | Frachtenberg et al. | |
| 2003/0034905 A1 | 2/2003 | Anton et al. | |
| 2003/0084238 A1 | 5/2003 | Okada et al. | |
| 2003/0090397 A1* | 5/2003 | Rasmussen | 341/51 |
| 2003/0142874 A1 | 7/2003 | Schwartz | |
| 2003/0191876 A1 | 10/2003 | Fallon | |
| 2004/0042506 A1 | 3/2004 | Fallon et al. | |
| 2004/0056783 A1 | 3/2004 | Fallon | |
| 2004/0073710 A1 | 4/2004 | Fallon | |
| 2004/0073746 A1 | 4/2004 | Fallon | |
| 2006/0015650 A1 | 1/2006 | Fallon | |
| 2006/0181441 A1 | 8/2006 | Fallon | |
| 2006/0181442 A1 | 8/2006 | Fallon | |
| 2006/0184687 A1 | 8/2006 | Fallon | |
| 2006/0184696 A1 | 8/2006 | Fallon | |
| 2006/0190644 A1 | 8/2006 | Fallon | |
| 2006/0195601 A1 | 8/2006 | Fallon | |
| 2007/0043939 A1 | 2/2007 | Fallon et al. | |
| 2007/0050514 A1 | 3/2007 | Fallon | |
| 2007/0050515 A1 | 3/2007 | Fallon | |
| 2007/0067483 A1 | 3/2007 | Fallon | |
| 2007/0083746 A1 | 4/2007 | Fallon et al. | |
| 2007/0109154 A1 | 5/2007 | Fallon | |
| 2007/0109155 A1 | 5/2007 | Fallon | |
| 2007/0109156 A1 | 5/2007 | Fallon | |
| 2007/0174209 A1 | 7/2007 | Fallon | |
| 2008/0232457 A1 | 9/2008 | Fallon et al. | |
| 2009/0125698 A1 | 5/2009 | Dye | |
| 2009/0154545 A1 | 6/2009 | Fallon et al. | |
| 2009/0287839 A1 | 11/2009 | Fallon et al. | |
| 2010/0316114 A1 | 12/2010 | Fallon et al. | |
| 2010/0318684 A1 | 12/2010 | Fallon | |
| 2010/0332700 A1 | 12/2010 | Fallon | |
| 2011/0037626 A1 | 2/2011 | Fallon | |
| 2011/0199243 A1 | 8/2011 | Fallon et al. | |
| 2011/0208833 A1 | 8/2011 | Fallon | |
| 2011/0231642 A1 | 9/2011 | Fallon et al. | |
| 2011/0235697 A1 | 9/2011 | Fallon et al. | |
| 2011/0285559 A1 | 11/2011 | Fallon | |
| 2012/0194362 A1 | 8/2012 | Fallon et al. | |
| 2012/0239921 A1 | 9/2012 | Fallon | |

FOREIGN PATENT DOCUMENTS

| | | |
|---|---|---|
| EP | 0 185098 | 6/1986 |
| EP | 0283798 | 9/1988 |
| EP | 0405572 | 1/1991 |
| EP | 0493130 | 7/1992 |
| EP | 0587437 | 3/1994 |
| EP | 0595406 | 5/1994 |
| EP | 0718751 | 6/1996 |
| EP | 0 928 070 A2 | 7/1999 |
| GB | 2162025 | 1/1986 |
| JP | 04-241681 | 8/1992 |
| JP | 6051989 | 2/1994 |
| JP | 9188009 | 7/1997 |
| JP | 11149376 | 6/1999 |
| WO | WO 9414273 | 6/1994 |
| WO | WO 9429852 | 12/1994 |
| WO | WO 9502873 | 1/1995 |
| WO | WO 95/29437 A1 | 11/1995 |
| WO | WO 9748212 | 12/1997 |
| WO | WO9839699 A2 | 9/1998 |
| WO | WO 9908186 | 2/1999 |
| WO | WO0036754 A1 | 6/2000 |
| WO | WO 01/57642 | 8/2001 |
| WO | WO 01/57659 | 8/2001 |
| WO | WO 01/63772 | 8/2001 |
| WO | WO 02/39591 | 5/2002 |

OTHER PUBLICATIONS

Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in *Realtime Data, LLC d/b/a/ IXO v. Packeteer, Inc, et al.*, Civil Action No. 6:08-cv-00144-LED; U.S. District Court for the Eastern District of Texas, Jul. 31, 2009, 3 pgs.

Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, dated Aug. 3, 2009, 3 pages.

(56) References Cited

OTHER PUBLICATIONS

"A-T Financial Offers Manipulation, Redistribution of Ticker III", Inside Market Data, vol. 4 No. 14, Sep. 5, 1989,1 page.
"Add-on Options for the XpressFiles", Intelligent Compression Technologies, http://web.archive.org/web/19980518053418/ictcompress.com/options_X.html, 1998, 2 pages.
Andrews et al., "A Mean-Removed Variation of Weighted Universal Vector Quantization for Image Coding", IEEE, 1993, pp. 302-309.
Asserted Claims Chart for U.S. Patent No. 6,624,761, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 4 pages.
Asserted Claims Chart for U.S. Patent No. 7,161,506,*Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 5 pages.
Asserted Claims Chart for U.S. Patent No. 7,400,274, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 6 pages.
Asserted Claims Chart for U.S. Patent No. 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 13 pages.
Asserted Claims Chart for U.S. Patent No. 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 19 pages.
Barton, Rich, S&P ComStock Network Character Set Definition, 19.2 KB Network, Version 1.7.0, Feb. 10, 1995, 29 pages.
Beech, W. A., et al., "AX.25 Link Access Protocol for Amateur Packet Radio," Version 2.2, Revision: Jul. 1998, 143 pages.
Bormann, Carsten, "Providing Integrated Services over Low-bitrate Links," Network Working Group Request for Comments: 2689, Category: Informational, Sep. 1999, 14 pages.
ComStock Services Pamphlet, McGraw-Hill Financial Services Company, purportedly published by Jul. 19, 1995, 6 pages.
Cormack, Gordon V., "Data Compression on a Database System", Communications of the ACM, vol. 28, No. 12, Dec. 1985, pp. 1336-1342.
Danskin, John Moffatt, "Compressing the X Graphics Protocol: A Dissertation Presented to the Facult of Princeton University in Candidacy for the Degree of Doctor of Philosophy," Jan. 1995, 147 pages.
"Data Networks and Open System Communications," Information Technology—Abstract Syntax Notation One (ASN. 1) Specification of Basic Notation, International Telecommunication Union, ITU-T Telecommunication Standardization Sector of ITU X.680, Jul. 1994.
Defendants' Invalidity Contentions, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 19 pages.
Degermark, Mikael, "IP Header Compression", Network Working Group Request for Comments: 2507, Category: Standards Track, Feb. 1999, 47 pages.
Developer's Guide, Version 1.0.2, S&P ComStock, Feb. 15, 1994, 186 pages.
Domanski, Dr. Bernie, "All the news you can eat, Department: Dr. Bernie's Digestions and Digressions", Demand Technology's Capacity Management Review, vol. 25, No. 7, Jul. 1997, pp. 24, 18-22.
Effros, Michelle and Philip A. Chou, "Weighted Universal Transform Coding: Universal Image Compression with the Karhunen-Loeve Transform", IEEE, 1995, pp. 61-64.
Engan, Mathias, "IP Header Compression over PPP", Network Working Group Request for Comments: 2509, Category: 2509, Feb. 1999, 10 pages.

Exhibit A, Invalidity Claim Charts A1-A45 for U.S. Patent 6,624,761, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 616 pages.
Exhibit B, Invalidity Claim Charts B1-B45 for U.S. Patent 7,161,506, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 1513 pages.
Exhibit C, Invalidity Claim Charts C1-C7, C9-C31, C33-C45 for U.S. Patent 7,400,274, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 1528 pages.
Exhibit D, Invalidity Claim Charts D1-D7, D9-D45 for U.S. Patent 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 2458 pages.
Exhibit E, Invalidity Claim Charts E1-E7, E9, E11, E13-E15, E17-E30, E32-E45 for U.S. Patent 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 3312 pages.
Greene, Tim, "Squeeze your 'Net links", NetworkWorld, vol. 14, No. 28, Jul. 14, 1997, pp. 1 and 56.
Helck, Christopher J., "Encapsulated Ticker: Ver 1.0," Jul. 14, 1993, 22 pages.
"High-performance schema-specific compression for XML data formats," XML-Xpress: Product Overview, Intelligent Compression Technologies, http://web.archive.org/web/20020818002535/www.ictcompress.com/products_xmlxpress, 2001, 2 pages.
Hsu, William H. and Amy E. Zwarico, "Automatic Synthesis of Compression Techniques for Heterogeneous Files," Software—Practice and Experience, vol. 25 (10), Oct. 1995, pp. 1097-1116.
"ICT's XML-Xpress", Intelligent Compression Technologies, Dec. 2000, 6 pages.
"Information processing systems—Data communication—High-level data link control procedures—Frame structure", UNI ISO 3309, 1984, 11 pages.
Installing and Administering PPP, Edition 1, Hewlett-Packard Company, 1997, 169 pages.
"Introducing XpressFiles", Intelligent Compression Technologies, http://web.archive.org/web/19980518053310/ictcompress.com/xpressfiles.html, 1998, 1 page.
"Ion's RemoteScript speeds transmission", Seybold Report on Publishing Systems, vol. 22 No. 5, Nov. 9, 1992, pp. 21-23.
Jacobson, V., "Compressing TCP/IP Headers for Low-Speed Serial Links," Feb. 1990, 45 pages.
Kulkosky, Victor, "Upping the Ante", Wall Street & Technology, vol. 11 No. 5, Oct. 1993, pp. 8-11.
Liefke, Hartmut and Dan Suciu, "An Extensible Compressor for XML Data," SIGMOD Record, Vol, 29, No. 1, Mar. 2000, pp. 57-62.
Liefke, Hartmut and Dan Suciu, "XMill: an Efficient Compressor for XML Data," 2000, pp. 153-164.
Liefke, Hartmut and Dan Suciu, Xmill: an Efficient Compressor for XML Data, Oct. 18, 1999,25 pages.
McGregor, Glenn, "The PPP Internet Protocol Control Protocol (IPCP)", Network Working Group Request for Comments: 1332, Obsoletes: RFC 1172, May 1992, 14 pages.
Obviousness Chart for U.S. Pat. No. 6,624,761, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 19 pages.
Obviousness Chart for U.S. Pat. No. 7,161,506, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 49 pages.
Obviousness Chart for U.S. Pat. No. 7,400,274, *Realtime Data, LLC D/B/A IXO v. CME Group Inc., et al.*, 6:09-cv-327-LED-JDL, 6:10-ev-246-LED-JDL, United States District Court for the Eastern District of Texas Tyler Division, Oct. 19, 2010, 41 pages.

(56) References Cited

OTHER PUBLICATIONS

Obviousness Chart for U.S. Pat. No. 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 75 pages.
Obviousness Chart for U.S. Pat. No. 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 97 pages.
Open Financial Exchange Specification 2.0, Intuit Inc., Microsoft Corp., Apr. 28, 2000, 537 pages.
Rand, Dave, "The PPP Compression Control Protocol (CCP)", Network Working Group Request for Comments: 1962, Category: Standards Track, Jun. 1996, 9 pages.
Rogers, Amy, "Bandwidth Bargain IT hot on products that squeeze more out of the pipe", No. 673, Jul. 21, 1997, pp. 1 and 65.
Roth, Mark A. and Scott J. Van Horn, "Database Compression", SIGMOD Record, vol. 22, No. 3, Sep. 1993, pp. 31-39.
Schmerken, Ivy, "Time Running Out for Old Technologies", Wall Street Computer Review, Apr. 1990, pp. 14-16, 23-24, 28, 56.
"Scrolling News", Inside Market Data, Feb. 27, 1995, 2 pages.
Simpson, W., "PPP in HDLC-like Framing", Network Working Group Request for Comments: 1662, STD 51, Obsoletes 1549, Category: Standards Track, Jul. 1994, 26 pages.
Suciu, Dan, Data Management on the Web, AT&T Labs, Apr. 4, 2000, 52 slides.
Suciu, Dan, "Data Management on the Web: Abstract," University of Washington Computer Science & Engineering, Apr. 4, 2000, 1 page.
"Telekurs Buys S&P Trading Systems and Its Ticker III Feed", Inside Market Data, vol. 4, No. 11, Jul. 10, 1989, 1 page.
"Telekurs May Debut 128 KPS Ticker by Year's End", Inside Market Data, Jul. 18, 1994, 2 pages.
"Telekurs Now Carries All Dow Jones' News on 56-Kbps Ticker," Inside Market Data, Dec. 20, 1993, 2 pages.
"Telekurs Sells No. American Division in Mgmt. Buyout", Inside Market Data, Oct. 23, 1995, 2 pages.
"Telekurs to Launch New Int'l Feed/Internet Server", Wall Street & Technology, vol. 15, No. 1, Jan. 1997, p. 14.
"The Technology Behind XpressFiles", Intelligent Compression Technologies, http://web.archive.org/web/19980518053634/ictcompress.com/technical_X.html, 1998, 1 page.
TID Information: Revisions to TID Program Since the Dawn of Time!!! Version 1.0, 23 pages; TID Codes 1, 1 page; TID Codes 2, 1 page, purportedly by Jul. 19, 1995.
TypeWorld: The First and Only Newspaper for Electronic Publishing, vol. 16 No. 9, Jun. 17, 1992, 3 pages.
"XpressFiles White Paper", Intelligent Compression Technologies, 1999-2001, 3 pages.
U.S. Appl. No. 60/309,218, filed Jul. 31, 2001.
Telekurs Manual, Jan. 11, 1993, 184 pages.
Danskin, et al., "Fast Higher Bandwidth X," Dartmouth College, Hanover, NH, 1995, 8 pages.
Hoffman, Roy, "Data Compression in Digital Systems," Digital Multimedia Standards Series, Chapman & Hall, 1997, 426 pages.
Defendants' Invalidity Contentions, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 34 pages.
Appendix A, Obviousness Chart for U.S. Patent No. 7,777,651, not dated, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for The Eastern District of Texas Tyler Division, Feb. 4, 2011, 466 pages.
Appendix B, § 112 Invalidity Arguments for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 75 pages.
Exhibit 1, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 161 pages, citing Aakre et al., U.S. Patent No. 4,956,808.
Exhibit 2, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 206 pages, citing Albert et al, U.S. Patent No. 5,907,801.
Exhibit 3, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 95 pages, citing B. Andrews, P. Chou, M. Effros and R. Gray "A Mean-Removed Variation of Weighted Universal Vector Quantization for Image Coding," IEEE 0-8186-3392-1/93, 302-309 (1993).
Exhibit 4, Prior Art Chart for U.S. Pat. No. 7,777,651, 144 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Barnes et al., U.S. Patent No. 6,792,151.
Exhibit 5, Prior Art Chart for U.S. Pat. No. 7,777,651, 216 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Birdwell et al., U.S. Patent No. 6,032,197.
Exhibit 6, Prior Art Chart for U.S. Pat. No. 7,777,651, 257 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A ISO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Bledsoe, U.S. Patent No. 4,646,061.

(56) References Cited

OTHER PUBLICATIONS

Exhibit 7, Prior Art Chart for U.S. Pat. No. 7,777,651, 169 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Brickman et al., U.S. Patent No. 4,499,499.

Exhibit 8, Prior Art Chart for U.S. Pat. No. 7,777,651, 396 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing C. Bormann et al., "Robust Network Header Compression (ROHC)," Working Group Internet-Draft Sep. 18, 2000.

Exhibit 9, Prior Art Chart for U.S. Pat. No. 7,777,651, 253 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Carr, U.S. Patent No. 5,293 379.

Exhibit 10, Prior Art Chart for U.S. Pat. No. 7,777,651, 205 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A 1XO v. Thomson Reuters Corp., et al.*, 6:09-cv-333-LED-JDL, 6:10-cv- 247-LED-JDL, 6:10-cv-425-LED-JDL, United States District Court for the Eastern District of Texas Tyler Division, Feb. 4, 2011, citing Cellier et al., U.S. Patent No. 5,884,269.

Exhibit 11, Prior Art Chart for U.S. Pat. No. 7,777,651, 181 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Chu, U.S. Patent Nos. 5,374,916 & 5,467,087.

Exhibit 12, Prior Art Chart for U.S. Pat. No. 7,777,651, 175 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Cisco IOS Data Compression White Paper (Cisco Systems Inc., 1997).

Exhibit 13, Prior Art Chart for U.S. Pat. No. 7,777,651, 590 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Comstock—S&P CornStock Developers Guides (McGraw-Hill, 1994); Rich Barton, "S&P ComStock Network Character Set Definition" (Feb. 10, 1995).

Exhibit 14, Prior Art Chart for U.S. Pat. No. 7,777,651, 186 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing D.J. Craft. "A fast hardware data compression algorithm and some algorithmic extensions," IBM J. Res. Develop. vol. 42, No. 6 (Nov. 1998).

Exhibit 15, Prior Art Chart for U.S. Pat. No. 7,777,651, 142 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Deering, U.S. Patent No. 6,459,429.

Exhibit 16, Prior Art Chart for U.S. Pat. No. 7,777,651, 284 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED- JDL, 6:10-cv-425-LED-JDL, United States District Court for the Eastern District of Texas Tyler Division, Feb. 4, 2011, citing Dye et al., U.S. Patent No. 7,190,284 and International Publication No. WO 00/45516.

Exhibit 17, Prior Art Chart for U.S. Pat No. 7,777,651, 269 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of 4, 2011, citing Earl et al., U.S. Patent No. 5,341,440.

Exhibit 18, Prior Art Chart for U.S. Pat. No. 7,777,651, 132 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Eastman et al., U.S. Patent No. 4,464,650.

Exhibit 19, Prior Art Chart for U.S. Pat. No. 7,777,651, 125 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Elgamal et al., U.S. Patent No. 5,410,671.

Exhibit 20, Prior Art Chart for U.S. Pat. No. 7,777,651, 122 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Enari et al., EP0493103.

(56) References Cited

OTHER PUBLICATIONS

Exhibit 21, Prior Art Chart for U.S. Pat. No. 7,777,651, 379 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-Led-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Fascenda, U.S. Patent No. 5,045,848.

Exhibit 22, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Frachtenberg et al., U.S. Patent. Pub. 2003/0030575.

Exhibit 23, Prior Art Chart for U.S. Pat. No. 7,777,651, 247 pages, *Realtime Data, LLC D/B/A IXO v. Morgan Stanley, et al.*, 6:09-cv-326-LED-JDL, 6:10-cv-248-LED-JDL, 6:10-cv-327-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Franaszek et al., U.S. Patent No. 5,870,036.

Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-427-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing French et al., U.S. Patent No. 5,794,229.

Exhibit 25, Prior Art Chart for U.S. Pat. No. 7,777,651, 225 pages, Exhibit 24, Prior Art Chart for U.S. Pat. No. 7,777,651, 327 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Geiger et al., U.S. Patent No. 5,987,022.

Exhibit 26, Prior Art Chart for U.S. Pat. No. 7,777,651, 219 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gentile, U.S. Patent No. 5,504,842.

Exhibit 27, Prior Art Chart for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 167 pages, citing Giltner et al., U.S. Patent No. 4,386,416.

Exhibit 28, Prior Art Chart for U.S. Pat. No. 7,777,651, 156 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gooch, U.S. Patent No. 4,325,085.

Exhibit 29, Prior Art Chart for U.S. Pat. No. 7,777,651, 132 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hauck, U.S. Patent No. 4,626,829.

Exhibit 30, Prior Art Chart for U.S. Pat. No. 7,777,651, 161 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Heath, U.S. Patent No. 5,955,976.

Exhibit 31, Prior Art Chart for U.S. Pat. No. 7,777,651, 359 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hewlett-Packard Company, "Installing and Administering PPP," B2355-90137, HP 9000 Networking, E0948 (1st Ed. 1997).

Exhibit 32, Prior Art Chart for U.S. Pat. No. 7,777,651, 229 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hsu & Zwarico, Automatic Synthesis of Compression Techniques for Heterogeneous Files, Software-Practice & Experience, vol. 25(10), pp. 1097-1116 (Oct. 1995).

Exhibit 33, Prior Art Chart for U.S. Pat. No. 7,777,651, 206 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XML-Xpress White Paper (Intelligent Compression Technologies Inc., 2000) & website.

(56) References Cited

OTHER PUBLICATIONS

Exhibit 34, Prior Art Chart for U.S. Pat. No. 7,777,651, 138 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XpressFiles White Paper (Intelligent Compression Technologies Inc., 1999) & website.

Exhibit 35, Prior Art Chart for U.S. Pat. No. 7,777,651, 128 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Iseda et al., E.P. 0405572 A2.

Exhibit 36, Prior Art Chart for U.S. Pat. No. 7,777,651, 205 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing J. Danskin. "Compressing the X Graphics Protocol," Princeton University (Jan. 1995).

Exhibit 37, Prior Art Chart for U.S. Pat. No. 7,777,651, 159 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kalkstein, U.S. Patent No. 5,945,933.

Exhibit 38, Prior Art Chart for U.S. Pat. No. 7,777,651, 402 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kari, U.S. Patent No. 6,434,168; International Publication No. WO97/48212 A1.

Exhibit 39, Prior Art Chart for U.S. Pat. No. 7,777,651, 209 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Koopmas et al., U.S. Patent No. 7,024,460.

Exhibit 40, Prior Art Chart for U.S. Pat. No. 7,777,651, 214 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Patent No. 5,825,830.

Exhibit 41, Prior Art Chart for U.S. Pat. No. 7,777,651, 281 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Patent No. 5,825,830.

Exhibit 42, Prior Art Chart for U.S. Pat. No. 7,777,651, 340 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lane et al., U.S. Patent No. 5,521,940.

Exhibit 43, Prior Art Chart for U.S. Pat. No. 7,777,651, 164 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Langdon, Jr. et al., U.S. Patent No. 4,494,108.

Exhibit 44, Prior Art Chart for U.S. Pat. No. 7,777,651, 211 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lavallee, U.S. Patent No. 6,215,904.

Exhibit 45, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing M. Effros, P. Chou & R.M. Gray, "Variable Dimension Weighted Universal Vector Quantization and Noiseless Coding," IEEE 1068-0314/94 (1994).

Exhibit 46, Prior Art Chart for U.S. Pat. No. 7,777,651, 414 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing MacCrisken, U.S. Patent No. 4,730,348.

Exhibit 47, Prior Art Chart for U.S. Pat. No. 7,777,651, 319 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Madany et al., U.S. Patent No. 5,774,715.

(56) References Cited

OTHER PUBLICATIONS

Exhibit 48, Prior Art Chart for U.S. Pat. No. 7,777,651, 228 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Mark A. Roth and Scott J. Van Horn, "Database Compression" SIGMOD Record, vol. 22, No. 3 (1993).

Exhibit 49, Prior Art Chart for U.S. Pat. No. 7,777,651, 235 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Miller et al., U.S. Patent No. 4,814,746.

Exhibit 50, Prior Art Chart for U.S. Pat. No. 7,777,651, 172 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing O'Brien et al., U.S. Patent No. 4,929,946.

Exhibit 51, Prior Art Chart for U.S. Pat. No. 7,777,651, 30 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Osler et al., U.S. Patent No. 6,768,749.

Exhibit 52, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thompson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing P. G. Howard, F. Kossenti, S. Forchammer, and W. J. Rucklidge [1998]. "The Emerging JBIG2 Standard", IEEE Transactions on Circuits and Systems for Video Technology 8:7, 838-848.

Exhibit 53, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10- cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Panaoussis, U.S. Patent No. 5,949,355.

Exhibit 54, Prior Art Chart for U.S. Pat. No. 7,777,651, 335 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327- LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Payne et al, U.S. Patent No. 6,021,433.

Exhibit 55, Prior Art Chart for U.S. Pat. No. 7,777,651, 273 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Reynar et al, U. S. Patent No. 5,951,623.

Exhibit 56, Prior Art Chart for U.S. Pat. No. 7,777,651, 399 pages, *Realtime. Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group. Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1144: V. Jacobson, "Compressing TCP/IP Headers for Low-Speed Serial Links," Network Working Group, Request for Comments: 1144 (Feb. 1990).

Exhibit 57, Prior Art Chart for U.S. Pat. No. 7,777,651, 103 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States. District Court for the Eastern District of Texas Tyler Division, Feb. 4, 2011, citing RFC 1661: Point-to-Point Protocol Working Group, "The Point-to-Point Protocol," RFC 1661 (William Simpson ed., Internet Engineering Task Force 1994); RFC 1662: Point-to-Point Protocol Working Group, "PPP in HDLC-like Framing," RFC 1662 (William Simpson ed., Internet Engineering Task Force 1994); RFC 1962: Dave Rand, "The PPP compression Control Protocol (CCP)," RFC 1962 (Internet Engineering Task Force 1996); RFC 1332: Glenn McGregor, "The PPP Internet Protocol Control Protocol (IPCP)," RFC 1332 (Internet Engineering Task Force 1992); RFC 2509: Mathias Engan et al., "IP Header Compression over IP," RFC 2509 (Internet Society 1999).

Exhibit 58, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 2507: Mikael Degermark et al., "IP Header Compression," RFC 2507 (Internet Society 1999).

Exhibit 59, Prior Art Chart for U.S. Pat. No. 7,777,651, 335 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Roper et al., U.S. Patent No. 5,454,079.

(56) References Cited

OTHER PUBLICATIONS

Exhibit 60, Prior Art Chart for U.S. Pat. No. 7,777,651, 273 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Sebastian, U.S. Patent No. 6,253,264 and International Publication No. WO/1998/039699.

Exhibit 61, Prior Art Chart for U.S. Pat. No. 7,777,651, 399 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Patent No. 5,243,341.

Exhibit 62, Prior Art Chart for U.S. Pat. No. 7,777,651, 322 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Patent No. 5,389,922.

Exhibit 63, Prior Art Chart for U.S. Pat. No. 7,777,651, 102 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Shin, U.S. Patent No. 5,455,680.

Exhibit 64, Prior Art Chart for U.S. Pat. No. 7,777,651, 126 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Taaffe et al., U.S. Patent No. 5,179,651.

Exhibit 65, Prior Art Chart for U.S. Pat. No. 7,777,651, 313 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Telekurs Ticker—"Telekurs Ticker Service: Programmer's Reference," Telekurs (North America), Inc. (Jan. 11, 1993); C. Helck. "Encapsulated Ticker: Ver. 1.0," Telekurs NA, 1-22 (Jul. 14, 1993); A-T Financial Offers Manipulation, Redistribution of Ticker III, Micro Ticker Report, v 4, n. 14 (Sep. 5, 1989); V. Kulkosky, "Upping the Ante" Wall Street & Technology, v11 n5 pp. 8-11 (Oct. 1993); "Telekurs to Launch New Int'l Feed/Internet Server," Wall Street & Technology, v15 n1 pp. 14 (Jan. 1997); I. Schmerken, "Time running out for old technologies", Wall Street Computer Review, v7 n7 p. 14(7) (Apr. 1990); Scrolling News, Inside Market Data, v 10, n 11 (Feb. 27, 1995); Telekurs Buys S&P Trading Systems and Its Ticker III Feed, Micro Ticker Report, v 4, n 11 (Jul. 10, 1989); Telekurs May Debut 128 KPS Ticker by Year's End, Inside Market Data, v 9, n 21 (Jul. 18, 1994); Telekurs Now Carries All Dow Jones' News on 56-KBPS Ticker, Inside Market Data, v9, n7 (Dec. 20, 1993); Telekurs Sells No. American Division in Mgmt. Buyout, Inside Market Data, v11, n3 (Oct. 23, 1995).

Exhibit 65, Prior Art Chart for U.S. Pat. No. 7,777,651, 265 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Tyler et al., U.S. Patent No. 5,638,498.

Exhibit 67, Prior Art Chart for U.S. Pat. No. 7,777,651, 86 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JLD, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing UNI International Standard ISO 3309-1984 (E) [1984], "Information Processing Systems—Data Communication—High-level Data Link Control Procedures—Frame Structure," 1-6 (1984).

Exhibit 68, Prior Art Chart for U.S. Pat. No. 7,777,651, 236 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data. LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Rewers Corp., et al.*, 6:09-cv-333-LED-JDL, 6:10-cv-247-LED-JDL, 6:10-cv-425-LED-JDL, United States District Court for the Eastern District or Texas Tyler Division, Feb. 4, 2011, citing Unwired Planet, EP 0928070 A2.

Exhibit 69, Prior Art Chart for U.S. Pat. No. 7,777,651, 80 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Vange et al., U.S. Patent No. 7,127,518.

Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Wernikoff et al., U.S. Patent No. 3,394,352.

Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Willis at al., U.S. Patent No. 4,745,559; Boilen, U.S. Patent No. 4,750,135.

(56) References Cited

OTHER PUBLICATIONS

Exhibit 72, Prior Art Chart for U.S. Pat. No. 7,777,651, 277 pages.
Exhibit 71, Prior Art Chart for U.S. Pat. No. 7,777,651, 253 pages.
Exhibit 70, Prior Art Chart for U.S. Pat. No. 7,777,651, 197 pages.
*Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing XMill—Hartmut Liefke & San Suciu, "XMill: an Efficient Compressor for XML Data," University of Pennsylvania, Philadelphia, Pennsylvania, MS-CIS-99-26 (Oct. 18, 1999); Hartmut Liefke & Dan Suciu, "XMill: an Efficient Compressor for XML Data," Proceedings of SIGMOD, 2000; Hartmut Liefke & Dan Suciu, "An Extensible Compressor for XML Data," SIGMOD Record, vol. 29, No. 1 (Mar. 2000); Dan Suciu, "Data Management on the Web," Presentation at University of Washington College of Computer Science & Engineering, Seattle, WA (Apr. 4, 2000).
Bormann at al., "Robust Header Compression (ROHC)," Network Working Group Internet-Draft, Sep. 18. 2000, 111 pages.
Effros, M., P.A. Chou and R.M. Gray, "Variable Dimension Weighted Universal Vector Quantization and Noiseless Coding," IEEE 1068-0314/94, 1994, pp. 2-11.
Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 17 pages.
Appendix A: U.S. Patent No. 6,624,761 (The "761 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 37 pages.
Appendix B: U.S. Patent No. 7,161,506 (The "506 Patent"), from Defendant Bloomberg L.P.'s Invalidity Contentions Pursuant to Patent Local Rule 3-3, *Realtime Data, LLC d/b/a IXO vs. Thomson Reuters Corp, et al.*, 6:2009-cv-00333 LED-JDL, 6:2010-cv-00247 LED-JDL, 6:2010-cv-00425 LED-JDL, Oct. 29, 2010, 63 pages.
Appendix C: U.S. Patent No. 7,400,274 (The 274 Patent), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 95 pages.
Appendix D: U.S. Patent No. 7,417,568 (The 568 Patent), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 147 pages.
Appendix E: U.S. Patent No. 7,714,747 (The "747 Patent"), from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 137 pages.
Appendix F: Comparison of FAST to the Prior Art, from Defendant Bloomberg L.P.'s Invalidity Contentions Pursuant to Patent Local Rule 3-3, *Realtime Data, LLC d/b/a IXO vs. Thomson Reuters Corp., et al.*, 6:2009-cv-00333 LED-JDL, 6:2010-cv-00247 JED-JDL, 6:2010-cv-00425 LED-JDL, Oct. 29, 2010, 7 pages.
Defendant Bloomberg L.P.'s Invalidity Contentions Pursuant to Patent Local Rule 3-3 Regarding U.S. Patent No. 7,777,651, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 21 pages.
Appendix G: U.S. Patent No. 7,777,651 (The 651 Patent), Defendant Bloomberg L.P.'s Invalidity Contentions Pursuant to Patent Local Rule 3-3 Regarding U.S. Patent No. 7,777,651, *Realtime Data, LLC d/b/a IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 480 pages.
Rice, Robert F., "Some Practical Universal Noiseless Coding Techniques", Jet Propulsion Laboratory, Pasadena, California, JPL Publication 79-22, Mar. 15, 1979; 140 pgs.
Anderson, J., et al. "Codec squeezes color teleconferencing through digital telephone lines," Electronics 1984, pp. 13-15.
Venbrux, Jack, "A VLSI Chip Set for High-Speed Lossless Data Compression", IEEE Trans. on Circuits and Systems for Video Technology, vol. 2, No. 4, Dec. 1992, pp. 381-391.
"Fast Dos Soft Boot", IBM Technical Disclosure Bulletin, Feb. 1994, vol. 37, Issue No. 2B, pp. 185-186.
"Operating System Platform Abstraction Method", IBM Technical Disclosure Bulletin, Feb. 1995, vol. 38, Issue No. 2, pp. 343-344.
Murashita, K., et al., "High-Speed Statistical Compression using Self-Organized Rules and Predetermined Code Tables", IEEE, 1996 Data Compression Conference.
Coene, W., et al. "A Fast Route for Application of Rate-distortion Optimal Quantization in an MPEG Video Encoder" Proceedings of the International Conference on Image Processing, US., New York, IEEE, Sep. 16, 1996, pp. 825-828.
Rice, Robert, "Lossless Coding Standards for Space Data Systems", IEEE 1058-6393197, Nov. 3-6, 1996, pp. 577-585.
Millman, Howard, "Image and video compression", Computerworld, vol. 33, Issue No. 3, Jan. 18, 1999, pp. 78.
"IBM boosts your memory", Geek.com [online], Jun. 26, 2000 [retrieved on Jul. 6, 2007, www.geek.com/ibm-boosts-your-memory/, 7 pages.
"IBM Research Breakthrough Doubles Computer Memory Capacity", IBM Press Release [online], Jun. 26, 2000 [retrieved on Jul. 6, 20071, www-03.ibm.com/press/us/en/pressrelease/1653.wss, 3 pages.
"ServerWorks to Deliver IBM's Memory expansion Technology in Next-Generation Core Logic for Servers", ServerWorks Press Release [online], Jun. 27, 2000 [retrieved on Jul. 14, 20001, http://www.serverworks.com/news/press/000627.html, 1 page.
Abali, B., et al., "Memory Expansion Technology (MXT) Software support and performance", IBM Journal of Research and Development, vol. 45, Issue No. 2, Mar. 2001, pp. 287-301.
Franaszek, P. A,, et al., "Algorithms and data structures for compressed-memory machines", IBM Journal of Research and Development, vol. 45, Issue No. 2, Mar. 2001, pp. 245-258.
Franaszek, P. A,, et al., "On internal organization in compressed random-access memories", IBM Journal of Research and Development, vol. 45, Issue No. 2, Mar. 2001, pp. 259-270.
Smith, T.B., et al., "Memory Expansion Technology (MXT) Competitive impact", IBM Journal of Research and Development, vol. 45, Issue No. 2, Mar. 2001, pp. 303-309.
Tremaine, R. B., et al., "IBM Memory Expansion Technology (MXT)", IBM Journal of Research and Development, vol. 45, Issue No. 2, Mar. 2001, pp. 271-285.
Yeh, Pen-Shu, "The CCSDS Lossless Data Compression Recommendation for Space Applications", Chapter 16, Lossless Compression Handbook, Elsevier Science (USA) 2003, pp. 311-326.
Expand Networks Accelerator 4000 Series User's Guide, 1999, 101 pgs.
Tridgell, Andrew; "Efficient Algorithms for Sorting and Synchronization"; A thesis submitted for the degree of Doctor of Philosophy at The Australian National University; Feb. 1999; pp. iii-106.
Jung, et al.; "Performance optimization of wireless local area networks through VLSI data compression"; Wireless Networks, vol. 4, 1998; pp. 27-39.
Baker, K. et al., "Lossless Data Compression for Short Duration 3D Frames in Positron Emission Tomography," 0-7803-1487, May 1994, pp. 1831-1834.
Maier, Mark W.; "Algorithm Evaluation for the Synchronous Data Compression Standard"; University of Alabama: 1995, pp. 1-10.
Bassiouni, et al.; "A Scheme for Data Compression in Supercomputers"; IEEE; 1988; pp. 272-278.
Welch, Terry A.; "A Technique for High-Performance Data Compression"; IEEE; Jun. 1984; pp. 8-19.
ALDC: Adaptive Lossless Data Compression; IBM; 1994, 2 pgs.

(56) References Cited

OTHER PUBLICATIONS

ALDC—Macro: Adaptive Lossless Data Compression; IBM Corporation; 1994, 2 pgs.
ALDC1—20S: Adaptive Lossless Data Compression; IBM Corporation; 1994, 2 pgs.
ALDC1—40S: Adaptive Lossless Data Compression; IBM Corporation; 1994, 2 pgs.
ALDC1—5S: Adaptive Lossless Data Compression; IBM Corporation; 1994, 2 pgs.
Craft, David J.; "Data Compression Choice No Easy Call"; Computer Technology Review; vol. XIV, No. 1; Jan. 1994, 2 pgs.
Costlow, Terry; "Sony designs faster, denser tape drive"; Electronic Engineering Times; May 20, 1996, pp. 86-87.
Wilson, Ron; "IBM ups compression ante"; Electronic Engineering Times; Aug. 16, 1993; pp. 1-94.
"IBM Announces New Feature for 3480 Subsystem"; Tucson Today; vol. 12, No. 337, Jul. 25, 1989, 1 pg.
Syngress Media, Inc.; "CCA Citrix Certified Administrator for MetaFrame 1.8 Study Guide"; 2000, 568 pgs.
International Telecommunication Union; "Data Compression Procedures for Data Circuit Terminating Equipment (DCE) Using Error Correction Procedures"; Geneva, 1990, 29 pgs.
Cheng, et al.; "A fast, highly reliable data compression chip and algorithm for storage systems"; IBM J. Res. Develop.; vol. 40, No. 6, Nov. 1996; pp. 603-613.
Cisco Systems; "Cisco IOS Data Compression"; 1997; pp. 1-10.
Craft, D. J.. "A fast hardware data compression algorithm and some algorithmic extensions"; IBM J. Res. Develop.; vol. 42; No. 6; Nov. 6, 1998; pp. 733-746.
Rustici, Robert; "Enhanced CU—SeeMe"1995, Zero in Technologies, Inc., 308 pgs.
White Pine Software; "CU—SeeMe Pro: Quick Start Guide"; Version 4.0 for Windows; 1999, 86 pgs.
"CU—SeeMe Reflector"; www.geektimes.com/michael/CU-SeeMe/faqs/reflectors.html; accessed on Dec. 2, 2008, 5 pgs.
Daniels, et al ; "Citrix WinFrame 1.6 Beta"; May 1, 1996; license. icopyright.net/user/downloadLicense.act?lic-3.7009-9123; accessed Dec. 2, 2008, 4 pgs.
Held, et al.; "Data Compression"; Third Edition; John Wiley & Sons Ltd.; 1991, 150 pgs.
Data Compression Applications and Innovations Workshop; Proceedings of a Workshop held in Conjunction with the IEEE Data Compression Conference; Snowbird, Utah; Mar. 31, 1995, 64 pgs.
Britton, et al.; "Discovery Desktop Conferencing with NetMeeting 2.0"; IDG Books Worldwide, inc.; 1997, 244 pgs.
Sattler, Michael; "Internet TV with Cu—SeeMe"; Sams.Net Publishing; 1995; First Edition, 80 pgs.
IBM Microelectronics Comdex Fall '93 Booth Location, 1 pg.
Disz, et al.; "Performance Model of the Argonne Voyager Multimedia Server"; IEEE; 1997; pp. 316-327.
"Downloading and Installing NetMeeting"; www.w4mq.comlhelplh3.htm; accessed on Dec. 2, 2008; 6 pgs.
Fox, et al.; "Adapting to Network and Client Variability via On-Demand Dynamic Distillation"; ASPLOS VII; Oct. 1996; pp. 160-170.
Fox, et al.; "Adapting to Network and Client Variation Using Infrastructural Proxies: Lessons and Perspectives"; IEEE Personal Communications, Aug. 1998; pp. 10-19.
Han, et al.; "Cu—SeeMe VR Immersive Desktop Teleconferencing"; Department of Computer Science; Cornell University; To appear in ACM Multimedia 1996, 9 pgs.
Howard, et al.; "Parallel Lossless Image Compression Using Huffman and Arithmetic Coding"; 1992; pp. 1-9.
Howard, Paul G.. "Text Image Compression Using Soft Pattern Matching"; The Computer Journal; vol. 40, No. 213; 1997; pp. 146-156.
Howard, et al.; "The Emerging JBIG2 Standard"; IEEE Transactions on Circuits and Systems for Video Technology, vol. 8, No. 7, Nov. 1998; pp. 838-848.
Craft, D. J.; "A fast hardware data compression algorithm and some algorithmic extensions"; Journal of Research and Development; vol. 42, No. 6, Nov. 1998; pp. 733-745.
"Direct Access Storage Device Compression and Decompression Data Flow"; IBM Technical Disclosure Bulletin; vol. 38, No. 11; Nov. 1995; pp. 291-295.
ICA Timeline, Sep. 24, 2007, 3 pgs.
Converse, et al.; "Low Bandwidth X Extension"; Protocol Version 1 .O; X Consortium; Dec. 21, 1996, 55 pgs.
Magstar and IBM 3590 High Performance Tape Subsystem Technical Guide; Nov. 1996; IBM International Technical Support Organization, 288 pgs.
MetaFrame Administration Student Workbook; Jun. 1998; Citrix Professional Courseware; Citrix Systems, Inc, 113 pgs.
NCD Wincenter 3.1 : Bringing Windows to Every Desktop, 1998; 2 pgs.
Overview NetMeeting 2.1; Microsoft 'TechNet; technet.microsoft. com1en-usllibrarylcc767141 (printer).aspx; accessed Dec. 2, 2008; 7 pgs.
NetMeeting 2.1 Resource Kit; Microsoft TechNet; technet.microsoft.com1en-usllibrary1cc767142(printer).aspx; accessed on Dec. 2, 2008, 34 pgs.
Conferencing Standards: NetMeeting 2.1 Resource Kit: Microsoft TechNet; technet.microsoft.com/-us/library/cc767150(printer). aspx; accessed Dec. 2, 2008, 14 pgs/
Summers, Bob; "Official Microsoft NetMeeting Book," Microsoft Press, 1998, 374 pgs.
Zebrose, Katherine L.; "Integrating Hardware Accelerators into Internetworking Switches"; Telco Systems, 1995, 10 pages.
Simpson, et al.; "A Multiple Processor Approach to Data Compression"; ACM; 1998; pp. 641-649, 9 pgs.
"IBM Technology Products Introduces New Family of High-Performance Data Compression Products"; IBM; Aug. 16, 1993, 6 pgs.
ReadMe; PowerQuest Drive Image Pro; Version 3.00; 1994-1999; PowerQuest Corporation; p. 1-6.
Schulzrinne, et al., "RTP Profile for Audio and Video Conferences with Minimal Control," Jan. 1996, www.ietf.org/rfc/rfc1890.txt, accessed on Dec. 3, 2008; 17 pgs.
Zhu, C , "RTP Payload Format for H.263 Video Streams," Standards Track, Sep. 1997, pp. 1-12.
Simpson, W., "The Point-To-Point Protocol (PPP)," Standards Track, Jul. 1994, pp. i-52.
Reynolds, et al., "Assigned Numbers," Standards Track, Oct. 1994, pp. 1-230.
Deutsch, et al., "ZLIB Compressed Data Format Specification version 3.3," Informational, May 1996, pp. 1-10.
Deutsch, P., "DEFLATE Compressed Data Format Specification version 1.3," Informational, May 1996, pp. 1-15.
Rand, D., "The PPP Compression Control Protocol (CCP)," Standards Track, Jun. 1996, pp. 1-9.
Schneider, et al., "PPP LZS-DCP Compression Protocol (LZS-DCP)," Informational, Aug. 1996, pp. 1-18.
Friend, et al., "PPP Stac LZS Compression Protocol," Informational, Aug. 1996; pp. 1-20.
Schneider, et al., "PPP for Data Compression in Data Circuit-Terminating Equipment (DCE)," Informational, Aug. 1996, pp. 1-10.
Atkins, et al., "PGP Message Exchange Formats," Informational, Aug. 1996, pp. 1-21.
Castineyra, et al., "The Nimrod Routing Architecture," Informational, Aug. 1996, pp. 1-27.
Freed, et al., "Multipurpose Internet Mail Extensions (MIME) Part Four: Registration Procedures," Best Current Practice, Nov. 1996, pp. 1-21.
Shacham, et al., "IP Payload Compression Protocol (IPComp)," Standards Track, Dec. 1998, pp. 1-10.
Sidewinder 50 Product Manual, Seagate Technology, Inc., 1997, 189 pgs.
IBM RAMAC Virtual Array, IBM, Jul. 1997, 490 pgs.
Bruni, et al., "DB2 for OS/390 and Data Compression" IBM Corporation, Nov. 1998, 172 pgs.
Smith, Mark, "Thin Client/Server Computing Works," WindowsITPro, Nov. 1, 1998, pp. 1-13, license.icopyright.net/user/downloadLicense.act?lic=3.7009-8355, accessed Dec. 2, 2008.

(56) References Cited

OTHER PUBLICATIONS

International Telecommunication Union, "Information Technology—Digital Compression and Coding of Continuous-Tone Still Images—Requirements and Guidelines," 1993, 186 pgs.
International Telecommunications Union, "Information technology—Lossless and near-lossless compression of continuous-tone still images—Baseline," 1999, 75 pgs.
Davis, Andrew W., "The Video Answering Machine: Intel Proshare's Next Step," Advanced Imaging, vol. 12, No. 3, Mar. 1997, pp. 28, 30.
Abbott, IIII, Walter D., "A Simple, Low Overhead Data Compression Algorithm for Converting Lossy Compression Processes to Lossless," Naval Postgraduate School Thesis; Dec. 1993, 93 pgs.
Thomborson. Clark, "V.42bis and Other Ziv-Lernoel Variants," IEEE, 1991, p. 460.
Thomborson, Clark, "The V.42bis Standard for Data-Compressing Modems," IEEE, Oct. 1992, pp. 41-53.
Sun, Andrew, "Using and Managing PPP," O'Reilly & Associates, Inc., 1999, 89 pgs.
"What is the V42bis Standard?," www.faqs.org/faqs/compression-faq/part1/section-10.html, accessed on Dec. 2, 2008, 2 pgs.
"The WSDC Download Guide: Drive Image Professional for DOS, OS/2, and Windows," wsdcds01 .watson.ibm.com/WSDC.nsf/Guides/Download/Applications-DriveImage.htm, Accessed Nov. 22, 1999, 4 pgs.
"The WSDC Download Guide: Drive Image Professional," wsdcds01.watson.ibm.com/wsdc.nsf/Guides/Download/Applications-DriveImage.htm, accessed on May 3, 2001, 5 pgs.
APPNOTE-TXT from pkware.txt, Version 6.3.2, PKWARE Inc., 1989, 52 pgs.
CU—SeeMe readme.txt, Dec. 2, 1995, 9 pgs.
CU—seeme txt from indstate.txt, README.TXT for CU—SeeMe version 0.90bl, Mar. 23, 1997, 5 pgs.
Cuseeme txt 19960221 .txt; CUSEEME.TXT, Feb. 21, 1996, 9 pgs.
Citrix Technology Guide, 1997, 413 pgs.
Lettieri, et al., "Data Compression in the V.42bis Modems," 1992, pp. 398-403.
High Performance x2/V.34+N.42bis 56K BPS Plug & Play External Voice/FAX/Data Modem User's Manual, 1997, 27 pgs.
H.323 Protocols Suite, www.protocols.com/pbook~h323.htm, 26 pages (referenced in Expert Report of Dr. James A. Storer on Invalidity filed on behalf of some of the defendants, filed in *Realtime Data, LLC d/b/a IXO v. Packeteer, Inc. et al.*, Civil Action No. 6:08-cv-00144-LED, U.S. District Court for the Eastern District of Texas, Jun. 10, 2009, and indicated as being last accessed in 2008, see e.g., Exhibit E, p. 12).
LBX X Consortium Algorithms; rzdocs.uni-hohenheim.de/aix~4. 33/ext~doc/usr/share/man/info/en~US/a~Doc~lib./x."1; 1 X I 1R 6 Technical Specifications, Dec. 1996, 3 pgs.
Basics of Images; www.geom.uiuc.edu/events/courses/1996/cmwh/Stills/basics.html, 1996, 5 pgs.
Parties' Joint Claim Construction and Prehearing Statement Pursuant to P.R. 4-3, filed in *Realtime Data, LLC d/b/a/IXO v. Packeteer, Inc. et al.*, Civil Action No. 6:08-cv-00144-LED; U.S. District Court for the Eastern District of Texas, Feb. 18, 2009, 168 pages.
Declaration of Professor James A. Storer, Ph.D., relating to U.S. Patent No. 6,604,158, Mar. 18, 2009, 10 pgs.
Declaration of Professor James A. Storer, Ph.D., relating to U.S. Patent No. 6,601,104, Mar. 18, 2009, 8 pgs.
Declaration of Professor James A. Storer, Ph.D., relating to U.S. Patent No. 7,321,937, May 4, 2009, 15 pgs.
Declaration of Professor James A. Storer, Ph.D., relating to U.S. Patent No. 6,624,761, May 4, 2009, 6 pgs.
Declaration of Professor James A. Storer, Ph.D., relating to U.S. Patent No. 7,378,992, May 20, 2009, 6 pgs.
Declaration of Professor James A. Storer, Ph.D., relating to U.S. Patent No. 7,161,506, May 26, 2009, 5 pgs.
"Video Coding for Low Bit Rate Communication", International Telecommunication Union (ITU), Recommendation H.263, §3.4 (Mar. 1996) ("ITU H.263"), 52 pgs.

Order Adopting Report and Recommendation of United States Magistrate Judge, *Realtime Data, LLC D/B/A IXO v. Packeteer, Inc., et al.*, District Court for the Eastern District of Texas, No. 6:08cv144, Aug. 24, 2009, 2 pgs.
Second Amended Answer filed on behalf of Citrix Systems, Inc, (includes allegations of inequitable conduct on at least pp. 24-43) filed in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 45 pages.
Expert Report of James B. Gambrell on Inequitable Conduct filed on behalf of some of the defendants [Includes Appendices—Exhibits A-I] filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 199 pgs.
Expert Report of Dr. James A. Storer on Invalidity filed on behalf of some of the defendants [Includes Appendices—Exhibits A-K (Exhibit A has been redacted pursuant to a protective order)] filed in *Realtime Data, LLC d/b/a IXO v. Packeteer, Inc. et al.*, Civil Action No. 6:08-cv-00144-LED; U.S. District Court for the Eastern District of Texas, Jun. 10, 2009, 1090 pgs.
Supplemental Expert Report of Dr. James A. Storer on Invalidity filed on behalf of some of the defendants [Includes Appendices—Exhibits 1-8] filed in *Realtime Data, LLC d/b/a/IXO v. Packeteer, Inc. et al.*, Civil Action No. 6:08-cv-00144-LED; U.S. District Court for the Eastern District of Texas, Jun. 19, 2009, 301 pgs.
Deposition of Dr. James A. Storer conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 27, 2009, 242 pgs.
Deposition of Brian Von Herzen conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 26, 2009, 241 pgs.
Second Amended Complaint filed on behalf of the Plaintiff in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 28 pgs.
Answers to the Second Amended Complaint and Counterclaims filed by Citrix Systems, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 46 pgs.
Answers to the Second Amended Complaint and Counterclaims filed by F5 Networks, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by Averitt Express Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by DHL Express, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 37 pgs.
Answers to the Second Amended Complaint and Counterclaims filed by Expand Networks, Inc, Interstate Battery System of America, Inc., and O'Reilly Automotive, Inc. in *Realtime Data, LLC d/b/a/IXO v. Packeteer, Inc. et al.*, Civil Action No. 6:08-cv-00144-LED; U.S. District Court for the Eastern District of Texas Feb. 17, 2009, 212 pgs.
Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Feb. 18, 2009, 84 pgs.
Plaintiff's Response to the Answers to the Second Amended Complaint and Counterclaims filed by Citrix Systems, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 24 pgs.

(56) References Cited

OTHER PUBLICATIONS

Plaintiff's Responses to the Answers to the Second Amended Complaint and Counterclaims filed by F5 Networks, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 5 pgs.

Plaintiff's Responses to the Answers to the Second Amended Complaint and Counterclaims filed by Averitt Express, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 5 pgs.

Plaintiff's Responses to the Answers to the Second Amended Complaint and Counterclaims filed by DHL Express, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 17 pgs.

Plaintiff's Responses to the Answers to the Second Amended Complaint and Counterclaims filed by Expand Networks, Inc, Interstate Battery System of America, Inc., and O'Reilly Automotive, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 15 pgs.

Plaintiff's Responses to the Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build -A-Bear Workshop, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 34 pgs.

Opening Claim Construction Brief filed in *Realtime Data, LLC d/b/a/IXO v. Packeteer, Inc. et al.*, Civil Action No. 6:08-cv-00144-LED; U.S. District Court for the Eastern District of Texas. Mar. 5, 2009, 36 pgs.

Declaration of Jordan Adler in support of the Opening Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 5, 2009, 214 pgs.

Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LED; U.S. District Court for the Eastern District of Texas Mar. 16, 2009, 22 pgs.

Declaration of Michele E. Moreland in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Mar. 16, 2009, 168 pgs.

Declaration of James A. Storer in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Mar. 16, 2009, 27 pgs.

Joint Defendants Reply regarding Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Apr. 2, 2009, 20 pgs.

Responsive Briefs in Support of Claim Construction filed by Blue Coats Systems, Inc., Packeteer, Inc., 7-Eleven, Inc., ABM Industries, Inc., ABM Janitorial Services-South Central, Inc. and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 451 pgs.

Responsive Briefs in Support of Claim Construction filed by F5 Networks, Inc. and Averitt Express, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 20 pgs.

Responsive Briefs in Support of Claim Construction filed by Citrix Systems, Inc., Expand Networks, Inc., DHL Express (USA), Inc., Interstate Battery System of America, Inc., and O'Reilly Automotive Inc., in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 377 pgs.

Declaration of Dr. James A. Storer filed in Support of the Brief in Support of Claim Construction filed on behalf of F5 Networks, Inc., in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 778 pgs.

Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Mar. 20, 2009, 244 pgs.

Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 20 pgs.

Declaration of Karim Oussayef submitted in support of the Opposition of Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 119 pgs.

Order of the Court Denying Defendant Citrix Systems, Inc.'s Motion to Exclude Dr. Brian Von Herzen's Opinions Regarding Claim Construction, *Realtime Data, LLC D/B/A Ixo v. Packeteer, Inc., et al.*, District Court for the Eastern District of Texas, No. 6:08cv144, Apr. 6, 2009, 1 pg.

Parties Joint Submission of Terms to be Heard at the Markman Hearing filed in *Realtime Data, LLC d/b/a/IXO v. Packeteer, Inc. et al.*, Civil Action No. 6:08-cv-00144-LED; U.S. District Court for the Eastern District of Texas, Mar. 24, 2009, 5 pgs.

Order of the Court Regarding the terms to be heard at the Markman Hearing in *Realtime Data, LLC d/b/a/IXO v. Packeteer, Inc. et al.*, Civil Action No. 6:08-cv-00144-LED; U.S. District Court for the Eastern District of Texas, Mar. 24, 2009, 2 pgs.

Transcript of the Markman Hearing held on Apr. 9, 2009 in *Realtime Data, LLC d/b/a/IXO v. Packeteer, Inc. et al.*, Civil Action No. 6:08-cv-00144-LED; U.S. District Court for the Eastern District of Texas, 174 pgs.

Plaintiff's Reply Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 30, 2009, 30 pgs.

Declaration of Brian von Herzen in Support of the Plaintiff's Reply Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 30, 2009, 25 pgs.

F5 Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 12 pg.

Citrix Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 13 pgs.

Blue Coat Sur-Reply to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 12 pgs.

Declaration of Michele Moreland in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas, Apr. 3, 2009, 8 pgs.

(56) References Cited

OTHER PUBLICATIONS

Declaration of James Storer in Support of Sur-Replies to Plaintiff's Claim Construction Brief filed by some of the defendants in *Realtime Data, LLC d/b/a/IXO v. Packeteer, Inc. et al.*, Civil Action No. 6:08-cv-00144-LED; U.S. District Court for the Eastern District of Texas Apr. 7, 2009, 6 pgs.
Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Apr. 8, 2009, 123 pgs.
Motion for Reconsideration of the Court's Order Denying Plaintiff's Motion for Leave to Supplement the Parties' Joint Claim Construction and Prehearing Statement filed in *Realtime Data, LLC d/b/a/IXO v. Packeteer, Inc. et al.*, Civil Action No. 6:08-cv-00144-LED; U.S. District Court for the Eastern District of Texas, Jul. 13, 2009, 3 pgs.
Citrix Systems' Opposition to Realtime Data's Motion for Reconsideration of Realtime's Motion for Leave of Supplement the Parties' Joint Claim Construction, filed in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 6 pgs.
Notice of Agreement to Claim Term between Plaintiff and Defendant filed in *Realtime Data, LLC d/b/a/IXO v. Packeteer, Inc. et al.*, Civil Action No. 6:08-cv-00144-LED; U.S. District Court for the Eastern District of Texas, Apr. 22, 2009, 3 pgs.
Provisional Claim Construction Order issued by the Court on Jun. 2, 2009 in *Realtime Data, LLC d/b/a/IXO v. Packeteer, Inc. et al.*, Civil Action No. 6:08-cv-00144-LED; U.S. District Court for the Eastern District of Texas, 28 pgs.
Citrix Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 9, 2009, 22 pgs.
Blue Coat Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 10, 2009, 9 pgs.
F5 Request for Consideration and Objections to the Provisional Claim Construction Order issued by the Court on Jun. 22, 2009 filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 8 pgs.
Comtech AHA Corporation's Complaint in Intervention against the Plaintiff filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 8 pgs.
Report and Recommendation of United States Magistrate Judge on Motion for Partial Summary Judgment issued on Jun. 23, 2009, in *Realtime Data, LLC d/b/a/IXO v. Packeteer, Inc. et al.*, Civil Action No. 6:08-cv-00144-LED; U.S. District Court for the Eastern District of Texas, 22 pgs.
Blue Coat Defendants' Report and Recommendations Regarding Motion for Partial Summary Judgment of Invalidity for Indefiniteness in *Realtime Data, LLC d/b/a/IXO v. Packeteer, Inc. et al.*, Civil Action No. 6:08-cv-00144-LED; U.S. District Court for the Eastern District of Texas, Jul. 8, 2009, 18 pgs.
Plaintiff's Objections to and Partially Unopposed Motion for Reconsideration of United States Magistrate Judge's Claim Construction Memorandum and Order, in *Realtime Data, LLC d/b/a/IXO v. Packeteer, Inc. et al.*, Civil Action No. 6:08-cv-00144-LED; U.S. District Court for the Eastern District of Texas, Jul. 13, 2009 11 pgs.
Defendant Citrix Opposition to Realtime's Objections to and Partially Unopposed Motion for Reconsideration of Magistrate Love's Claim Construction Memorandum and Order filed by Citrix Systems, Inc., filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 8 pgs.
Defendant F5 Networks, Inc.'s Opposition to Plaintiff's Objections and Partially Unopposed Motion;for Reconsideration of Magistrate Judge Love's Claim Construction and Order, filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 4 pgs.
Defendents' Response in Opposition to Realtime Data's Objections to and Partially Unopposed Motion for Reconsideration of Magistrate Judge Love's Claim Construction Memorandum and Order, filed on behalf of some of the defendants in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 9 pgs.
Realtime Data's Response in Opposition to Defendant Citrix Systems Objections to and Request for Reconsideration of Magistrate's Order Regarding Claim Construction, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 13 pgs.
Plaintiff Realtime Data's Response in Opposition to Blue Coat Defendants' Objection to Magistrate's Memorandum Opinion and Order Regarding Claim Construction, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 9 pgs.
Plaintiff's selcted Responses to Defendant Citrix System's Interrogatories and First Set of Requests for Admission filed in *Realtime Data, LLC d/b/a/IXO v. Packeteer, Inc. et al.*, Civil Action No. 6:08-cv-00144-LED; U.S. District Court for the Eastern District of Texas, Jul. 15, 2009, 151 pgs.
Script for Defendants' Joint Claim Construction Technology Tutorial Presented to the Magistrate Judge in *Realtime Data, LLC d/b/a/IXO v. Packeteer, Inc. et al.*, Civil Action No. 6:08-cv-00144-LED; U.S. District Court for the Eastern District of Texas, filed on Apr. 18, 2008 and terminated Feb. 2, 95 pgs.
Preliminary Data Sheet, 9600 Data Compressor Processor, Hi/fn, 1997-99, HIFN 000001-68, 68 pgs.
Data Sheet, 9751 Data Compression Processor, 1997-99, HIFN 000069-187, 119 pgs.
Signal Termination Guide, Application Note, Hi/fn, 1997-98, HIFN 000188-194, 7 pgs.
How LZS Data Compression Works, Application Note, Hi/fn, 1997-99, HIFN 000195-207, 13 pgs.
Reference Hardware, 9751 Compression Processor, Hi/fn, 1997-99, HIFN 000208-221, 14 pgs.
Using 9751 in Big Endian Systems, Application Note, Hi/fn, 1997-99, HIFN 000222-234, 13 pgs.
Specification Update, 9751 Compression Processor, Hi/fn, 1997-2000, HIFN 000235-245, 11 pgs.
9732AM Product Release, Hi/fn, 1994-99, HIFN 000246-302, 57 pgs.
Data Sheet, 9732A Data Compression Processor, Hi/fn, 1997-99, HIFN 000303-353, 51 pgs.
9711 to 7711 Migration, Application Note, Hi/fn, 1997-99, HIFN 000354-361, 8 pgs.
Specification Update, 9711 Data Compression Processor, Hi/fn, 1997-99, HIFN 000362-370, 9 pgs.
Differences Between the 9710 & 9711 Processors, Application Note, Hi/fn, 1997-99, HIFN 000371-77, 7 pgs.
Specification Update, 9710 Data Compression Processor, Hi/fn, 1997-99, HIFN 000378-388, 11 pgs.
9706/9706A Data Compression Coprocessor Data Sheet, Stac Electronics, 1991-97, HIFN 000389-473, 85 pgs.
9705/9705A Data Compression Coprocessor, Stac Electronics, 1988-96, HIFN 000474-562, 88 pgs.
9705/9705A Data Compression Coprocessor Data Sheet, Stac Electronics, 1988-96, HIFN 000563-649, 87 pgs.
9700/9701 Compression Coprocessors, Hi/fn, 1997, HIFN 000650-702, 53 pgs.

(56) References Cited

OTHER PUBLICATIONS

Data Sheet 9610 Data Compression Processor, Hi/fn, 1997-98, HIFN 000703-744, 42 pgs.
Specification Update 9610 Data Compression Processor, Hi/fn, 1997-99, HIFN 000745-751, 7 pgs.
9705 Data Compression Coprocessor, Stac Electronics, 1988-92, HIFN 000752-831, 80 pgs.
9705 Network Software Design Guide, Application Note, Stac Electronics, 1990-91, HIFN 000832-861, 30 pgs.
Data Sheet 9601 Data Compression Processor, Hi/fn, May 21, 1998, HIFN 000862-920, 59 pgs.
7751 Encryption Processor Reference Kit, Hi/fn, Apr. 1999, HIFN 000921-1114, 194 pgs.
Hardware Data Book, Hi/fn, Nov. 1998, HIFN 001115-1430, 316 pgs.
Data Compression Data Book, Hi/fn, Jan. 1999, HIFN 001431-1889, 459 pgs.
Reference Software 7751 Encryption Processor, Hi/fn, Nov. 1998, HIFN 002164-2201, 38 pgs.
Interface Specification for Synergize Encoding/Decoding Program, JPB, Oct. 10, 1997, HIFN 002215-2216, 2 pgs.
Anderson, Chip, Extended Memory Specification Driver, 1998, HIFN 002217-2264, 48 pgs.
Whiting, Doug, LZS Hardware API, Mar. 12, 1993, HIFN 002265-68, 4 pgs.
Whiting, Doug, Encryption in Sequoia, Apr. 28, 1997, HIFN 002309-2313, 5 pgs.
LZS221-C Version 4 Data Compression Software, Data Sheet, Hi/fn, 1994-97, HIFN 002508-2525, 18 pgs.
eXtended Memory Specification (XMS), ver. 2.0, Microsoft, Jul. 19, 1988, HIFN 002670-2683, 14 pgs.
King, Stanley Just for Your Info—From Microsoft 2, May 4, 1992, HIFN 002684-2710, 27 pgs.
eXtended Memory Specification (XMS), ver. 2.0, Microsoft, Jul. 19, 1988, HIFN 002711-2724, 14 pgs.
Advanced LZS Technology (ALZS), Whitepaper, Hi/fn, Jun. 1, 1998, HIFN 002725-2727, 3 pgs.
Secure Tape Technology (STT) Whitepaper, Hi/fn, Jun. 1, 1998, HIFN 002728-2733, 6 pgs.
SSLRef 3.0 API Details, Netscape, Nov. 19, 1996, HIFN 002734-2778, 45 pgs.
LZS221-C Version 4 Data Compression Software Data Sheet , Hi/fn, 1994-97, HIFN 002779-2796, 18 pgs.
MPPC-C Version 4 Data Compression Software Data Sheet, Hi/fn, 1994-1997, HIFN 002797-2810, 14 pgs.
Magstar MP Hardware Reference B Series Models Document GA32-0365-01, 1996-1997, [IBM_1_601 pp. 1-338], 338 pages.
Magstar MP 3570 Tape Subsystem, Operator Guide, B-Series Models, 1998-1999, [IBM_1_601 pp. 339-525], 188 pages.
Preview, IBM Magstar 3590 Tape System Enhancements, Hardware Announcement, Feb. 16, 1999, [IBM_1_601 pp. 526-527], 2 pgs.
New IBM Magstar 3590 Models E11 and E1A Enhance Tape Drive Performance, Hardware Announcement, Apr. 20, 1999, [IBM_1_601 pp. 528-540] 13 pgs.
New IBM Magstar 3590 Model A60 Dramatically Tape Drive Performance, Hardware Announcement Jul. 27, 1999, [IBM_1_601 pp. 541-550] 10 pgs.
The IBM Magstar MP Tape Subsystem Provides Fast Access to Data, Sep. 3, 1996, Announcement No. 196-176, [IBM_1_601 pp. 551-563] 13 pgs.
IBM 3590 High Performance Tape Subsystem, Apr. 10, 1995, Announcement 195-106, [IBM_1_601 pp. 564-581] 18 pgs.
Standard ECMA-222 (Jun. 1995): ECMA Standardizing Information and Communications Systems, Adaptive Lossless Data Compression Algorithm, [IBM_1_601 pp. 582-601] 20 pgs.
IBM 3590 and 3494 Revised Availability, Hardware Announcement Aug. 8, 1995, [IBM_743_1241 p. 1] 1 pg.
Direct Delivery of IBM 3494, 3466, and 3590 Storage Products. Hardware Announcement, Sep. 30, 1997, Announcement 197-297, [IBM_743_1241 pp. 2-3] 2 pgs.
IBM Magstar 3590 Enhances Open Systems, Hardware Announcement Feb. 9, 1996, Announcement 198-014, [IBM_743_1241 pp. 4-7] 4 pgs.
Hardware Withdrawal: IBM Magstar 3590 A00 Controller—Replacement Available, Announcement No. 197-267, Withdrawal Announcement, Dec. 9, 1997, [IBM_743_1241 p. 9] 1 pg.
IBM Magstar 3590 Tape Subsystem, Introduction and Planning Guide, Document No. GA32-0329007, [IBM_743_1241 pp. 10-499] 490 pgs.
NetMeeting 2.0 Reviewers Guide, Apr. 1997, [MSCS_298_339] 42 pgs.
Microsoft NetMeeting Compatible Products and Services Directory, Apr. 1997, [MSCS_242_297] 56 pgs.
Microsoft NetMeeting "Try This!" Guide, 1997, [MSCS_340_345] 6 pgs.
The Professional Companion to NetMeeting 2—The Technical Guide to Installing, Configuring, and Supporting NetMeeting 2.0 in Your Organization—Microsoft NetMeeting 2.0, 1996-97, [MSCS_2_241] 240 pgs.
CUSeeMe 3.1.2 User Guide, Nov. 1998, [RAD_1_220] 220 pgs.
MeetingPoint Conference Server Users Guide 3.0, Nov. 1997, [RAD_221_548] 328 pgs.
MeetingPoint Conference Server Users Guide 4.0.2, Dec. 1999, [RAD 549_818] 270 pgs.
MeetingPoint Conference Service Users Guide 3.5.1, Dec. 1998, [RAD_819_1062] 244 pgs.
Enhanced CUSeeMe—Authorized Guide, 1995-1996, [RAD_1063_1372] 310 pgs.
Meeting Point Reader File, Jun. 1999, [RAD_1437_1445] 9 pgs.
Press Release—White Pine Announces Launch of MeetingPoint Conferences Server, Oct. 9, 1997, [RAD_1738_1739] 2 pgs.
Press Release—Leading Network Service Providers Line Up to Support White Pine's MeetingPoint Conference Server Technology, Oct. 9, 1997, [RAD_1740_1743] 4 pgs.
BYTE—A New MeetingPoint for Videoconferencing, Oct. 9, 1997, [RAD_1744_1750] 7 pgs.
Declaration of Patrick Gogerty, *Realtime Data, LLC D/B/A Ixo v. Packeteer, Inc., et al.*, District Court for the Eastern District of Texas, No. 6:08cv144, executed May 8, 2009, 3 pgs.
Other Responses to Interrogatories, Requests for Admission, and Objections to Requests for Admission filed in *Realtime Data, LLC d/b/a/IXO v. Packeteer, Inc. et al.*, Civil Action No. 6.08-cv-00144-LED; U.S. District Court for the Eastern District of Texas, filed Apr. 18, 2008 and terminated Feb. 2, 2010. (PTO Notified—Document NOT submitted).
Deposition Transcript of persons involved in litigation, including inventor James Fallon, and third-party witnesses Jim Karp, Ke-Chiang Chu, and Frank V. DeRosa filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Office of Rebuttal Expert Reports of Dr. Brian Von Herzen, Lester L. Hewitt and Dr. James A. Storer, and Expert Reports of Dr. James A. Storer and Dr. Nathaniel Polish filed in *Realtime Data, LLC d/b/a/ IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Proposed Amended Infringement Contentions filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Documents Concerning Agreements for Meiations and Mediation Proceedings Between Plaintiffs and Some of the Defendants filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document NOT submitted).

(56) References Cited

OTHER PUBLICATIONS

Plaintiff's Oppostion to Joint Defendants' Motion for Parital Summary Judgment of Invalidity of some of the patents in Suit for indefiniteness, including the '104 patent, Blue Coat's response to this objection, Blue Coat's Reply to Plaintiff's response and Plaintiff's Sur-Reply to Blue Coat's Reply filed in *Realtime Data, LLC d/b/a/ IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document NOT submitted.
Plaintiff's Amended P.R. 3-1 Disclosures and Infringement Contentions , Defendants' Motions to Strike unauthorized portions of these disclosures, and Sur-Replies to these Motions filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document NOT submitted).
Expert Report of Dr. James A. Storer Regarding Non-Infringement that contains positions related to the validity of the patents in suit filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document NOT submitted).
*Thomson Reuters Corporation v. Realtime Data, LLC D/B/A IXO*, No. 09 CV 7868 (S.D.N.Y.) Sep. 23, 2009 Order Dismissing Case in Favor of Texas Action, 1 pg.
*Thomson Reuters Corporation v. Realtime Data, LLC D/B/A IXO*, No. 09 CV 7868 (S.D.N.Y.) Sep. 30, 2009 Response to Order re Transfer, 103 pgs.
*Thomson Reuters Corporation v. Realtime Data, LLC D/B/A IXO*, No. 09 CV 7868 (S.D.N.Y.) Oct. 7, 2009 Reply Letter regarding Judge Berman Sep. 23, 2009 Order re Transfer, 182 pgs.
*Thomson Reuters Corporation v. Realtime Data, LLC D/B/A IXO*, No. 09 CV 7868 (S.D.N.Y.) Oct. 15, 2009 Order Staying Case Until TX Action Decided, 3 pgs.
*Thomson Reuters Corporation v. Realtime Data, LLC D/B/A IXO*, No. 09 CV 7868 (S.D.N.Y.) Sep. 11, 2009 Complaint—DJ SD NY, 41 pgs.
*Thomson Reuters Corporation v. Realtime Data, LLC D/B/A IXO*, No. 09 CV 7868 (S.D.N.Y.) Sep. 11, 2009 Rule 7.1 Disclosure Statement for Thomson Reuters, 1 pg.
*Thomson Reuters Corporation v. Realtime Data, LLC D/B/A IXO*, No. 09 CV 7868 (S.D.N.Y.) Order-Stay Pending Transfer Motion Confirmed 10_15_09, 3 pgs.
Opinion and Order of United States Magistrate Judge regarding Claim Construction, *Realtime Data, LLC D/B/A IXO v. Packeteer, Inc., et al.*, District Court for the Eastern District of Texas, No. 6:08cv144, issued Jun. 22, 2009, 75 pgs.
Script for Realtimes' Technology Tutorial Presented to the Magistrate Judge in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 69 pgs.
Opinion and Order of United States Magistrate Judge regarding Plaintiff's Motion to Strike Unauthorized New Invalidity Theories from Defendant Citrix's Opening and Reply Briefs in Support of its Motion for Summary Judgment of Invalidity, *Realtime Data, LLC D/B/A Ixo v. Packeteer, Inc., et al.*, District Court for the Eastern District of Texas, No. 6:08cv144, issued Dec. 8, 2009, 102 pgs.
Defendant Citrix Systems, Inc.'s Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.
Blue Coat Defendants' Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.
Expand Networks' 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 4 pgs.
Expand Networks' 35 U.S.C. Section 282 Disclosures (Amended), *Realtime Data, LLC D/B/A Ixo v. Packeteer, Inc., et al.*, District Court for the Eastern District of Texas, No. 6:08cv144, filed Dec. 11, 2009, 5 pgs.
Defendant Citrix Systems, Inc.'s Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 11, 2009, 3 pgs.
Order of United States Magistrate Judge regarding Motion to Limit the Number of Prior Art References to be Asserted at Trial, *Realtime Data, LLC D/B/A Ixo v. Packeteer, Inc., et al.*, District Court for the Eastern District of Texas, No. 6:08cv144, filed Dec. 21, 2009, 6 pgs.
Expand Defendants' Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 22, 2009, 3 pgs.
Blue Coat Systems, Inc. and 7-Eleven, Inc.'s Notice of Obviousness Combinations to be Used at Trial, *Realtime Data, LLC D/B/A Ixo v. Packeteer, Inc., et al.*, District Court for the Eastern District of Texas, No. 6:08cv144, filed Dec. 22, 2009, 38 pgs.
Defendant Citrix Systems, Inc's Notice of Other Prior Art References Within the Scope of the References Discussed at the Dec. 17, 2009 Hearing, *Realtime Data, LLC D/B/A Ixo v. Packeteer, Inc., et al.*, District Court for the Eastern District of Texas, No. 6:08cv144, filed Dec. 29, 2009, 6 pgs.
Docket Listing downloaded Mar. 10, 2010 for *Realtime Data, LLC D/B/A Ixo v. Packeteer, Inc., et al.*, District Court for the Eastern District of Texas, No. 6:08cv144, filed Apr. 18, 2008, 165 pgs.
CCITT Draft Recommendation T.4, RFC 804, Jan. 1981, 12 pgs.
SNA Formats, IBM Corporation, 14th Ed., Nov. 1993, 3 pgs.
Munteanu et al, "Wavelet-Based Lossless Compression Scheme with Progressive Transmission Capability," John Wiley & Sons, Inc., Int'l J. Imaging Sys. Tech., vol. 10, (1999) pp. 76-85.
Forchhammer and Jensen, "Data Compression of Scanned Halftone Images," IEEE Trans. Commun., vol. 42, Feb.-Apr. 1994, pp. 1881-1893.
Christopher Eoyang et al., "The Birth of the Second Generation: The Hitachi S-820/80," Proceedings of the 1998 ACM/IEEE Conference on Supercomputing, pp. 296-303 (1998).
Transcript for Hearing on Motions for Summary Judgment, *Realtime Data, LLC d/b/a IXO v. Packeteer, Inc. et al*, Civil Action No. 6:08-cv-00144-LED; U.S. District Court for the Eastern District of Texas, 133 pgs, Nov. 8, 2009.
Transcript for Motions Hearing (Including Supplemental Claim Construction Hearing), *Realtime Data, LLC d/b/a IXO v. Packeteer, Inc. et al*, Civil Action No. 6:08-cv-00144-LED; U.S. District Court for the Eastern District of Texas, 88 pgs, Nov. 10, 2009.
Nelson, "The Data Compression Book," M&T Books (2nd Ed. 1996), 283 pgs.
"The Authoritative Dictionary of IEEE Standards Terms," 7th Ed. 2000, p. 273.
Larousse Dictionary of Science and Technology, 1st Ed., 1995, p. 916.
Plaintiff Realtime Data's Motion to Strike Unauthorized New Invalidity Theories from Defendant Citrix's Opening and Reply Briefs in Support Its Motion for Summary Judgment of Invalidity of U.S. Patent No. 7,352,300 (Sep. 22, 2009),14 pgs.
Realtime Data's Reply in Support of Its Motion to Strike Unauthorized New Invalidity Theories from Defendant Citrix's Opening and Reply Briefs in Support of Its Motion for Summary Judgment of Invalidity of U.S. Patent No. 7,352,300 (Oct. 19, 2009), 17 pgs.
Defendant Citrix Systems, Inc.'s Sur-Reply in Opposition to Realtime Data LLC's Motion to Strike Unauthorized New Invalidity Theories from Citrix's Opening and Reply Briefs in Support of Its Motion for Summary Judgment of Invalidity of U.S. Patent No. 7,352,300 (Oct. 30, 2009), 9 pgs.
Blue Coat Defendants' Response to Realtime Data LLC's Notice Re Proposed Construction of "Data Storage Rate" (Nov. 11, 2009), 3 pgs.
Order for Supplemental Briefing on Blue Coat 7-11 Motion for Partial SJ on Non-infringement of Pat 6,601,104 (Nov. 13, 2009), 6 pgs.
Memorandum Opinion and Order (Nov. 23, 2009), 15 pgs.

(56) References Cited

OTHER PUBLICATIONS

Memorandum Opinion and Order (Dec. 8, 2009), 10 pgs.
Expand's Conclusions of Fact and Law Regarding Defense of Inequitable Conduct Concerning the Unenforceability of U.S. Patent No. 7,321,937 (Nov. 12, 2009), 3 pgs.
Realtime Data's Sur-reply Supplemental Claim Construction Brief Concerning Whether the Asserted Claims of the '104 Patent are Product Claims (Dec. 23, 2009), 6 pgs.
Order regarding Defendant Citrix Systems, Inc's Notice of Other Prior Art References Within the Scope of the References Discussed at the Dec. 17, 2009 Hearing (Dec. 30, 2009), 3 pgs.
Network Working group RFC 2068 (Jan. 1997), 163 pgs.
Network Working group RFC 2616 (Jun. 1999), 114 pgs.
Network Working group RFC 1945 (May 1996), 61 pgs.
Network Working group RFC 1950 (May 1996), 10 pgs.
Network Working group RFC 1951 (May 1996), 15 pgs.
Network Working group RFC 1952 (May 1996), 12 pgs.
Notice of Plaintiff Realtime Data LLC's Proposed Supplemental Construction of "Data Storage Rate" In Response to the Court's Comments During the Nov. 10, 2009 Supplemental Claim Construction Hearing (Nov. 10, 2009), 4 pgs.
Citrix's Amended Invalidity Contentions, Including Appendices G2-G8 (Dec. 15, 2009), 509 pgs.
"Plaintiff Realtime Data's Opposition to Defendant F5 Networks' Motion for Summary Judgment that Claims 18-20 of U.S. Patent No. 7,321,937 are Invalid (Aug. 25, 2009)" Civil Action No. 6:08-cv-00144-LED Jury Trial Demanded Filed Under Seal; In the United States District Court for the Eastern District of Texas Tyler Division. [Under Seal—Document Not Submitted].
Declaration of Dr. James W. Modestino relating to U.S. Patent No. 7,161,506, Mar. 15, 2010, 49 pgs.
Second Declaration of Dr. George T. Ligler Under 37 C.F.R. §1.132 relating to U.S. Patent No. 6,601,104, executed May 5, 2010, 3 pgs.
Realtime Data, LLC Complaint for Patent Infringement, *Realtime Data, LLC D/B/A IXO v. CME Group Inc., et al.* (II), District Court for the Eastern District of Texas, No. 6:10-cv-246, filed May 11, 2010, 24 pages.
Realtime Data, LLC Complaint for Patent Infringement, *Realtime Data, LLC D/B/A IXO v. Thompson Reuters Corporation, et al.* (II), District Court for the Eastern District of Texas, No. 6:10-cv-247, filed May 11, 2010, 15 pages.
Realtime Data, LLC Complaint for Patent Infringement, *Realtime Data, LLC D/B/A IXO v. Morgan Stanley, et al.* (II), District Court for the Eastern District of Texas, No. 6:10-cv-248, filed May 11, 2010, 27 pages.
Declaration of Padmaja Chinta in Support of Reatime Data's Reply Claim Construction Brief (including Exhibits A-S), *Realtime Data, LLC D/B/A IXO v. Packeteer, Inc., et al.*, District Court for the Eastern District of Texas, No. 6:08-cv-00144-LED, dated Mar. 30, 2009, 217 pgs.
Extended European search report issuing from European Patent Application 09150508.1, Aug. 3, 2010, 5 pgs.
Complaint, *Thompson Reuters Corporation v. Realtime Data, LLC D/B/A IXO*, Southern District of New York, No. 2:09-cv-7868-RMB, filed Sep. 11, 2009, 6 pages.
Realtime Data, LLC Complaint for Patent Infringement, *Realtime Data, LLC D/B/A IXO v. MetroPCS Texas, LLC et al.*, District Court for the Eastern District of Texas, No. 6:10-cv-00493, filed Sep. 23, 2010, 14 pages.
Complaint and Demand for Jury Trial, *Chicago Board Options Exchange, Incorporated v. Realtime Data, LLC D/B/A IXO*, United States District Court for the Northern District of Illinois, NO. 09 CV 4486, filed Jul. 24, 2009, 6 pages.
Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 15 pgs.
Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in *Realtime Data, LLC d/b/a/ IXO v. Packeteer, Inc. et al.*, Civil Action No. 6:08-cv-00144-LED; U.S. District Court for the Eastern District of Texas, Jul. 31, 2009, 3 pgs.
Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, Aug. 3, 2009, 3 pgs.
Defendants' Invalidity Contentions, *Realtime Data, LLC d/b/a IXO, vs. MetroPCS Texas, LLC, et al.*, Case No. 6:10-CV-00493-LED, in the United States District Court Eastern District of Texas Tyler Division, Jun. 17, 2011, 138 pages.
Appendix A, Claim Charts A-1 to A-25, from Invalidity Contentions, *Realtime Data LLC v. MetroPCS Texas, LLC, et al.*, Case No. 6:10-CV-00493-LED, Jun. 17, 2011, 173 pages.
Appendix B, Claim Charts B-1 to B-23, from *Realtime Data LLC v. MetroPCS Texas, LLC et al.*, Case No. 6:10-CV-00493-LED, Jun. 17, 2011, 809 pages.
Appendix C, Claim Charts C-1 to C-22, from *Realtime Data LLC v. MetroPCS Texas, LLC et al.*, Case No. 6:10-CV-00493-LED, Jun. 17, 2011, 530 pages.
Appendix D, Claim Charts D-1 to D-16, from *Realtime Data LLC v. MetroPCS Texas, LLC et al.*, Case No. 6:10-CV-00493-LED, Jun. 17, 2011, 253 pages.
Appendix E, Claim Charts E-1 to E-20, from *Realtime Data LLC v. MetroPCS Texas, LLC et al.*, Case No. 6:10-CV-00493-LED, Jun. 17, 2011, 397 pages.
Appendix F, Claim Charts F-1 to F-19, from *Realtime Data LLC v. MetroPCS Texas, LLC et al.*, Case No. 6:10-CV-00493-LED, Jun. 17, 2011, 462 pages.
Appendix G, Claim Charts G-1 to G-18' from *Realtime Data LLC v. MetroPCS Texas, LLC et al.*, Case No. 6:10-CV-00493-LED, Jun. 17, 2011, 548 pages.
Appendix H, Claim Charts H-1 to H-22, from *Realtime Data LLC v. MetroPCS Texas, LLC et al.*, Case No. 6:10-CV-00493-LED, Jun. 17, 2011, 151 pages.
Amir et al., "An Application Level Video Gateway," 1995, 11 pages.
Katz, Randy H. and Eric A. Brewer, "The Bay Area Research Wireless Access Network: Towards a Wireless Overlay Internetworking Architecture," Computer Science Division, EECS Department, U.C. Berkeley, 1995, 56 pages.
Katz, R.H. and E.A. Brewer, "The Bay Area Research Wireless Access Network (BARWAN)," UC Berkeley, 1995, 68 pages.
Bruckman, Alfred and Andreas UHL, "Selective Medical Image Compression Using Wavelet Techniques," Jun. 1998, 23 pages.
Crowley et al., "Dynamic Compression During System Save Operations," May 1, 1984, 3 pages.
Hershkovits, "Universal Data Compression with Finite-Memory," Feb. 1995, 99 pages.
Katz et al., "The Bay Area Research Wireless Access Networks (BARWAN)," 1996, 6 pages.
Klein, "Compression and Coding in Information Retrievel Systems," Jun. 1987, pp. vii-viii, 1-4, 10-15, 22-30, 43-48, 62-66, 86-89, 108-111.
Reghbati, "An Overview of Data Compression Techniques," Apr. 1981, pp. 71-75.
Defendants' Joint Preliminary Invalidity Contentions filed in *Realtime Data, LLC D/B/A IXO v. Packeteer, Inc., et al.*, Civil Action No. 6:08-cv-144-LED, United States District Court for the Eastern District of Texas Tyler Division, Dec. 8, 2008, 19 pages.
Appendix A, Claim Charts A-1 to A-46, from *Realtime Data, LLC v. Packeteer, Inc., et al.*, Civil Action No. 6:08-cv-144-LED, Dec. 8, 2008, 345 pages.
Appendix B, Claim Charts B-1 to B-17, from *Realtime Data, LLC v. Packeteer, Inc., et al.*, Civil Action No. 6:08-cv-144-LED, Dec. 8, 2008, 1893 pages.

(56) References Cited

OTHER PUBLICATIONS

Appendix C, Claim Charts C-1 to C-34, from *Realtime Data, LLC* v. *Packeteer, Inc., et al.*, Civil Action No. 6:08-cv-144-LED, Dec. 8, 2008, 1,055 pages.
Appendix D, Claim Charts D-1 to D14, from *Realtime Data, LLC* v. *Packeteer, Inc., et al.*, Civil Action No. 6:08-cv-144-LED, Dec. 8, 2008, 197 pages.
Appendix E, Claim Charts E-1 to E-11, from *Realtime Data, LLC* v. *Packeteer, Inc., et al.*, Civil Action No. 6:08-cv-144-LED, Dec. 8, 2008, 735 pages.
Appendix F, Claim Charts F-1 to F-11, from *Realtime Data, LLC* v. *Packeteer, Inc., et al.*, Civil Action No. 6:08-cv-144-LED, Dec. 8, 2008, 775 pages.
Appendix G, Claim Charts G-1 to G-8, from *Realtime Data, LLC* v. *Packeteer, Inc., et al.*, Civil Action No. 6:08-cv-144-LED, Dec. 8, 2008, 567 pages.
Appendix H, Claim Charts H-1 to H-18, from *Realtime Data, LLC* v. *Packeteer, Inc., et al.*, Civil Action No. 6:08-cv-144-LED, Dec. 8, 2008, 97 pages.
Appendix I, Claim Charts I-1 to I-18, from *Realtime Data, LLC* v. *Packeteer, Inc., et al.*, Civil Action No. 6:08-cv-144-LED, Dec. 8, 2008, 146 pages.
Appendix J, Prior Art Chart, from *Realtime Data, LLC* v. *Packeteer, Inc., et al.*, Civil Action No. 6:08-cv-144-LED, Dec. 8, 2008, 25 pages.
Realtime Data, LLC's [Corrected] P.R. 3-1 Disclosures and Preliminary Infringement Contentions filed in *Realtime Data, LLC D/B/A/ IXO* v. *Packeteer, Inc., et al.*, Civil Action No. 6:08-cv-00144-LED, United States District Court for the Eastern District of Texas Tyler Division, Oct. 8, 2008, 591 pages.
Amended Answer and Counterclaims of Defendants Blue Coat Systems, Inc., Packeteer, Inc., 7-Eleven, Inc., ABM Industries, Inc., ABM Janitorial Services-South Central, Inc.' and Build-A-Bear Workshop, Inc. to Plaintiffs First Amended Complaint for Patent Infringement filed in *Realtime Data, LLC d/b/a/IXO* v. *Packeteer, Inc., et al.*, Civil Action No, 6:08cv144-LED, United States District Court for the Eastern District of Texas Tyler Division, Oct. 28, 2008, 81 pages.
"Packeteer iShaper, PacketShaper and iShared Appliances Drive Intelligent Application Acceleration Across Coogee Resources Wide Area Network", Business Wire, accessed on Aug. 25, 2008, 2 pages.
Whiting, Doug, "*Deflate* vs. *LZS*", Nov. 2000, 2 pages.
"The Packeteer Q4 2005 Financial Conference Call", Jan. 26, 2006, 9 pages.
"Data Compression Ratio", Wikipedia, the free encyclopedia, accessed on Aug. 10, 2011 from http://en.wikipedia.org/wiki/Data_compression_ratio, 2 pages.
"Hard Disk Data Control Method", IBM Technical Disclosure Bulletin NN9302301, vol. 36, No. 2, Feb. 1993, pp. 301-302.
Defendants' Supplemental Invalidity Contentions, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed May 17, 2012, 54 pages.
Expert Report of Michael Brogioli Regarding Asserted Claims of U.S. Patent Nos. 7,417,568 and 7,777,651, with Exhibit A: List of Materials Reviewed, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 26 pages.
Exhibit 1, Curriculum Vitae of Michael C. Brogioli, from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 9 pages.
Exhibit 2, [Proposed] Order Adopting the Parties' Agreed Claim Constructions, from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 6 pages.
Exhibit 3, The Parties' Disputed Claim Constructions, revised May 3, 2012, from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 6 pages.
Exhibit 4, E-Mail Correspondence between James Shalek and Brett Cooper, dated May 17 and 18, 2012, from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 3 pages.
Exhibit 5, Source Code Chart for U.S. Pat. No. 7,417,568 comparing representative elements of the NQDSLIB source code (Apr. 29, 2002 or earlier), from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 3 pages.
Exhibit 6, Source Code Chart for U.S. Pat, No. 7,417,568 comparing representative elements of the NQDSLIB source code (May 2, 2002 or earlier), from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 3 pages.
Exhibit 7, Source Code Chart for U.S. Pat. No. 7,777,651 comparing representative elements of the NQDSLIB source code (Apr. 29, 2002 or earlier), from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 21, 2012, 21 pages.
Exhibit 8, Source Code Chart for U.S. Pat. No. 7,777,651 comparing representative elements of the NQDSLIB source code (May 2, 2002 or earlier), from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 21 pages.
Invalidity Expert Report of Dr. James A. Storer (Redacted), filed inin *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 227 pages.
Defendants' Claim Construction Tutorial, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 54 pages.

(56) References Cited

OTHER PUBLICATIONS

Opinion and Order (Markman), filed in in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 22, 2012, 41 pages.
Opinion and Order (Partial Motion for Summary Judgement re Written Description: "Data Packets"), filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 26, 2012, 8 pages.
Opinion and Order (Partial Motion for Summary Judgment re Data Decompression) filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 27, 2012, 21 pages.
Technology Tutorial (.exe file), presentation filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 2012 (submitted on accompanying CD-ROM).
Lilley, J. et al., "A Unified Header Compression Framework for Low-Bandwidth Links," MobiCom 2000, Aug. 6-11, 2000. Boston, MA, 12 pages.
"WAN Link Compression on HP Routers," Hewlett Packard Application Note, May 1995, 7 pages.
"User Manual for XMill," 2001, 21 pages.
"High Speed Network, Developer's Guide," Standard & Poor's Comstock, Version 1.1, 1994, pp. 1-42, and 53-124.
Larmouth, J., "ASN.1 Complete", Academic Press, 2000, pp. xxi-xxvii, 1-45, 115-130, 168-172, 174, 270-276, and 443-472.
Petty, J., "PPP Hewlett-Packard Packet-by-Packet Compression (HP PPC) Protocol," draft-ietf-ppext-hpppc-00.txt., Oct. 1993, 7 pages.
Friend, R., et al., "IP Payload Compression Using LZS," Network Working Group, Request for Comments: 2395, Category: Informational, Dec. 1998; 9 pages.
"Information technology—Abstract Syntax Notation One (ASN.1): Specification of basic notation," Series X: Data Networks and Open System Communications, OSI networking and system aspects—Abstract Syntax Notation One (ASN.1), International Telecommunication Union, ITU-T Recommendation X.680, Dec. 1997, 109 pages.
Information technology—ASN.1 encoding rules—Specification of Packed Encoding Rules (PER), Series X: Data Networks and Open System Communications, OSI networking and system aspects—Abstract Syntax Notation One (ASN.1), International Telecommunication Union, ITU-T Recommendation X.691, Dec. 1997, 51 pages.
Opinion and Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Sep. 24, 2012, 48 pages.
Memorandum Opinion and Order, filed in *Realtime Data, LLC d/b/a IXO, v. MetroPCS Texas, LLC, et al.*, Civil Action No, 6:10-cv-00493, United States District Court for the Eastern District of Texas, filed Oct. 1, 2012, 22 pages.
T-Mobile's Motion for Leave to Supplement Trial Witness List & Invalidity Contentions, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 6 pages.
Exhibit 2, Defendant T-Mobile's Supplemental Invalidity Contentions, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 13 pages.
Exhibit 3, FNLTD-74478, Flash Networks: Commercial Part Written by Flash Networks for Cegetel, filed in *Realtime Data, LLC d/b/a IXO, v. MetroPCS Texas, LLC, et al.*, Civil Action No. 6:10-cv-00493, United States District Court for the Eastern District of Texas filed Dec. 17, 2012, 6 pages.
Response Exhibit 4, FNLTD-74444, Response to Cegetel RFP: Technical Section, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 5 pages.
Exhibit 5 FNLTD-74926,Flash Networks Optimization Products Selected by AT&T Wireless Flash Networks, Inc. Press Release, filed in *Realtime Data LLC d/b/a IXO, v. MetroPCS Texas, LLC, et al.*, Civil Action No. 6:10-cv-00493, United States District Court for the Eastern District of Texas filed Dec. 17, 2012, 3 pages.
Exhibit 6, Flash Networks: Harmony, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 6 pages.
Exhibit 7, Declaration of Adi Weiser, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.
Exhibit 8, Declaration of Yoav Weiss, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.
Exhibit 9, Declaration of Richard Luthi, filed in *Realtime Data, LLC d/b/a. IXO, v. MetroPCS Texas, LLC, et al.*, Civil Action No. 6:10-cv-00493, United States District Court for the Eastern District of Texas, filed Dec. 17, 2012, 4 pages.
Exhibit 13, Declaration of Gali Weiss, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.
Exhibit 17, P.R. 3-1 Claim Chart for T-Mobile, U.S. Patent No. 7,161,506, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 33 pages.
"Flash Networks Introduces NettGain 1100, New Products for Carriers & Enterprises that Enables Immediate Deployment of Wireless Data Solutions," Press Release, dated Mar. 20, 2001, 2 pages.
Amended Expert Report of Dr. Cliff Reader, filed in *Realtime Data, LLC d/b/a IXO, v. MetroPCS Texas, LLC, et al.*, Civil Action No. 6:10-cv-00493, United Stated District Court for the Eastern District of Texas, filed Jul. 30, 2012, 205 pages.
Final Judgment, filed in *Realtime Data, LLC d/b/a IXO, v. T-Mobile USA, Inc., et al.*, Civil Action No. 6:10-cv-00493, United States District Court for the Eastern District of Texas, filed Mar. 28, 2013, 1 pages.
Final Judgment Pursuant to Fed. R. Civ. P. 45(b), filed in *Realtime Data, LLC d/b/a IXO, v. CME Group Inc., et al.*, Civil Action No. 6:11-cv-06697, United States District Court for the Southern District of New York, dated Nov. 9, 2012, 10 pages.
Final Judgment Pursuant to Fed. R. Civ. P. 45(b), filed in *Realtime Data, LLC d/b/a IXO, v. Morgan Stanley, et al.*, Civil Action No. 6:11-cv-06696, United States District Court for the Southern District of New York, dated Nov. 9, 2012, 10 pages.
Final Judgment Pursuant to Fed. R. Civ. P. 45(b), filed in *Realtime Data, LLC d/b/a IXO, v. Thomson Reuters Corporation, et al.*, Civil Action No. 1:11-cv-06698, United States District Court for the Southern District of New York, dated Nov. 9, 2012, 6 pages.
Opinion and Order (Motion 10), filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Aug. 2, 2012, 13 pages.

(56) References Cited

OTHER PUBLICATIONS

Supplemental Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Nov. 9, 2012, 5 pages.
Memorandum & Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Aug. 2, 2012, 13 pages.
Amended Opinion & Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Aug. 15, 2012, 48 pages.
ChangeLog file for zlib, zlib.net/ChangeLog.txt file, accessed on May 23, 2013, with date refernces Apr. 11, 1995-Apr. 28, 2013, 26 pages.
2.0.39 Kernel Release History, accessed at lwn.net/2001/1018/a/hist-2.0.39.php3, dated Oct. 14, 2011, 8 pages.
"Linux Kernel,"Wikepedia—the Free Encyclopedia, accessed at en.wikipedia.org/wiki/Linux_Kernel, accessed on May 9, 2013, 20 pages.
Rubini, A., "Booting the Kernel," accessed at www.linux.it/~rubini/docs/boot/, Jun. 1997, 6 pages.
Zadok, E., et al., "Fast Indexing: Support for Size-Changing Algorithms in Stackable File Systems," Proceedings of the 2001 Annual USENIX Technical Conference, Jun. 2001, 16 pages.
Non-Confidential Brief for Plaintiff-Appellant Realtime Data, LLC d/b/a IXO, filed in *Realtime Data, LLC d/b/a IXO* v. *Morgan Stanley, et al.*, Case Nos. 2013-1092, -1093, -1095, -1097, -1098, -1099, -1100, -1011, and -1103, United States Court of Appeals for the Federal Circuit, filed Mar. 6, 2013, 80 pages.
Non-Confidential Brief for Defendants—Appellees CMEGroup, Inc., Board of Trade of the City of Chicago, Inc., The New York Mercantile Exchange, Inc., BATS Trading, Inc., and NASDAQ OMX Group, Inc. and NASDAQ OMX PHLX, Inc., filed in *Realtime Data, LLC d/b/a IXO* v. *CME Group, Inc., et al.*, Case Nos. 13/1093, -1097, and -1100, United States Court of Appeals for the Federal Circuit, filed May 20, 2013, 74 pages.
Non-Confidential Reply Brief for Plaintiff-Appellant Realtime Data, LLC d/b/a IXO, filed in *Realtime Data, LLC d/b/a IXO* v. *Morgan Stanley, et al.*, Case Nos. 13/1092, -1093, -1095, -1097, -1098, -1099, -1100, -1101, and -1103, United States Court of Appeals for the Federal Circuit, filed Jun. 19, 2013, 53 pages.
Court Docket History for 6:10-cv-00493-LED *Realtime Data, LLC d/b/a IXO,* v. *MetroPCS Texas, LLC et al.*, downloaded Aug. 9, 2013, 78 pages.
Court Docket History for 1:09-cv-04486 *Chicago Board Options Exchange, Incorporated* v. *Realtime Data, LLC*, downloaded Aug. 9, 2013, 7 pages.
Court Docket History for 6:08-cv-00144-LED-JDL *Realtime Data, LLC d/b/a IXO* v. *Packeteer, Inc. et al.*, downloaded Aug. 9, 2013, 119 pages.
Court Docket History for 6:09-cv-00326-LED-JDL *Realtime Data, LLC d/b/a IXO,* v. *Morgan Stanley et al.*, downloaded Aug. 9, 2013, 45 pages.
Court Docket History for 6:09-cv-00327-LED-JDL *Realtime Data, LLC d/b/a IXO,* v. *CME Group Inc. et al.*, downloaded Aug. 9, 2013, 56 pages.
Court Docket History for 6:09-cv-00333-LED-JDL *Realtime Data, LLC d/b/a IXO* v. *Thomson Reuters et al.*, downloaded Aug. 9, 2013, 30 pages.
Court Docket History for 1:09-cv-07868-RMB *Thomson Reuters Corporation* v. *Realtime Data, LLC*, downloaded Aug. 9, 2013, 3 pages.

Notice of Allowance in Commonly-Assigned U.S. Appl. No. 11/651,366, issued Apr. 10, 2009, 7 pgs.
Non-Final Office Action for U.S. Appl. No. 12/684,624, mailed Nov. 10, 2010, 5 pgs.
Notice of Allowance for U.S. Appl. No. 12/123,081, mailed Feb. 17, 2011, 7 pgs.
Non-Final Office Action for U.S. Appl. No. 12/688,413, mailed Sep. 27, 2010, 13 pgs.
Notice of Allowance for U.S. Appl. No. 11/551,211, mailed Jan. 31, 2011, 4 pgs.
Notice of Allowance for U.S. Appl. No. 11/551,211, mailed Sep. 22, 2010, 4 pgs.
Notice of Allowance for U.S. Appl. No. 11/551,204, mailed Jan. 11, 2011, 4 pgs.
Notice of Allowance for U.S. Appl. No. 11/553,419, mailed Sep. 22, 2010, 4 pgs.
Non-Final Office Action for U.S. Appl. No. 11/400,008, mailed Nov. 23, 2010, 7 pgs.
Notice of Allowance for U.S. Appl. No. 11/651,365, mailed Feb. 4, 2010, 8 pgs.
Notice of Allowance for S. Appl. No. 11/651,365, mailed Nov. 19, 2009, 8 pgs.
Non-Final Office Action for U.S. Appl. No. 09/969,987, mailed Aug. 27, 2010, 13 pgs.
Final Office Action for U.S. Appl. No. 09/969,987, mailed Jan. 28, 2010, 11 pgs.
Notice of Allowance for U.S. Appl. No. 12/131,631, mailed Jun. 22, 2010, 5 pgs.
Final Office Action for U.S. Appl. No. 11/400,008, mailed Oct. 30, 2009, 7 pgs.
Final Office Action for U.S. Appl. No. 11/400,008, mailed May 11, 2010, 7 pgs.
Notice of Allowance for U.S. Appl. No. 11/551,204, mailed Sep. 30, 2010, 4 pgs.
Non-Final Office Action for U.S. Appl. No. 11/551,204, mailed Jun. 16, 2009, 5 pgs.
Notice of Allowance for U.S. Appl. No. 11/551,204, mailed Jun. 21, 2010, 4 pgs.
Non-Final Office Action for U.S. Appl. No. 11/551,204, mailed Sep. 22, 2008, 9 pgs.
Notice of Allowance for U.S. Appl. No. 11/551,204, mailed Jan. 27, 2010, 4 pgs.
Non-Final Office Action for U.S. Appl. No. 12/690,125, mailed Sep. 21, 2010, 12 pgs.
Notice of Allowance for U.S. Appl. No. 11/553,427, mailed Mar. 24, 2011, 5 pages.
Notice of Allowance for U.S. Appl. No. 12/703,042, mailed May 5, 2011, 8 pages.
Notice of Allowance for U.S. Appl. No. 11/551,211, mailed May 6, 2011, 5 pages.
Notice of Allowance for U.S. Appl. No. 11/553,419, mailed May 20, 2011, 5 pages.
Final Office Action for U.S. Appl. No. 09/969,987, mailed May 24, 2011, 17 pgs.
Notice of Allowance for U.S. Appl. No. 11/553,427, mailed May 31, 2011, 5 pages.
Final Office Action for U.S. Appl. No. 12/690,125, mailed Jun. 7, 2011, 11 pages.
Final Office Action for U.S. Appl. No. 12/688,413, mailed Jun. 7, 2011, 15 pages.
Final Office Action for U.S. Appl. No. 11/400,008, mailed Jun. 27, 2011, 6 pages.
Notice of Allowance for U.S. Appl. No. 11/551,204, mailed Jul. 11, 2011, 5 pages.
Notice of Allowance for U.S. Appl. No. 12/684,624, mailed Jul. 25, 2011, 5 pages.
Non-Final Office Action for U.S. Appl. No. 12/703,042, mailed Jul. 28, 2011, 5 pages.
Non-Final Office Action for U.S. Appl. No. 12/857,238, mailed Aug. 10, 2011, 6 pages.
Non-Final Office Action for U.S. Appl. No. 13/101,994, mailed Aug. 16, 2011, 10 pages.

(56) References Cited

OTHER PUBLICATIONS

Notice of Allowance for U.S. Appl. No. 11/551,211, mailed Aug. 24, 2011, 5 pages.
Notice of Allowance for U.S. Appl. No. 12/684,624, mailed Sep. 1, 2011, 9 pages.
Notice of Allowance for U.S. Appl. No. 12/123,081, mailed Sep. 26, 2011, 9 pages.
Notice of Allowance for U.S. Appl. No. 11/551,204, mailed Sep. 28, 2011, 5 pages.
Notice of Allowance for U.S. Appl. No. 11/551,211, mailed Oct. 18, 2011, 5 pages.
Non-Final Office Action for U.S. Appl. No. 13/154,239, mailed Nov. 2, 2011, 6 pages.
Notice of Allowance for U.S. Appl. No. 12/703,042, mailed Nov. 15, 2011, 8 pages.
Non-Final Office Action for U.S. Appl. No. 12/688,413, mailed Nov. 28, 2011, 14 pages.
Notice of Allowance for U.S. Appl. No. 12/857,238, mailed Dec. 30, 2011, 5 pages.
Notice of Allowance for U.S. Appl. No. 11/400,008, mailed Feb. 6, 2012, 8 pages.
Non-Final Office Action for U.S. Appl. No. 12/690,125, mailed Mar. 8, 2012, 7 pages.
Notice of Allowance for U.S. Appl. No. 12/703,042, mailed Mar. 30, 2012, 8 pages.
Non-Final Office Action for U.S. Appl. No. 09/969,987, mailed Apr. 11, 2012, 6 pages.
Notice of Allowance for U.S. Appl. No. 11/553,4193 mailed Apr. 23, 2012, 6 pages.
Notice of Allowance for U.S. Appl. No. 11/553,427, mailed May 7, 2012, 7 pages.
Non-Final Office Action for U.S. Appl. No. 13/118,122, mailed May 16, 2012, 9 pages.
Non-Final Office Action for U.S. Appl. No. 13/101,994, mailed May 23, 2012, 12 pages.
Notice of Allowance for U.S. Appl. No. 12/857,238, mailed May 29, 2012, 5 pages.
Notice of Allowance for U.S. Appl. No. 11/400,008, mailed Jun. 21, 2012, 8 pages.
Final Office Action for U.S. Appl. No. 13/154,239, mailed Jun. 26, 2012, 14 pages.
Notice of Allowance for U.S. Appl. No. 12/857,238, mailed Jul. 12, 2012, 5 pages.
Notice of Allowance for U.S. Appl. No. 12/703,042, mailed Jul. 16, 2012, 8 pages.
Non-Final Office Action for U.S. Appl. No. 13/482,800, mailed Jul. 20, 2012, 14 pages.
Notice of Allowance for U.S. Appl. No. 11/553,427, mailed Nov. 6, 2012, 5 pages.
Notice of Allowance for U.S. Appl. No. 12/703,042, mailed Nov. 15, 2012, 9 pages.
Non-Final Office Action for U.S. Appl. No. 12/857,238, mailed Nov. 29, 2012, 17 pages.
Final Office Action for U.S. Appl. No. 09/969,987, mailed Dec. 4, 2012, 7 pages.
Final Office Action for U.S. Appl. No. 13/101,994, mailed Dec. 13, 2012, 5 pages.
Supplemental Notice of Allowability for U.S. Appl. No. 12/703,042, mailed Dec. 18, 2012, 6 pages.
Notice of Allowance for U.S. Appl. No. 12/690,125, mailed Dec. 28, 2012, 5 pages.
Final Office Action for U.S. Appl. No. 13/118,122, mailed Jan. 9, 2013, 11 pages.
Non-Final Office Action for U.S. Appl. No. 11/553,419, mailed Jan. 15, 2013, 4 pages.
Non-Final Office Action for U.S. Appl. No. 13/482,800, mailed Feb. 19, 2013, 15 pages.
Notice of Allowance for U.S. Appl. No. 12/703,042, mailed Mar. 4, 2013, 9 pages.
Non-Final Office Action for U.S. Appl. No. 12/690,125, mailed Apr. 15, 2013, 11 pages.
Notice of Allowance for U.S. Appl. No. 13/154,239, mailed Apr. 24, 2013, 10 pages.
Notice of Allowance for U.S. Appl. No. 11/553,427, mailed May 14, 2013, 6 pages.
Supplemental Notice of Allowance for U.S. Appl. No. 11/553,427, mailed May 15, 2013, 6 pages.
Notice of Allowance for U.S. Appl. No. 12/857,238, mailed Jun. 17, 2013, 6 pages.
Supplemental Notice of Allowance for U.S. Appl. No. 12/703,042, mailed Jun. 18, 2013, 6 pages.
Supplemental Notice of Allowance for U.S. Appl. No. 11/553,427, mailed Jul. 2, 2013, 2 pages.
Non-Final Office Action for U.S. Appl. No. 09/969,987, mailed Jul. 3, 2013, 8 pages.
Notice of Allowance for U.S. Appl. No. 13/154,211, mailed Jul. 11, 2013, 10 pages.
Non-Final Office Action for U.S. Appl. No. 13/118,122, mailed Jul. 19, 2013, 12 pages.
Notice of Allowance for U.S. Appl. No. 13/154,239, mailed Aug. 2, 2013, 9 pages.
Notice of Allowance for U.S. Appl. No. 13/118,122, mailed Sep. 19, 2013, 6 pages.
Notice of Allowance for U.S. Appl. No. 11/553,419, mailed Oct. 17, 2013, 7 pages.
Notice of Allowance for U.S. Appl. No. 12/857,238, mailed Oct. 23, 2013, 7 pages.
Notice of Allowance for U.S. Appl. No. 13/154,211, mailed Oct. 24, 2013, 9 pages.
Final Office Action for U.S. Appl. No. 13/482,800, mailed Oct. 25, 2013, 21 pages.
International Search Report for PCT/US00/42018, mailed Jul. 31, 2001, 3 pages.
International Search Report for PCT/US01/03712, mailed May 10, 2002, 2 pages.
International Search Report for PCT/US01/03711, mailed Jan. 28, 2001, 5 pages.
Submission of prior art under 37 CFR 1.501, for U.S. Pat. No. 6,604,158, Mar. 3, 2011, 5 pgs.
Submission of prior art under 37 CFR 1.501, for U.S. Pat. No. 7,415,530, Mar. 3, 2011, 14 pgs.
Submission of prior art under 37 CFR 1.501, for U.S. Pat. No. 6,601,104, Mar. 3, 2011, 5 pgs.
Submission of prior art under 37 CFR 1.501, for U.S. Pat. No. 7,161,506, Mar. 3, 2011, 12 pgs.
Submission of prior art under 37 CFR 1.501, for U.S. Pat. No. 7,395,345. Mar. 3, 2011, 14 pgs.
Submission of prior art under 37 CFR 1.501, for U.S. Pat. No. 7,321,937, Mar. 3, 2011, 14 pgs.
Submission of prior art under 37 CFR 1.501, for U.S, Pat. No. 7,352,300, Mar. 3, 2011, 14 pgs.
Submission of prior art under 37 CFR 1.501, for U.S. Pat. No. 7,378,992, Mar. 3, 2011, 14 pgs.
Ex Parte Reexamination Interview Summary, mailed Dec. 3, 2009, for U.S. Reexam App. No. 90/009,428, 4 pgs.
Request for Inter Partes Reexamination of U.S. Patent No. 7,714,747, Control No. 95/001,517, filed Dec. 30, 2010, 696 pages.
Replacement Request for Inter Partes Reexamination of U.S. Patent No. 7,417,568, Control No. 95/001,533, filed Mar. 1, 2011, 357 pages.
L. Gannoun, "RTP Payload Format for X Protocol Media Streams," Audio-Visual Transport WG Internet Draft, Internet Engineering Task Force, Mar. 11, 1998,15 pgs.
Official Order Granting Request for Inter Partes Reexamination of U.S. Pat. No. 6,624,761, Contol No. 95/000,464, issued Jul. 24, 2009, 29 pgs.
Non-Final Office Action in Inter Partes Reexamination of U.S. Pat. No. 6,624,761, Control No. 95/000,464, issued Dec. 15, 2009, 20 pgs.
Non-Final Office Action in Inter Partes Reexamination of U.S. Pat. No. 7,321,937, Control No. 95/000,466, issued Jun. 22, 2009, 11 pgs.

(56) References Cited

OTHER PUBLICATIONS

Official Order Granting Request for Inter Panes Reexamination of U.S. Pat. No. 7,321,937, Control No. 95/000,466, issued Jun. 22, 2009, 16 pgs.
Official Action Closing Prosecution for Inter Partes Reexamination of U.S. Pat. No. 7,321,937, Control No. 95/000,466, issued Dec. 22, 2009, 20 pgs.
Comments by Third Party Requester to Patent Owner's Response Inter Partes Reexamination of U.S. Patent No. 7,321,937, Control No. 95/000,466, filed Nov. 10, 2009, 30 pgs.
Supplemental Declaration of Professor James A. Storer, Ph.D. under 37 C.F.R. §1.132 in Inter Partes Reexamination of U.S. Patent No. 7,321,937, Control No. 95/000,466, executed on Nov. 10, 2009, 16 pgs.
Examiner Interview Summary in Ex Parte Reexamination of U.S. Pat. No. 6,601,104, Control No. 90/009,428, issued Dec. 3, 2009, 3 pgs.
Non-Final Office Action in Ex Parte Reexamination of U.S. Pat. No. 6,601,104, Control No. 90/009,428, issued Nov. 2, 2009, 13 pgs.
Official Order Granting Request for Ex Parte Reexamination of U.S. Pat. No. 6,601,104, Control No. 90/009,428, issued Jun. 1, 2009, 12 pgs.
Declaration of Dr. George T. Ligler under 37 C.F.R. §1.132 in Ex Parte Reexamination of U.S. Pat. No. 6,601,104, Control No. 90/009,428, executed Dec. 28, 2009 16 pgs.
Supplementary Declaration of Dr. George T. Ligler under 37 C.F.R. §1.132 in Ex Parte Reexamination of U.S. Pat. No. 6,601,104, Control No. 90/009,428, executed Dec. 30, 2009 1 pg.
Declaration of Dr. George T. Ligler under 37 C.F.R. §1.132 in Inter Partes Reexamination of U.S. Pat. No. 7,321,937, Control No, 95/000,466, executed Aug. 24, 2009, 30 pgs.
Official Order Granting Request for Inter Partes Reexamination of U.S. Pat. No. 7,161,506, Control No. 95/000,479, issued Aug. 14, 2009, 41 pgs.
Non-Final Office Action in Inter Partes Reexamination of U.S. Pat. No. 7,161,506, Control No. 95/000,479, issued Dec. 15, 2009, 37 pgs.
Official Order Granting Request for Inter Partes Reexamination of U.S. Pat. No. 7,378,992, Control No. 95/000,478, issued Aug. 13, 2009, 60 pgs.
Non-Final Office Action in Inter Partes Reexamination of U.S. Pat. No. 7,378,992, Control No. 95/000,478, issued Dec. 15, 2009, 27 pgs.
Official Order Granting Request for Inter Partes Reexamination of U.S. Pat. No. 6,604,158 Control No. 95/000,486, issued Aug. 14, 2009, 35 pgs.
Non-Final Office Action in Inter Partes Reexamination of U.S. Pat. No. 6,604,158, Control No. 95/000,486, issued Nov. 12, 2009, 199 pgs.
Right of Appeal Notice in Inter Partes Reexamination of U.S. Pat. No. 6,624,761, Control No. 95/000,464, issued Jan. 6, 2011, 15 pgs.
Action Closing Prosecution in Inter Partes Reexamination of U.S. Pat. No. 6,624,761, Control No. 95/000,464, issued Aug. 27, 2010, 25 pgs.
Right of Appeal Notice in Inter Partes Reexamination of U.S. Pat. No. 7,321,937, Control No. 95/000,466, issued May 24, 2010, 23 pgs.
Final Office Action in Ex Parte Reexamination of U.S. Pat. No. 6,601,104, Control No. 90/009,428, issued Feb. 5, 2010, 16 pgs.
Right of Appeal Notice for Inter Partes Reexamination of U.S. Pat. No. 7,161,506, Control No. 95/000,479, issued Jan. 6, 2011, 18 pgs.
Action Closing Prosecution in Inter Partes Reexamination of U.S. Pat. No. 7,161,506, Control No. 95/000,479, issued Aug. 27, 2010, 34 pgs.
Right of Appeal Notice for Inter Partes Reexamination of U.S. Pat. No. 7,378,992, Control No. 95/000,478, issued Jan. 6, 2011, 15 pgs.
Action Closing Prosecution in Inter Partes Reexamination of U.S. Pat. No. 7,378,992, Control No. 95/000,478, issued Aug. 23, 2010, 31 pgs.
Action Closing Prosecution in Inter Partes Reexamination of U.S. Pat. No. 6,604,158 Control No. 95/000,486, issued Mar. 7, 2011, 257 pgs.
Patent Owner's reply to Office Action in Inter Partes Reexamination of U.S. Patent No. 7,378,992, mailed Mar. 15, 2010, 23 pages.
Patent Owner's Reply to Office Action in Inter Partes Reexamination of U.S, Patent No. 7,161,506, mailed Mar. 15, 2010, 23 pages.
Patent Owner's Reply to Action Closing Prosecution of Aug. 23, 2010 in Inter Partes Reexamination of U.S. Patent No. 7,378,992, mailed Sep. 23, 2010, 23 pages.
Patent Owner's Reply to Action Closing Prosecution of Aug. 27, 2010 in Inter Partes Reexamination of U.S. Patent No. 7,161,506, mailed Sep. 27, 2010, 26 pages.
Patent Owner's reply to Action Closing Prosecution of Aug. 27, 2010 in Inter Partes Reexamination of U.S. Patent No. 6,624,761, mailed Sep. 27, 2010, 20 pages.
Corrected Request for Inter Partes Reexamination of U.S. Patent No. 6,624,761, filed Jun. 15, 2009, 241 pages.
Request for Inter Partes Reexamination of U.S. Patent No. 7,378,992, filed May 21, 2009, 255 pages.
Request for Inter Partes Reexamination of U.S. Patent No. 7,161,506, filed May 28, 2009, 455 pages.
Request for Inter Partes Reexamination of U.S. Patent No. 7,777,651, Control No. 95/001,581, filed Mar. 21, 2011, 2,136 pages.
Request for Inter Partes Reexamination of U.S. Patent No. 7,400,274, Control No. 95/001,544, filed February 14, 2011, 420 pages.
Action Closing Prosecution in Inter Partes Reexamination of U.S. Pat. No. 7,321,937, Control No. 95/000,466 issued Dec. 22, 2009, 20 pages.
Order Granting request for inter partes reexamination of U.S. Patent No. 7,400,274 and Non-Final Office Action in Inter Partes reexam of U.S. Patent No. 7,400,274, Control No. 95/001,544, issued Mar. 25, 2011, 47 pages.
Non-Final Office Action in Inter Partes Reexamination of U.S. Patent No. 7,400,274, Control No. 95/001,544, mailed May 20, 2011, 47 pages.
Order Granting Request for Inter Partes Reexamination of U.S. Patent No. 7,777,651, Control No. 95/001,581, mailed Jun. 15, 2011, 22 pages.
Non-Final Office Action in Inter Partes Reexamination of U.S. Patent No. 7,417,568, Control No. 95/001,553, mailed May 6, 2011, 105 pages.
Order Granting Reexamination of U.S. Patent No. 7,714,747, Control No. 95/001,517, mailed Mar. 9, 2011, 21 pages.
Appeal Brief filed in Inter Partes Reexamination of U.S. Patent No. 6,601,104, Control No. 90/009,428, mailed Sep. 2, 2010, 28 pages.
Examiner's Answer to Appeal Brief in Inter Partes Reexamination of U.S. Patent No. 7,321,937, Control No. 95/000,466, mailed Jul. 18, 2011, 33 pages.
Non-Final Office Action in Inter Partes Reexamination of U.S. Patent No. 7,777,651, Control No. 95/001,581, mailed Jul. 25, 2011, 274 pages.
Non-Final Action Closing Prosecution in Inter Partes Reexamination of U.S. Patent No. 7,714,747, Control No. 95/001,517, mailed Sep. 21, 2011, 29 pages.
Definition of "data packet", Academic Press Dictionary of Science and Technology, Copyright 1992, 1996, in Inter Partes Reexamination of U.S. Patent No. 7,714,747, Control No. 95/001,517, mailed Sep. 21, 2011, 2 pages.
Patent Owner's Reply to Office Action in Inter Partes Reexamination, of U.S. Patent No. 7,777,651, Control No. 95/001,581, mailed Sep. 26, 2011, 44 pages.
Examiner's Answer to Appeal Brief in Inter Partes Reexamination of U.S. Patent No. 6,624,761, Control No. 95/000,464, mailed Sep. 28, 2011, 20 pages.
Examiner's Answer to Appeal Brief in Inter Partes Reexamination of U.S. Patent No. 7,161,506, Control No. 95/000,479, mailed Sep. 28, 2011, 25 pages.
Examiner's Answer to Appeal Brief in Inter Partes Reexamination of U.S. Patent No. 7,378,992, Control No. 95/000,478, mailed Sep. 29, 2011, 27 pages.

(56) References Cited

OTHER PUBLICATIONS

Decision on Appeal in Ex parte Reexamination of U.S. Patent No. 6,601,104 B1, Control No. 90/009,428, dated Mar. 18, 2011, 14 pages.

Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No. 6,624,761, Control No. 95/000,464, dated Oct. 28, 2011, 9 pages.

Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No. 7,378,992, Control No. 95/000,478, dated Oct. 28, 2011, 10 pages.

Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No. 7,161,506, Control No. 95/000,479, dated Oct. 28, 2011, 9 pages.

Non-Final Action Closing Prosecution in Inter Partes Reexamination of U.S. Patent No. 7,400,274, Control No. 95/001,533 mailed Nov. 18, 2011, 39 pages.

Non-Final Action Closing Prosecution in Inter Partes Reexamination of U.S. Patent No. 7,417,568, Control No. 95/001,533 mailed Dec. 9, 2011, 42 pages.

Patent Owner's Reply to Action Closing Prosecution of Nov. 18, 2011 in Inter Partes Reexamination of U.S. Patent No. 7,400,274, Control No. 95/001,544, mailed Dec. 19, 2011, 9 pages.

Patent Owner's Reply to Action Closing Prosecution of Dec. 9, 2011 in Inter Partes Reexamination of U.S. Patent No. 7,417,568, Control No. 95/001,533, mailed Dec. 29, 2011, 14 pages.

Notice of Intent to Issue Ex Parte Reexamination Certificate in Ex Parte Reexamination of U.S. Patent No. 6,601,104, Control No. 90/009,428, mailed Jan. 13, 2012, 5 pages.

Decision on Appeal in Inter Partes Reexamination of U.S. Patent No. 6,624,761, Control No. 95/000,464, mailed Jan. 18, 2012, 5 pages.

Decision on Appeal in Inter Partes Reexamination of U.S. Patent No. 7,321,937, Control No. 95/000,466, mailed Jan. 18, 2012, 8 pages.

Decision on Appeal in Inter Partes Reexamination of U.S. Patent No. 7,378,992, Control No. 95/000,478, mailed Jan. 18, 2012, 5 pages.

Decision on Appeal in Inter Partes Reexamination of U.S. Patent No. 7,161,506, Control No. 95/000,479, mailed Jan. 18, 2012, 6 pages.

Non-Final Office Action in Inter Partes Reexamination of U.S. Patent No, 7,777,651, Control No. 95/001,581, mailed Jan. 27, 2012, 152 pages.

Patent Owner's Respondent Brief on Appeal Under 37 C.F.R. § 41.68 in Inter Partes Reexamination of U.S. Patent No. 7,714,747, Control No. 95/001,517, filed Feb. 17, 2012, 20 pages.

Patent Owner's Reply to Second Non-Final Office Action of Jan. 27, 2012 in Inter Partes Reexamination of U.S. Patent No. 7,777,651, Control No. 95/001,581, filed Feb. 24, 2012, 30 pages.

Ex Parte Reexamination Certificate in Ex Parte Reexamination of U.S. Patent No. 6,601,104, Control No. 90/009,428, issued Feb. 28, 2012, 2 pages.

Examiner's Answer to Appeal Brief in Inter Partes Reexamination of U.S. Patent No. 7,714,747, Control No. 95/001,517, mailed Mar. 1, 2012, 4 pages.

Right of Appeal Notice in Inter Partes Reexamination of U.S. Patent No. 7,417,568, Control No. 95/001,533, mailed Mar. 1, 2012, 8 pages.

Right of Appeal Notice in Inter Partes Reexamination of U.S. Patent No. 7,400,274, Control No. 95/001,544, mailed Mar. 6, 2012, 7 pages.

Request for Inter Partes Reexamination of U.S. Patent No. 7,321,937, Control No. 95/001,922, filed Mar. 2, 2012, including accompanying Exhibits PA-A to PA-D, PAT-A to PAT-C, CC-A to CC-D, Oth-A, and Form PTO/SB/08a, 2865 pages.

Request for Inter Partes Reexamination of U.S. Patent No. 6,604,158, Control No. 95/001,923, filed Mar. 2, 2012, including accompanying Exhibits PA-A to PA-D, PAT-A to PAT-B, CC-A to CC-F, Oth-A, and Form PTO/SB/08a, 560 pages.

Request for Inter Partes Reexamination of U.S. Patent No. 7,352,300, Control No. 95/001,924, filed Mar. 2, 2012, including accompanying Exhibits PA-A to PA-H, PAT-A to PAT-B, CC-A to CC-F, Oth-A, and Form PTO/SB/08a, 1012 pages.

Request for Inter Partes Reexamination of U.S. Patent No. 7,395,345, Control No. 95/001,925, filed Mar. 2, 2012, including accompanying Exhibits PA-A to PA-C, PAT-A, CC-A to CC-C, Oth-A, and Form PTO/SB/08a, 204 pages.

Request for Inter Partes Reexamination of U.S. Patent No. 7,161,506, Control No. 95/001,926, filed Mar. 2, 2012, with accompanying Exhibits PA-A to PA-C, PAT-A to PAT-C, CC-A to CC-B, Oth-A to Oth-B, and Form PTO/SB/08a, 2651 pages.

Request for Inter Partes Reexamination, of U.S. Patent No. 7,415,530, Control No. 95/001,927, filed Mar. 2, 2012, including accompanying Exhibits PA-A to PA-F, PAT-A to PAT-B, CC-A to CC-0, Oth-A, and Form PTO/SB/08a, 700 pages.

Request for Inter Partes Reexamination of U.S. Patent No. 7,378,992, Control No. 95/001,928, filed Mar. 2, 2012, including Exhibits PA-A to PA-D, PAT-A to PAT-C, , CC-A to CC-B, Oth-A, and Form PTO/SB/08a, 2316 pages.

Official Order Granting Request for Inter Partes Reexamination of U.S. Patent No. 7,395,345, Control No. 95/001,925, mailed Mar. 19, 2012, 11 pages.

Non-Final Office Action in Inter Partes Reexamination of U.S. Patent No. 7,395,345, Control No. 95/001,925, mailed Mar. 19, 2012, 20 pages.

Notice of Intent to Issue Inter Partes Reexamination Certificate in Inter Partes Reexamination of U.S. Patent No. 7,321,937, Control No. 95/000,466, mailed Mar. 21, 2012, 7 pages.

Right of Appeal Notice for Inter Partes Reexamination of U.S. Patent No. 6,604,158, Control No. 95/000,486, mailed Mar. 26, 2012, 253 pages.

Notice of Intent to Issue Inter Partes Reexamination Certificate in Inter Partes Reexamination of U.S. Patent No. 6,624,761, Control No. 95/000,464, mailed Apr. 3, 2012, 7 pages.

Notice of Intent to Issue Inter Partes Reexamination Certificate in Inter Partes Reexamination of U.S. Patent No. 7,161,506, Control No. 95/000,479, mailed Apr. 4, 2012, 15 pages.

Notice of Intent to Issue Inter Partes Reexamination Certificate in Inter Partes Reexamination of U.S. Patent No. 7,378,992, Control No. 95/000,478, mailed Apr. 6, 2012, 5 pages.

Official Order Granting Request for Inter Partes Reexamination of U.S. Patent No. 7,321,937, Control No. 95/001,922, mailed Apr. 20, 2012, 17 pages.

Non-Final Office Action in Inter Partes Reexamination of U.S. Patent No. 7,321.937, Control No. 95/001,922, mailed Apr. 20, 2012, 8 pages.

Official Order Granting Request for Inter Partes Reexamination of U.S. Patent No. 7,161,506, Control No. 95/001,926, mailed Apr. 25, 2012, 9 pages.

Non-Final Office Action in Inter Partes Reexamination of U.S. Patent No. 7,161,506, Control No. 95/001,926, mailed Apr. 25, 2012, 7 pages.

Official Order Granting Request for Inter Partes Reexamination of U.S. Patent No. 7,378,992, Control No. 95/001,928, mailed Apr. 25, 2012, 8 pages.

Non-Final Office Action in Inter Partes Reexamination of U.S. Patent No. 7.378,992, Control No. 95/001,928, mailed Apr. 25, 2012, 8 pages.

Official Order Denying Request for Inter Partes Reexamination of U.S. Patent No. 7,415.530, Control No. 95/001,927, mailed Apr. 27, 2012, 52 pages.

Official Order Granting Request for Inter Partes Reexamination of U.S. Patent No. 6,604,158, Control No. 95/001,923, mailed May 7, 2012, 14 pages.

Non-Final Office Action in Inter Partes Reexamination of U.S. Patent No. 6,604,158, Control No. 95/001,923, mailed May 7, 2012, 8 pages.

(56) References Cited

OTHER PUBLICATIONS

Petition Under 37 C.F.R. §§ 1.181 and 1.182 for Correction of Notice of Intent to Issue Reexamination Certificate in Inter Partes Reexamination of U.S. Patent No. 7,378,992, Control No. 95/000,478, filed May 9, 2012, 8 pages.
Inter Partes Reexamination Certificate in Inter Partes Reexamination of U.S. Patent No. 7,321,937, Control No. 95/000,466, issued May 15, 2012, 2 pages.
Official Order Granting Request for Inter Partes Reexamination of U.S. Patent No. 7,352,300, Control No. 95/001,924, mailed May 17, 2012, 12 pages.
Non-Final Office Action in Inter Partes Reexamination of U.S. Patent No. 7,352,300, Control No. 95/001,924, mailed May 17, 2012, 18 pages.
Patent Owner's Response to Office Action of Mar. 19, 2012 in Inter Partes Reexamination of U.S. Patent No. 7,395,345, Control No. 95/001,925, filed May 21, 2012, 21 pages.
Inter Partes Reexamination Certificate in Inter Partes Reexamination of U.S. Patent No. 7,161,506, Control No. 95/000,479, issued May 22, 2012, 2 pages.
Inter Partes Reexamination Certificate in Inter Partes Reexamination of U.S. Patent No. 6,624,761, Control No. 95/000,464, issued Jun. 12, 2012, 2 pages.
Action Closing Prosecution in Inter Partes Reexamination of U.S. Patent No. 7,777,651, Control No. 95/001,581, mailed Jun. 18, 2012, 45 pages.
Patent Owner's Response to Office Action of Apr. 20, 2012 in Inter Partes Reexamination of U.S. Patent No. 7,321,937, Control No. 95/001,922, filed Jun. 20, 2012, 11 pages.
Patent Owner's Response to Office Action of Apr. 25, 2012 in Inter Partes Reexamination of U.S. Patent No. 7,161,506, Control No. 95/001,926, filed Jun. 25, 2012, 20 pages.
Patent Owner's Response to Office Action of Apr. 25, 2012 in Inter Partes Reexamination of U.S. Patent No. 7,378,992, Control No. 95/001,928, filed Jun. 25, 2012, 20 pages.
Patent Owner's Response to Office Action of May 7, 2012 in Inter Partes Reexamination of U.S. Patent No. 6,604,158, Control No. 95/001,923, filed Jul. 9, 2012, 19 pages.
Patent Owner's Response to Office Action of May 17, 2012 in Inter Partes Reexamination of U.S. Patent No. 7,352,300, Control. No. 95/001,924, filed Jul. 17, 2012, 31 pages.
New Decision on Appeal after Board Decision in Inter Partes Reexamination of U.S. Patent No. 7,714,747, Control. No. 95/001,517, mailed Jul. 24, 2012, 24 pages.
Right of Appeal Notice for Inter Partes Reexamination of U.S. Patent No. 7,777,651, Control No. 95/001,581, mailed Aug. 3, 2012, 7 pages.
Notice of Intent to Issue Inter Partes Reexamination Certificate in Inter Partes Reexamination of U.S. Patent No. 6,604,158, Control No. 95/000,486, mailed Aug. 30, 2012, 5 pages.
Notice of Intent to Issue Inter Partes Reexamination Certificate in Inter Pates Reexamination of U.S. Patent No. 7,378,992, Control No, 95/000,478, mailed Aug. 31, 2012, 6 pages.
Decision on Petition for Supervisory Review of Refusal to Order Reexamination for Claims 1-2, 16-21, and 23 (37 CFR §§ 1.927 and 1.181) in Inter Partes Reexamination of U.S. Patent No. 7,415,530, Control No. 95/001,927, mailed Aug. 31, 2012, 10 pages.
Decision on Petition Under 37 C.F.R. §§ 1.181 and 1.182 for Correction of Notice of Intent to Issue Reexamination Certificate in Inter Partes Reexamination of U.S. Patent No. 7,378,992, Control No. 95/000,478, mailed Sep. 10, 2012, 6 pages.
Decision on Petition for Supervisory Review of Refusal to Order Reexamination of Claims 5-7, 14-16, and 18-19 (37 CFR §§ 1.927 and 1.181) in Inter Partes Reexamination of U.S. Patent No. 7,321,937, Control No. 95/001,922, mailed Sep. 10, 2012, 12 pages.
Decision on Petition for Supervisory Review of Refusal to Order Reexamination for Claims 86, 89, 90, 92-96, and 98 (37 CFR §§ 1.927 and 1.181) in Inter Partes Reexamination of U.S. Patent No. 7,161,506, Control No. 95/001,926, mailed Sep. 21, 2012, 10 pages.
Non-Final Office Action in Inter Partes Reexamination of U.S. Patent No. 7,415,530, Control No. 95/001,927, mailed Sep. 21, 2012, 15 pages.
Patent Owner's Request to Reopen Prosecution Before the Examiner Under 37 C.F.R. § 41.77(b) in Inter Partes Reexamination of U.S. Patent No. 7,714,747, Control No. 95/001,517, filed Sep. 24, 2012, 29 pages.
Examiner's Answer to Appeal Brief in Ex Parte Reexamination of U.S. Patent No. 7,400,274, Control No. 95/001,544, mailed Oct. 1, 2012, 17 pages.
Inter Partes Reexam Certificate in Inter Partes Reexamination of U.S. Patent No. 7,378,992, Control No. 95/000,478, issued Oct. 4, 2012, 2 pages.
Inter Partes Reexam Certificate in Inter Partes Reexamination of U.S. Patent No. 6,604,158, Control No. 95/000,486, issued Oct. 10, 2012, 2 pages.
Examiner's Answer to Appeal Brief in Inter Partes Reexamination of U.S. Patent No. 7,417,568, Control No. 95/001,533, mailed Oct. 15, 2012, 44 pages.
Non-Final Office Action in Inter Partes Reexamination of U.S. Patent No. 7,321,937, Control No. 95/001,922, mailed Oct. 18, 2012, 10 pages.
Patent Owner's Rebuttal Brief Under 37 C.F.R § 41.71 in Inter Partes Reexamination of U.S. Patent No. 7,417,568, Control No. 95/001,533, filed Nov. 15, 2012, 15 pages.
Patent Owner's Response to Office Action of Oct. 18, 2012 in Inter Partes Reexamination of U.S. Patent No. 7,321,937, Control No. 95/001,922, filed Nov. 19, 2012, 30 pages.
Patent Owner's Supplemental Amendment Subsequent to Timely Submission of Response to Office Action of Oct. 18, 2012 in Inter Partes Reexamination of U.S. Patent No. 7,321,937, Control No. 95/001,922, filed Nov. 27, 2012, 6 pages.
Patent Owner's Response to Office Action of Sep. 21, 2012 in Inter Partes Reexamination of U.S. Patent No. 7,415,530, Control No. 95/001,927, filed Dec. 21, 2012, 51 pages.
Action Closing Prosecution in Inter Partes Reexamination of U.S. Patent No. 7,161,506, Control No. 95/001,926, mailed Mar. 5, 2013, 23 pages.
Action Closing Prosecution in Inter Partes Reexamination of U.S, Patent No. 7,378,992, Control No. 95/001,928, mailed Mar. 5, 2013, 29 pages.
Examiner's Answer to Appeal Brief in Inter Partes Reexamination of U.S. Patent No. 7,777,651, Control No. 95/001,581, mailed Mar. 14, 2013, 21 pages.
Decision on Petition to Strike Patent Owner's Rebuttal Brief in Inter Partes Reexamination of U.S. Patent No. 7,417,568, Control NO. 95/001,553, mailed Mar. 15, 2013, 7 pages.
Order Remanding Inter Partes Reexamination Under 37 C.F.R § 41.77(d) to the Examiner in Inter Partes Reexamination of U.S. Patent No. 7,417,747, Control No. 95/001,517, mailed Mar. 18, 2013, 3 pages.
Decision on Petition Under 37 C.F.R. § 1.183 to Request Examiner Enter Evidence in Inter Partes Reexamination of U.S. Patent No. 7,417,747, Control No. 95/001,517, mailed Mar. 18, 2013, 3 pages.
Action Closing Prosecution in Inter Partes Reexamination of U.S. Patent No. 7,415,530, Control No. 95/001,927, mailed Apr. 3, 2013, 24 pages.
Patent Owner's Reply to Action Closing Prosecution of Mar. 5, 2013 in Inter Partes Reexamination of U.S. Patent No. 7,161,506, Control No. 95/001,926, mailed Apr. 5, 2013, 19 pages.
Patent Owner's Reply to Action Closing Prosecution of Mar. 5, 2013 in Inter Partes Reexamination of U.S. Patent No. 7,378,992, Control No. 95/001,928, mailed Apr. 5, 2013, 23 pages.
Action Closing Prosecution in Inter Partes Reexamination of U.S. Patent No. 7,321,937, Control No. 95/001,922, mailed Apr. 9, 2013, 59 pages.
"Data Transfer Rate (DTR)," accessed at http://searchunifiedcommunications.techtarget.com/definition/data-transfer-rate, published May 18, 2011, 1 page.
"Bandwidth—technical definition," accessed at http://computer.yourdictionary.com/bandwidth, accessed on Mar. 7, 2013, 4 pages.
"Bandwidth—Definition," accessed at http://www.yourdictionary.com/bandwidth, accessed on Mar. 7, 2013, 2 pages.

(56) References Cited

OTHER PUBLICATIONS

"Bandwidth," accessed at http://searchenterprisewan.techtarget.com/definitions/bandwidth, published Mar. 24, 2010, 1 page.
Action Closing Prosecution in Inter Partes Reexamination of U.S. Patent No. 7,352,300, Control No. 95/001,924, mailed Apr. 9, 2013, 30 pages.
Examiner's Determination Under 37 C.F.R § 41.77(d) in Inter Partes Reexamination of U.S. Patent No. 7,714,747, Control No. 95/001,517, mailed Apr. 10, 2013, 7 pages.
Patent Owner's Supplemental Response to Office Action of May 7, 2012 in Inter Partes Reexamination of U.S. Patent No. 6,604,158, Control No. 95/001,923, mailed Apr. 29, 2013, 20 pages.
Patent Owner's Supplemental Response to Office Action of Mar. 19, 2012 in Inter Partes Reexamination of U.S. Patent No. 7,395,345, Control No. 95/001,925, filed May 9, 2013, 13 pages.
Patent Owner's Response to Action Closing Prosecution of Apr. 9, 2013 in Inter Partes Reexamination of U.S. Patent No. 7,321,937, Control No. 95/001,922, filed May 9, 2013, 13 pages.
Patent Owner's Response to Action Closing Prosecution of Apr. 9, 2013 in Inter Partes Reexamination of U.S. Patent No. 7,352,300, Control No. 95/001,924, filed May 9, 2013, 29 pages.
Patent Owner's Comments in Response to Examiner's Determination Under 37 C.F.R. § 41.77(e) in Inter Partes Reexamination of U.S. Patent No. 7,714,747, Control No. 95/001,517, filed May 10, 2013, 20 pages.
Patent Owner's Supplemental Response to Action Closing Prosecution of Apr. 9, 2013 in Inter Partes Reexamination of U.S. Patent No. 7,321,937, Control No. 95/001,922, filed May 15, 2013, 13 pages.
Right of Appeal Notice in Inter Partes Reexamination of U.S. Patent No. 7,415,530, Control No. 95/001,927, mailed May 31, 2013, 26 pages.
Petition Under 37 C.F.R. § 1.181 to Expunge Third Party Requester's Improper Submission of Declarations Under 37 C.F.R. § 1.132 and Strike Comments Directed to Examiner's Determination in Inter Partes Reexamination of U.S. Patent No. 7,714,747, Control No. 95/001,517, filed Jun. 26, 2013, 6 pages.
Notice of Intent to Issue a Reexam Certificate in Inter Partes Reexamination of U.S. Patent No. 7,415,530, Control No. 95/001,927, mailed Jul. 19, 2013, 5 pages.
Right of Appeal Notice in Inter Partes Reexamination of U.S. Patent No. 7,321,937, Control No. 95/001,922, mailed Aug. 15, 2013, 12 pages.
Right of Appeal Notice in Inter Partes Reexamination of U.S. Patent No. 7,161,506, Control No. 95/001,926, mailed Aug. 16, 2013, 11 pages.
Inter Partes Reexamination Certificate in Inter Partes Reexamination of U.S. Patent No. 7,415,530, Control No. 95/001,927, issued Aug. 16, 2013, 2 pages.
Right of Appeal Notice in Inter Partes Reexamination of U.S. Patent No. 7,378,992, Control No. 95/001,928, mailed Aug. 16, 2013, 11 pages.
Right of Appeal Notice in Inter Partes Reexamination of U.S. Patent No. 7,352,300, Control No. 95/001,925, mailed Aug. 29, 2013, 23 pages.
Action Closing Prosecution in Inter Partes Reexamination of U.S. Patent No. 7,395,345, Control No. 95/001,925, mailed Sep. 20, 2013, 47 pages.
Decision on Petition(s) Decided Under 37 C.F.R 1.181 in Inter Partes Reexamination of U.S. Patent No. 7,714,747, Control No. 95/001,517, mailed Sep. 23, 2013, 3 pages.
Action Closing Prosecution in Inter Partes Reexamination of U.S. Patent No. 6,604,158, Control No. 95/001,923, mailed Oct. 2, 2013, 18 pages.
Patent Owner's Reply to Action Closing Prosecution of Sep. 20, 2013 in Inter Partes Reexamination of U.S. Patent No. 7,395,345, Control No. 95/001,925, filed Oct. 21, 2013, 9 pages.
Decision on Appeal in Inter Partes Reexamination of U.S. Patent No. 7,417,568, Control No. 95/001,533, mailed Nov. 1, 2013, 18 pages.
Decision on Appeal in Inter Panes Reexamination of U.S. Patent No. 7,400,274, Control No. 95/001,544, mailed Nov. 1, 2013, 12 pages.
Decision on Appeal in Inter Partes Reexamination of U.S. Patent No. 7,777,651, Control No. 95/001,581, mailed Nov. 1, 2013, 15 pages.
Patent Owner's Reply to Action Closing Prosecution of Oct. 2, 2013 in Inter Partes Reexamination of U.S. Patent No. 6,604,158, Control No. 95/001,923, filed Nov. 4, 2013, 9 pages.
Notice of Intent to Issue a Reexam Certificate in Inter Panes Reexamination of U.S. Patent No. 7,321,937, Control No. 95/001,922, mailed Nov. 13, 2013, 8 pages.
Notice of Intent to Issue a Reexam Certificate in Inter Partes Reexamination of U.S. Patent No. 7,378,992, Control No. 95/001,928, mailed Nov. 21, 2013, 10 pages.
Court Docket History for 6:10-cv-00493-LED-JDL, *Realtime Data, LLC d/b/a IXO*, v. *T-Mobile, USA Inc.*, dated Jul. 8, 2013, 77 pages.
Court Docket History for 1:11-cv-06696-RJH, *Realtime Data, LLC d/b/a IXO*, v. *Morgan Stanley et al.*, dated Jul. 8, 2013, 80 pages.
Court Docket History for 1:11-cv-06697-UA, *Realtime Data, LLC d/b/a IXO*, v. *CME Group Inc. et al.*, dated Jul. 8, 2013, 105 pages.
Court Docket History for 1:11-cv-06698-UA, *Realtime Data, LLC d/b/a IXO*, v. *Thomson Reuters et al.*, dated Jul. 8, 2013, 59 pages.
U.S. Appl. No. 14/033,245, Fallon et al., "Systems and Methods for Video and Audio Data Storage and Distribution," filed Sep. 20, 2013.
U.S. Appl. No. 14/035,712, Fallon et al., "Methods for Encoding and Decoding Data," filed Sep. 24, 2013.
U.S. Appl. No. 14/035,716, Fallon et al., "Methods for Encoding and Decoding Data," filed Sep. 24, 2013.
U.S. Appl. No. 14/035,719, Fallon et al., "Methods for Encoding and Decoding Data," filed Sep. 24, 2013.
Opinion, with Errata, filed in *Realtime Data, LLC d/b/a IXO* v. *Morgan Stanley, et al.*, Case Nos. 13-1092, -1093, -1095, -1097, -1098, -1099, -1100, -1101, and -1103, United States Court of Appeals for the Federal Circuit, filed Jan. 27, 2014, 41 pages.
Supplemental Notice of Allowability for U.S. Appl. No. 13/154,211, mailed Nov. 26, 2013, 4 pages.
Notice of Allowance for U.S. Appl. No. 13/101,994, mailed Dec. 2, 2013, 7 pages.
Notice of Allowance for U.S. Appl. No. 11/553,419, mailed Dec. 18, 2013, 6 pages.
Supplemental Notice of Allowability for U.S. Appl. No. 13/154,211, mailed Dec. 19, 2013, 4 pages.
Non-Final Office Action for U.S. Appl. No. 14/035,716, mailed Dec. 20, 2013, 12 pages.
Notice of Allowance for U.S. Appl. No. 14/035,712, mailed Dec. 20, 2013, 8 pages.
Non-Final Office Action for U.S. Appl. No. 14/035,719, mailed Dec. 20, 2013, 11 pages.
Final Office Action for U.S. Appl. No. 12/690,125, mailed Dec. 27, 2013, 12 pages.
Corrected Notice of Allowability for U.S. Appl. No. 11/553,419, mailed Jan. 14, 2014, 2 pages.
Corrected Notice of Allowability for U.S. Appl. No. 11/553,419, mailed Jan. 31, 2014, 2 pages.
Non-Final Office Action for U.S. Appl. No. 13/118,122, mailed Feb. 19, 2014, 23 pages.
Notice of Intent to Issue an Inter Partes Reexamination Certificate in Inter Partes Reexamination of U.S. Patent No. 7,161,506, Control No. 95/001,926, mailed Nov. 27, 2013, 10 pages.
Patent Owner's Request to Reopen Prosecution Before the Examiner under 37 C.F.R. § 41.77(b) in Inter Partes Reexamination of U.S. Patent No. 7,417,568, Control No. 95/001,533, filed Dec. 2, 2013, 41 pages.
Patent Owner's Request to Reopen Prosecution Before the Examiner under 37 C.F.R. § 41.77(b) in Inter Partes Reexamination of U.S. Patent No. 7,777,651, Control No. 95/001,581, filed Dec. 2, 2013, 57 pages.
Patent Owner's Request to Reopen Prosecution Before the Examiner under 37 C.F.R. § 41.77(b) in Inter Partes Reexamination of U.S. Patent No. 7,400,274, Control No. 95/001,544, filed Dec. 2, 2013, 33 pages.
Inter Partes Reexamination Certificate in Inter Partes Reexamination of U.S. Patent No. 7,321,937, Control No. 95/001,922, mailed Dec. 5, 2013, 2 pages.

(56) References Cited

OTHER PUBLICATIONS

Patent Owner's Petition Under 37 C.F.R. § 1.182 in Opposition to CME Group's Petition to Strike Patent Owner's Proposed New Claims, in Inter Partes Reexamination of U.S. Patent No. 7,417,568, Control No. 95/001,533, filed Jan. 2, 2014, 8 pages.
Patent Owner's Petition Under 37 C.F.R. § 1.182 in Opposition to CME Group's Petition to Strike Patent Owner's Proposed New Claims, in Inter Partes Reexamination of U.S. Patent No. 7,400,274, Control No. 95/001,544, filed Jan. 2, 2014, 8 pages.
Patent Owner's Petition Under 37 C.F.R. § 1.182 in Opposition to CME Group's Petition to Strike Patent Owner's Proposed New Claims, in Inter Partes Reexamination of U.S. Patent No. 7,777,651, Control No. 95/001,581, filed Jan. 2, 2014, 10 pages.
Inter Partes Reexamination Certificate in Inter Partes Reexamination of U.S. Patent No. 7,161,506, Control No. 95/001,926, mailed Jan. 8, 2014, 2 pages.
Inter Partes Reexamination Certificate in Inter Partes Reexamination of U.S. Patent No. 7,378,992, Control No. 95/001,928, mailed Jan. 8, 2014, 3 pages.
Examiner's Determination Under 37 C.F.R. § 41.77(d) in Inter Partes Reexamination of U.S. Patent No. 7,714,747, Control No. 95/001,517, mailed Jan. 14, 2014, 11 pages.
Patent Owner's Petition Under 37 C.F.R. § 1.182 to Strike Third Party Requester's Improper Response Under 37 C.F.R. §41.77(c), in Inter Partes Reexamination of U.S. Patent No. 7,417,568, Control No. 95/001,533, filed Jan. 22, 2014, 3 pages.
Patent Owner's Petition Under 37 C.F.R. § 1.182 to Strike Third Party Requester's Improper Response Under 37 C.F.R. §41.77(c), in Inter Partes Reexamination of U.S. Patent No. 7,400,274, Control No. 95/001,544, filed Jan. 22, 2014, 3 pages.
Patent Owner's Petition Under 37 C.F.R. § 1.182 to Strike Third Party Requester's Improper Response Under 37 C.F.R. §41.77(c), in Inter Partes Reexamination of U.S. Patent No. 7,777,651, Control No. 95/001,581, filed Jan. 22, 2014, 3 pages.
Patent Owner's Petition Under 37 C.F.R. § 1.182 to Strike Third Party Requester's Improper Response Under 37 C.F.R. § 1.132, in Inter Partes Reexamination of U.S. Patent No. 7,417,568, Control No. 95/001,533, filed Jan. 22, 2014, 3 pages.
Patent Owner's Petition Under 37 C.F.R. § 1.182 to Strike Third Party Requester's Improper Response Under 37 C.F.R. § 1.132, in Inter Partes Reexamination of U.S. Patent No. 7,400,274, Control No. 95/001,544, filed Jan. 22, 2014, 3 pages.
Patent Owner's Petition Under 37 C.F.R. § 1.182 to Strike Third Party Requester's Improper Response Under 37 C.F.R. § 1.132, in Inter Partes Reexamination of U.S. Patent No. 7,777,651, Control No. 95/001,581, filed Jan. 22, 2014, 3 pages.
Patent Owner's Petition Under 37 C.F.R. § 41.79, in Inter Partes Reexamination of U.S. Patent No. 7,714,747, Control No. 95/001,517, filed Feb. 14, 2014, 11 pages.
U.S. Appl. No. 14/134,926, Fallon, et al., "System and Methods for Video and Audio Data Distribution," filed Dec. 19, 2013.
U.S. Appl. No. 14/134,933, Fallon, et al., "System and Methods for Video and Audio Data Distribution," Dec. 19, 2013.

* cited by examiner

DATA COMPRESSION SYSTEMS AND METHODS

CROSS REFERENCE TO RELATED APPLICATIONS

This application is a Continuation of U.S. patent application Ser. No. 13/154,211, filed Jun. 6, 2011, which is a Continuation of U.S. patent application Ser. No. 12/703,042, filed Feb. 9, 2010, now U.S. Pat. No. 8,502,707, which is a Continuation of both U.S. patent application Ser. No. 11/651,366, filed Jan. 8, 2007, now abandoned, and U.S. patent application Ser. No. 11/651,365, filed Jan. 8, 2007, now U.S. Pat. No. 7,714,747. Each of application Ser. No. 11/651,366 and application Ser. No. 11/651,365 is a Continuation of U.S. patent application Ser. No. 10/668,768, filed Sep. 22, 2003, now U.S. Pat. No. 7,161,506, which is a Continuation of U.S. patent application Ser. No. 10/016,355, filed Oct. 29, 2001, now U.S. Pat. No. 6,624,761, which is a Continuation-In-Part of U.S. patent application Ser. No. 09/705,446, filed Nov. 3, 2000, now U.S. Pat. No. 6,309,424, which is a Continuation of U.S. patent application Ser. No. 09/210,491, filed Dec. 11, 1998, which is now U.S. Pat. No. 6,195,024. Each of the listed applications are incorporated herein by reference in their entireties.

BACKGROUND

1. Technical Field

The present invention relates generally to a data compression and decompression and, more particularly, to systems and methods for data compression using content independent and content dependent data compression and decompression.

2. Description of Related Art

Information may be represented in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video, frequently exists in the natural world as analog information. As is well known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Lossy data compression techniques provide for an inexact representation of the original uncompressed data such that the decoded (or reconstructed) data differs from the original unencoded/uncompressed data. Lossy data compression is also known as irreversible or noisy compression. Entropy is defined as the quantity of information in a given set of data. Thus, one obvious advantage of lossy data compression is that the compression ratios can be larger than the entropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

There are various problems associated with the use of lossless compression techniques. One fundamental problem encountered with most lossless data compression techniques are their content sensitive behavior. This is often referred to as data dependency. Data dependency implies that the compression ratio achieved is highly contingent upon the content of the data being compressed. For example, database files often have large unused fields and high data redundancies, offering the opportunity to losslessly compress data at ratios of 5 to 1 or more. In contrast, concise software programs have little to no data redundancy and, typically, will not losslessly compress better than 2 to 1.

Another problem with lossless compression is that there are significant variations in the compression ratio obtained when using a single lossless data compression technique for data streams having different data content and data size. This process is known as natural variation.

A further problem is that negative compression may occur when certain data compression techniques act upon many types of highly compressed data. Highly compressed data appears random and many data compression techniques will substantially expand, not compress this type of data.

For a given application, there are many factors that govern the applicability of various data compression techniques. These factors include compression ratio, encoding and decoding processing requirements, encoding and decoding time delays, compatibility with existing standards, and implementation complexity and cost, along with the is adaptability and robustness to variations in input data. A direct relationship exists in the current art between compression ratio and the amount and complexity of processing required. One of the limiting factors in most existing prior art lossless data compression techniques is the rate at which the encoding and decoding processes are performed. Hardware and software implementation tradeoffs are often dictated by encoder and decoder complexity along with cost.

Another problem associated with lossless compression methods is determining the optimal compression technique for a given set of input data and intended application. To combat this problem, there are many conventional content dependent techniques that may be utilized. For instance, file type descriptors are typically appended to file names to describe the application programs that normally act upon the data contained within the file. In this manner data types, data structures, and formats within a given file may be ascertained. Fundamental limitations with this content dependent technique include:

(1) the extremely large number of application programs, some of which do not possess published or documented file formats, data structures, or data type descriptors;

(2) the ability for any data compression supplier or consortium to acquire, store, and access the vast amounts of data required to identify known file descriptors and associated data types, data structures, and formats; and (3) the rate at which new application programs are developed and the need to update file format data descriptions accordingly.

An alternative technique that approaches the problem of selecting an appropriate lossless data compression technique is disclosed, for example, in U.S. Pat. No. 5,467,087 to Chu entitled "High Speed Lossless Data Compression System" ("Chu"). FIG. 1 illustrates an embodiment of this data compression and decompression technique. Data compression 1 comprises two phases, a data pre-compression phase 2 and a data compression phase 3. Data decompression 4 of a compressed input data stream is also comprised of two phases, a data type retrieval phase 5 and a data decompression phase 6. During the data compression process 1, the data pre-compressor 2 accepts an uncompressed data stream, identifies the data type of the input stream, and generates a data type identification signal. The data compressor 3 selects a data compression method from a preselected set of methods to compress the input data stream, with the intention of producing the best available compression ratio for that particular data type.

There are several limitations associated with the Chu method. One such limitation is the need to unambiguously identify various data types. While these might include such common data types as ASCII, binary, or unicode, there, in fact, exists a broad universe of data types that fall outside the three most common data types. Examples of these alternate data types include: signed and unsigned integers of various lengths, differing types and precision of floating point numbers, pointers, other forms of character text, and a multitude of user defined data types. Additionally, data types may be interspersed or partially compressed, making data type recognition difficult and/or impractical. Another limitation is that given a known data type, or mix of data types within a specific set or subset of input data, it may be difficult and/or impractical to predict which data encoding technique yields the highest compression ratio.

Accordingly, there is a need for a data compression system and method that would address limitations in conventional data compression techniques as described above.

SUMMARY OF THE INVENTION

The present invention is directed to systems and methods for providing fast and efficient data compression using a combination of content independent data compression and content dependent data compression. In one aspect of the invention, a method for compressing data comprises the steps of:

analyzing a data block of an input data stream to identify a data type of the data block, the input data stream comprising a plurality of disparate data types;

performing content dependent data compression on the data block, if the data type of the data block is identified;

performing content independent data compression on the data block, if the data type of the data block is not identified.

In another aspect, the step of performing content independent data compression comprises: encoding the data block with a plurality of encoders to provide a plurality of encoded data blocks; determining a compression ratio obtained for each of the encoders; comparing each of the determined compression ratios with a first compression threshold; selecting for output the input data block and appending a null compression descriptor to the input data block, if all of the encoder compression ratios do not meet the first compression threshold; and selecting for output the encoded data block having the highest compression ratio and appending a corresponding compression type descriptor to the selected encoded data block, if at least one of the compression ratios meet the first compression threshold.

In another aspect, the step of performing content dependent compression comprises the steps of: selecting one or more encoders associated with the identified data type and encoding the data block with the selected encoders to provide a plurality of encoded data blocks; determining a compression ratio obtained for each of the selected encoders; comparing each of the determined compression ratios with a second compression threshold; selecting for output the input data block and appending a null compression descriptor to the input data block, if all of the encoder compression do not meet the second compression threshold; and selecting for output the encoded data block having the highest compression ratio and appending a corresponding compression type descriptor to the selected encoded data block, if at least one of the compression ratios meet the second compression threshold.

In yet another aspect, the step of performing content independent data compression on the data block, if the data type of the data block is not identified, comprises the steps of: estimating a desirability of using of one or more encoder types based one characteristics of the data block; and compressing the data block using one or more desirable encoders.

In another aspect, the step of performing content dependent data compression on the data block, if the data type of the data block is identified, comprises the steps of: estimating a desirability of using of one or more encoder types based on characteristics of the data block; and compressing the data block using one or more desirable encoders.

In another aspect, the step of analyzing the data block comprises analyzing the data block to recognize one of a data type, data structure, data block format, file substructure, and/or file types. A further step comprises maintaining an association between encoder types and data types, data structures, data block formats, file substructure, and/or file types.

In yet another aspect of the invention, a method for compressing data comprises the steps of:

analyzing a data block of an input data stream to identify a data type of the data block, the input data stream comprising a plurality of disparate data types;

performing content dependent data compression on the data block, if the data type of the data block is identified;

determining a compression ratio of the compressed data block obtained using the content dependent compression and comparing the compression ratio with a first compression threshold; and performing content independent data compression on the data block, if the data type of the data block is not identified or if the compression ratio of the compressed data block obtained using the content dependent compression does not meet the first compression threshold.

Advantageously, the present invention employs a plurality of encoders applying a plurality of compression techniques on an input data stream so as to achieve maximum compression in accordance with the real-time or pseudo real-time data rate constraint. Thus, the output bit rate is not fixed and the amount, if any, of permissible data quality degradation is user or data specified.

These and other aspects, features and advantages of the present invention will become apparent from the following detailed description of preferred embodiments, which is to be read in connection with the accompanying drawings.

DETAILED DESCRIPTION OF THE INVENTION

Figure 1:
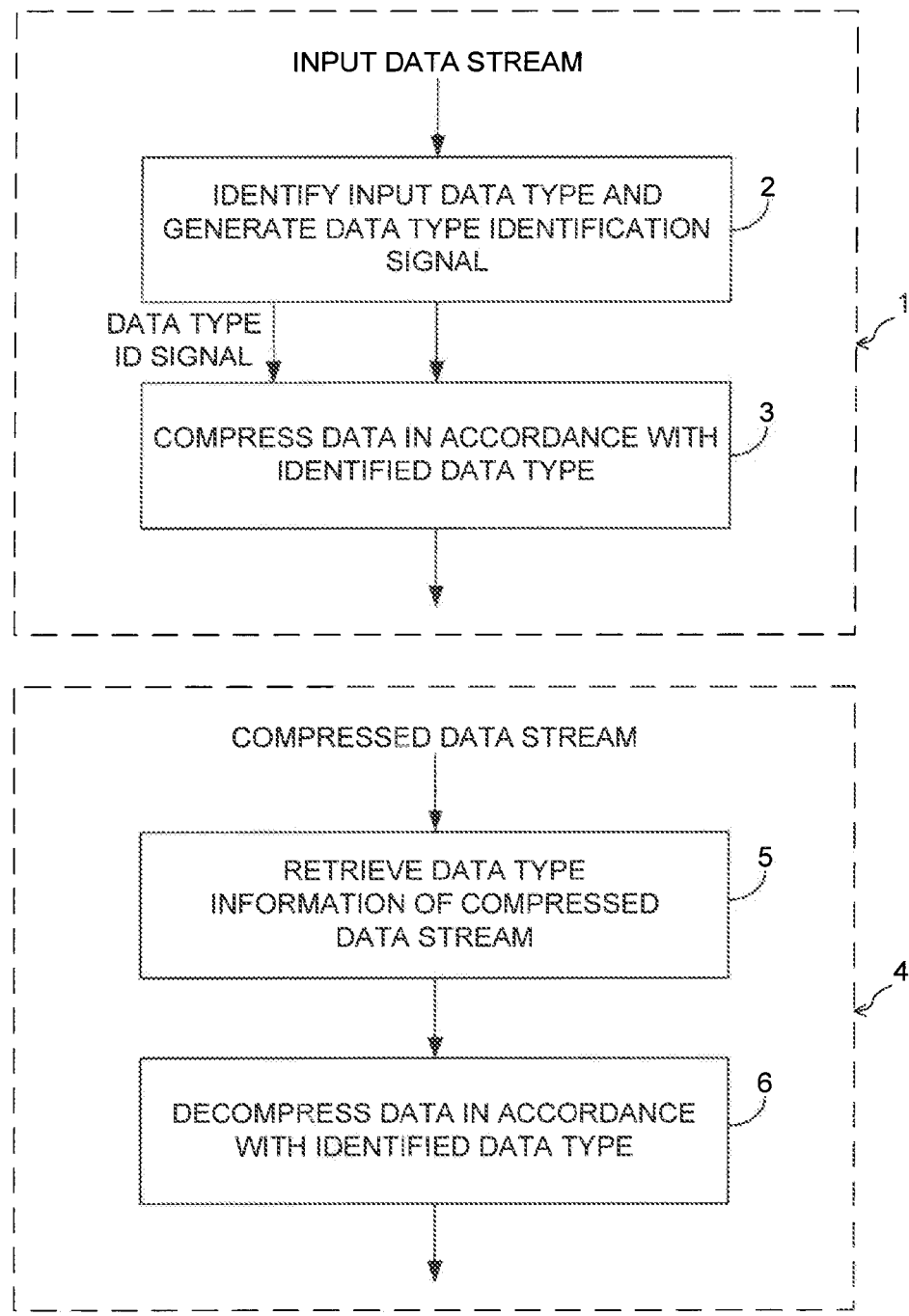
FIG. 1 is a block/flow diagram of a content dependent high-speed lossless data compression and decompression system/method according to the prior art.

The present invention is directed to systems and methods for providing data compression and decompression using content independent and content dependent data compression and decompression. In the following description, it is to be understood that system elements having equivalent or similar functionality are designated with the same reference numerals in the Figures. It is to be further understood that the present invention may be implemented in various forms of hardware, software, firmware, or a combination thereof. In particular, the system modules described herein are preferably implemented in software as an application program that is executable by, e.g., a general purpose computer or any machine or device having any suitable and preferred microprocessor architecture. Preferably, the present invention is implemented on a computer platform including hardware such as one or more central processing units (CPU), a random access memory (RAM), and input/output (I/O) interface(s). The computer platform also includes an operating system and microinstruction code. The various processes and functions described herein may be either part of the microinstruction code or application programs which are executed via the operating system. In addition, various other peripheral devices may be connected to the computer platform such as an additional data storage device and a printing device.

It is to be further understood that, because some of the constituent system components described herein are preferably implemented as software modules, the actual system connections shown in the Figures may differ depending upon the manner in which the systems are programmed. It is to be appreciated that special purpose microprocessors may be employed to implement the present invention. Given the teachings herein, one of ordinary skill in the related art will be able to contemplate these and similar implementations or configurations of the present invention.

Figure 2:
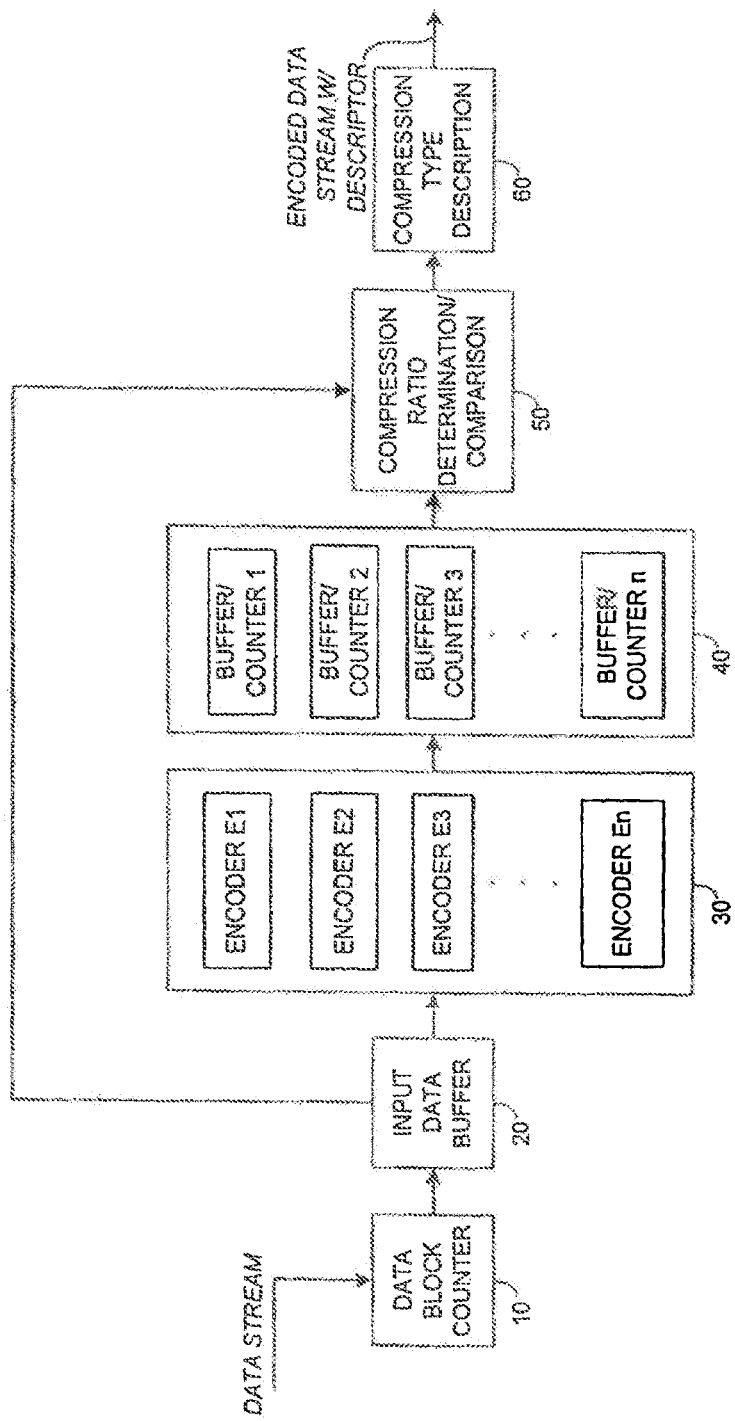
FIG. 2 is a block diagram of a content independent data compression system according to one embodiment of the present invention.

Referring now to FIG. 2 a block diagram illustrates a content independent data compression system according to one embodiment of the present invention. The data compression system includes a counter module 10 that receives as input an uncompressed or compressed data stream. It is to be understood that the system processes the input data stream in data blocks that may range in size from individual bits through complete files or collections of multiple files. Additionally, the data block size may be fixed or variable. The counter module 10 counts the size of each input data block (i.e., the data block size is counted in bits, bytes, words, any convenient data multiple or metric, or any combination thereof).

An input data buffer 20, operatively connected to the counter module 10, may be provided for buffering the input data stream in order to output an uncompressed data stream in the event that, as discussed in further detail below, every encoder fails to achieve a level of compression that exceeds an a priori specified minimum compression ratio threshold. It is to be understood that the input data buffer 20 is not required for implementing the present invention.

An encoder module 30 is operatively connected to the buffer 20 and comprises a set of encoders E1, E2, E3 . . . En. The encoder set E1, E2, . . . E3 . . . En may include any number "n" of those lossless encoding techniques currently well known within the art such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 30 successively receives as input each of the buffered input data blocks (or unbuffered input, data blocks from the counter module 10). Data compression is performed by the encoder module 30 wherein each of the encoders E1 . . . En processes a given input data block and outputs a corresponding set of encoded data blocks, It is to be appreciated that the system affords a user the option to enable/disable any one or more of the encoders E1 . . . En prior to operation. As is understood by those skilled in the art, such feature allows the user to tailor the operation of the data compression system for specific applications. It is to be further appreciated that the is encoding process may be performed either in parallel or sequentially. In particular, the encoders E1 through En of encoder module 30 may operate in parallel (i.e., simultaneously processing a given input data block by utilizing task multiplexing on a single central processor, via dedicated hardware, by executing on a plurality of processor or dedicated hardware systems, or any combination thereof). In addition, encoders E1 through En may operate sequentially on a given unbuffered or buffered input data block, This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 40 is operatively connected to the encoding module 30 for buffering and counting the size of each of the encoded data blocks output from encoder module 30. Specifically, the buffer/counter 30 comprises a plurality of buffer/counters BC1, BC2, BC3 . . . BCn, each operatively associated with a corresponding one of the encoders E1 . . . En. A compression ratio module 50, operatively connected to the output buffer/counter 40, determines the compression ratio obtained for each of the enabled encoders E1 . . . En by taking the ratio of the size of the input data block to the size of the output data block stored in the corresponding buffer/counters BC1 . . . BCn. In addition, the compression ratio module 50 compares each compression ratio with an a priori-specified compression ratio threshold limit to determine if at least one of the encoded data blocks output from the enabled encoders E1 . . . En achieves a compression that exceeds an a priori-specified threshold. As is understood by those skilled in the art, the threshold limit may be specified as any value inclusive of data expansion, no data compression or expansion, or any arbitrarily desired compression limit. A description module 60, operatively coupled to the compression ratio module 50, appends a corresponding compression type descriptor to each encoded data block which is selected for output so as to indicate the type of compression format of the encoded data block.

Figure 3A:
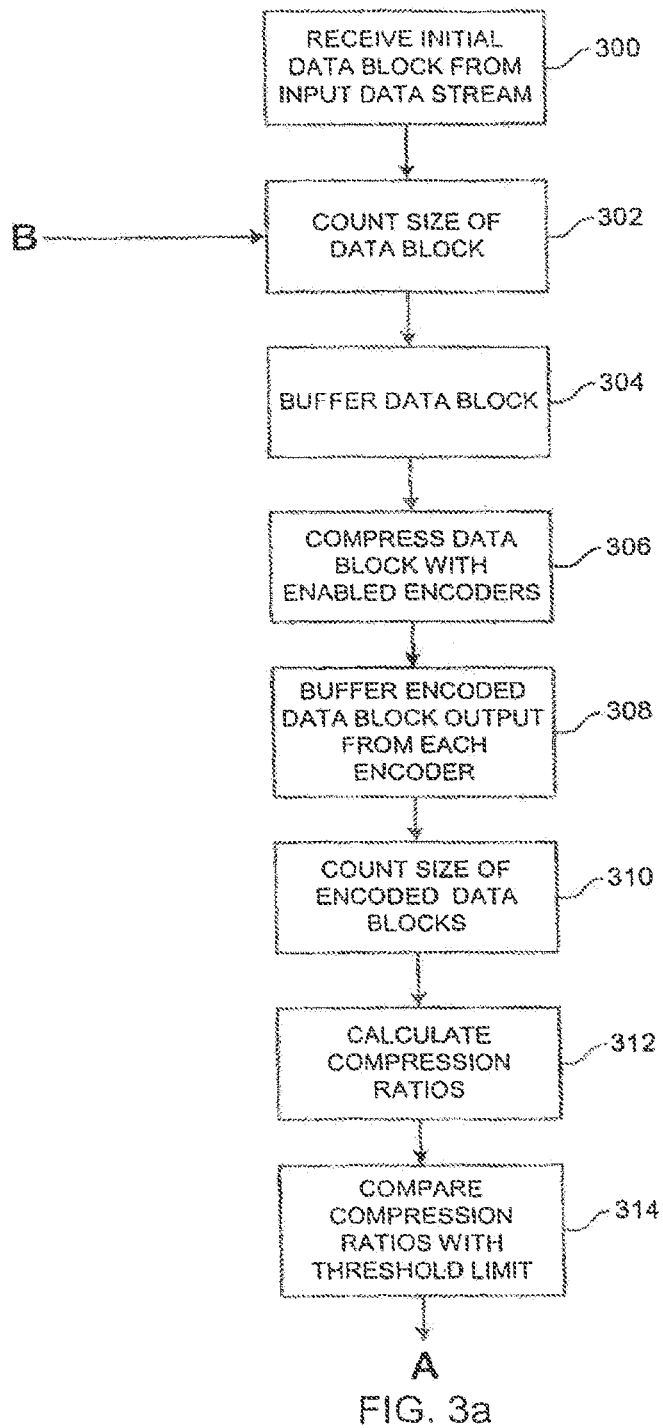
FIGS. 3a and 3b comprise a flow diagram of a data compression method according to one aspect of the present invention, which illustrates the operation of the data compression system of FIG. 2.
Figure 3B:
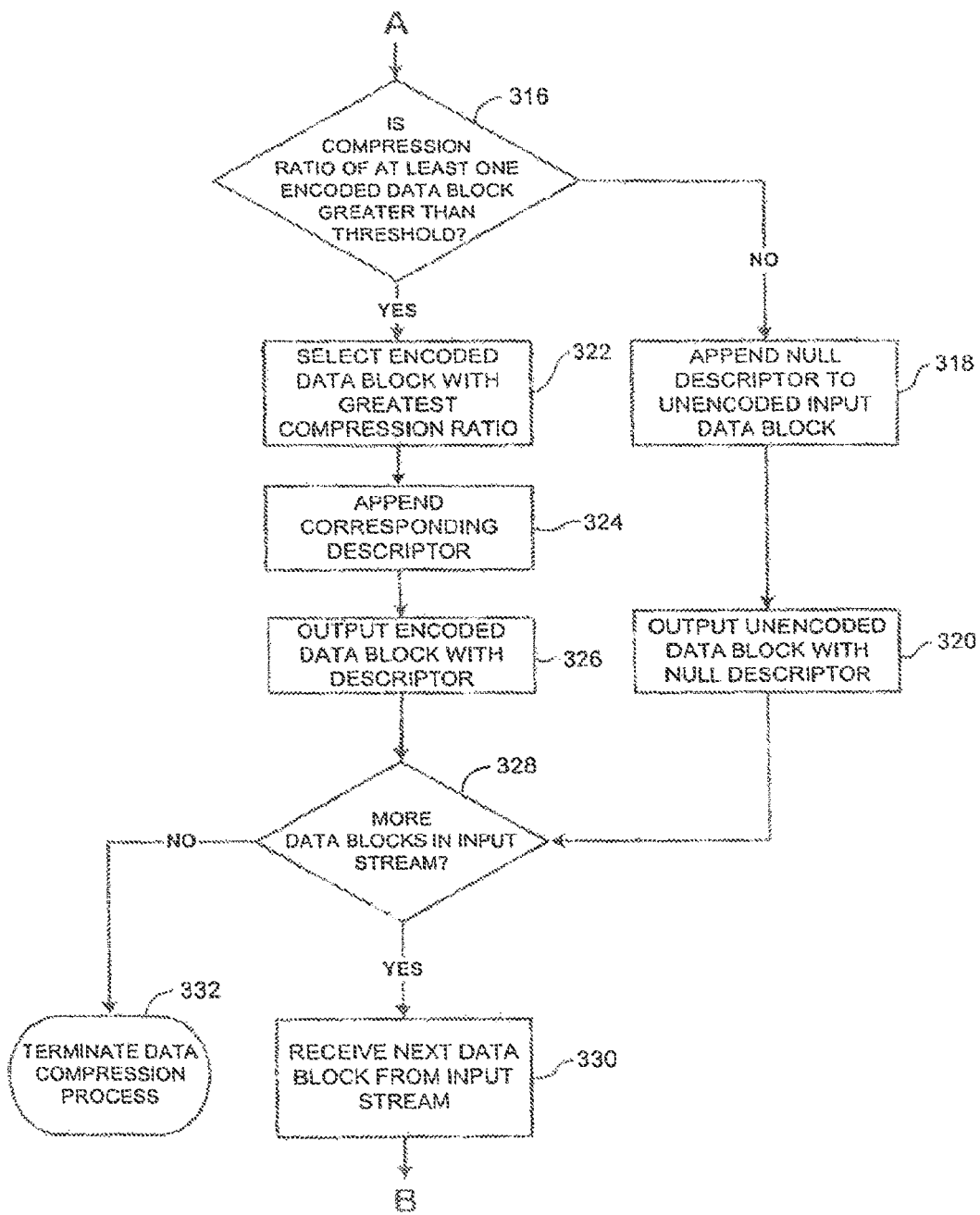

The operation of the data compression system of FIG. 2 will now be discussed in is further detail with reference to the flow diagram of FIGS. 3a and 3b. A data stream comprising one or more data blocks is input into the data compression system and the first data block in the stream is received (step 300). As stated above, data compression is performed on a per data block basis. Accordingly, the first input data block in the input data stream is input into the counter module 10 that counts the size of the data block (step 302). The data block is then stored in the buffer 20 (step 304). The data block is then sent to the encoder module 30 and compressed by each (enabled) encoder E1 . . . En (step 306). Upon completion of the encoding of the input data block, an encoded data block is output from each (enabled) encoder E1 . . . En and maintained in a corresponding buffer (step 308), and the encoded data block size is counted (step 310).

Next, a compression ratio is calculated for each encoded data block by taking the ratio of the size of the input data block (as determined by the input counter 10) to the size of each encoded data block output from the enabled encoders (step 312). Each compression ratio is then compared with an a priori-specified compression ratio threshold (step 314). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art.

After the compression ratios are compared with the threshold, a determination is s made as to whether the compression ratio of at least one of the encoded data blocks exceeds the threshold limit (step 316). If there are no encoded data blocks having a compression ratio that exceeds the compression ratio threshold limit (negative determination in step 316), then the original unencoded input data block is selected for output and a null data compression type descriptor is appended thereto (step 318). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 320).

On the other hand, if one or more of the encoded data blocks possess a compression ratio greater than the compression ratio threshold limit (affirmative result in step 316), then the encoded data block having the greatest compression ratio is selected (step 322). An appropriate data compression type descriptor is then appended (step 324). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 326).

After the encoded data block or the unencoded data input data block is output (steps 326 and 320), a determination is made as to whether the input data stream contains additional data blocks to be processed (step 328). If the input data stream includes additional data blocks (affirmative result in step 328), the next successive data block is received (step 330), its block size is counted (return to step 302) and the data compression process in repeated. This process is iterated for each data block in the input data stream. Once the final input data block is processed (negative result in step 328), data compression of the input data stream is finished (step 322).

Since a multitude of data types may be present within a given input data block, it is often difficult and/or impractical to predict the level of compression that will be achieved by a specific encoder. Consequently, by processing the input data blocks with a plurality of encoding techniques and comparing the compression results, content free data compression is advantageously achieved. It is to be appreciated that this approach is scalable through future generations of processors, dedicated hardware, and software. As processing capacity increases and costs reduce, the benefits provided by the present invention will continue to increase. It should again be noted that the present invention may employ any lossless data encoding technique.

Figure 4:
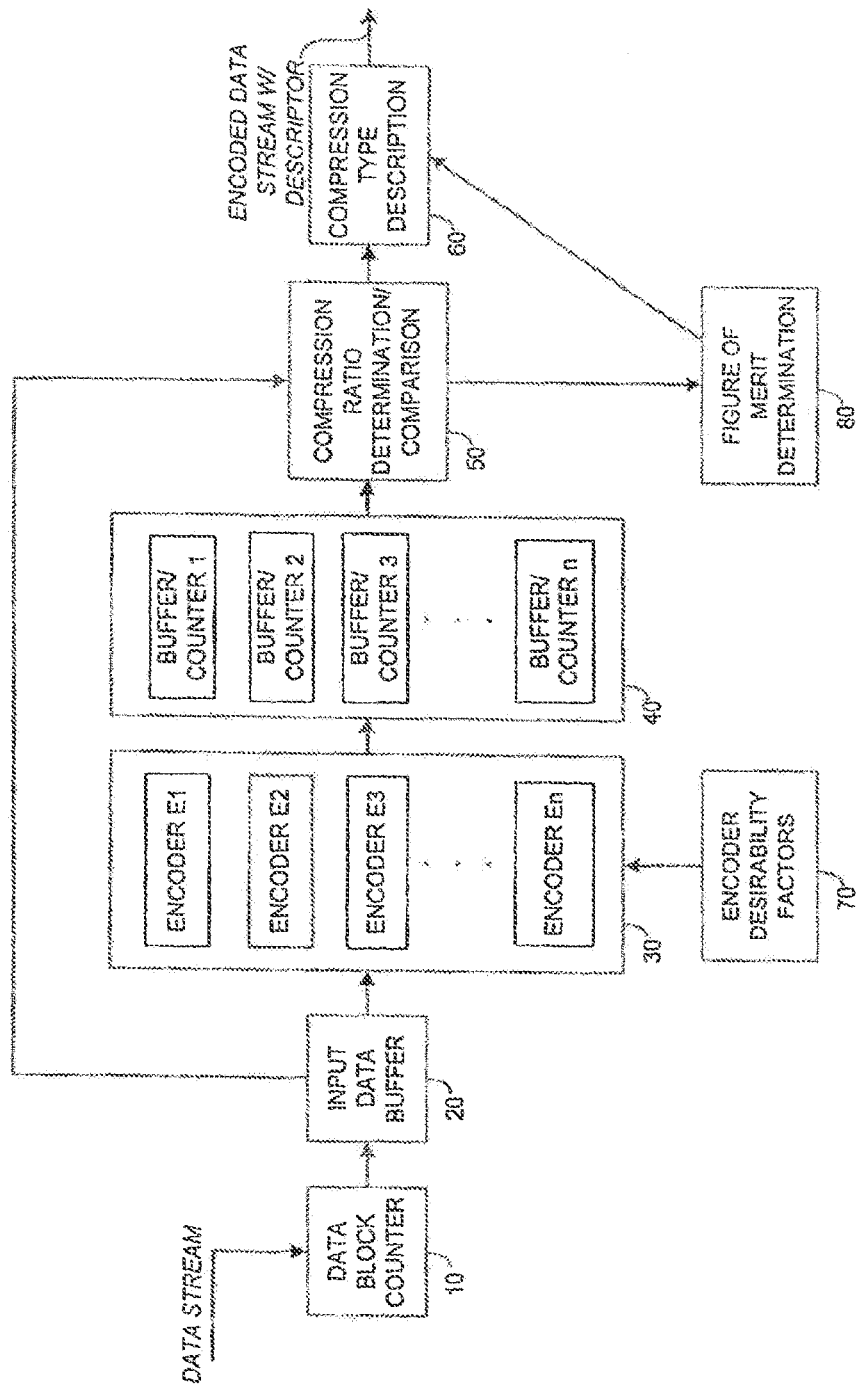
FIG. 4 is a block diagram of a content independent data compression system according to another embodiment of the present invention having an enhanced metric for selecting an optimal encoding technique.

Referring now to FIG. 4, a block diagram illustrates a content independent data compression system according to another embodiment of the present invention. The data compression system depicted in FIG. 4 is similar to the data compression system of FIG. 2 except that the embodiment of FIG. 4 includes an enhanced metric functionality for selecting an optimal encoding technique. In particular, each of the encoders E1 . . . En in the encoder module 30 is tagged with a corresponding one of user-selected encoder desirability factors 70. Encoder desirability is defined as an a priori user specified factor that takes into account any number of user considerations including, but not limited to, compatibility of the encoded data with existing standards, data error robustness, or any other aggregation of factors that the user wishes to consider for a particular application. Each encoded data block output from the encoder module 30 has a corresponding desirability factor appended thereto. A figure of merit module 80, operatively coupled to the compression ratio module 50 and the descriptor module 60, is provided for calculating a figure of merit for each of the encoded data blocks which possess a compression ratio greater than the compression ratio threshold limit. The figure of merit for each encoded data block is comprised of a weighted average of the a priori user specified threshold and the corresponding encoder desirability factor. As discussed below in further detail with reference to FIGS. 5*a* and 5*b*, the figure of merit substitutes the a priori user compression threshold limit for selecting and outputting encoded data blocks.

Figure 5A:
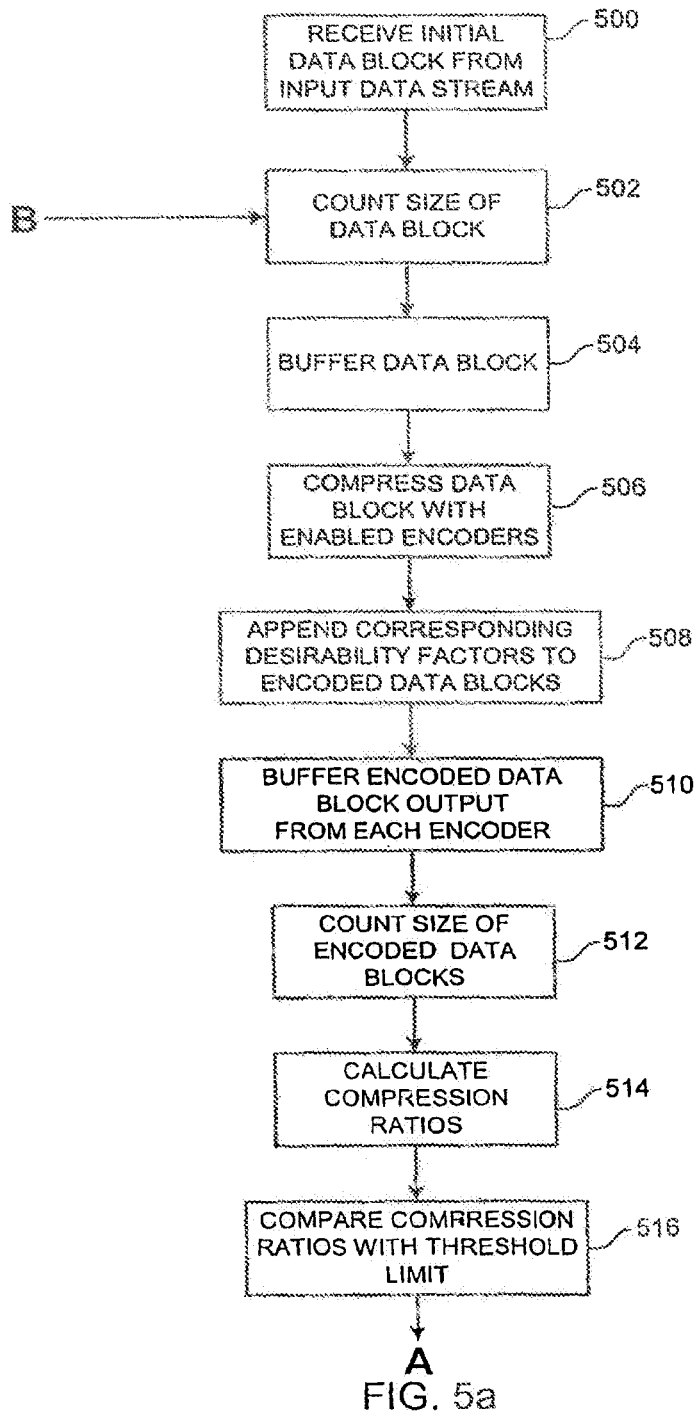
FIGS. 5a and 5b comprise a flow diagram of a data compression method according to another aspect of the present invention, which illustrates the operation of the data compression system of FIG. 4.
Figure 5B:
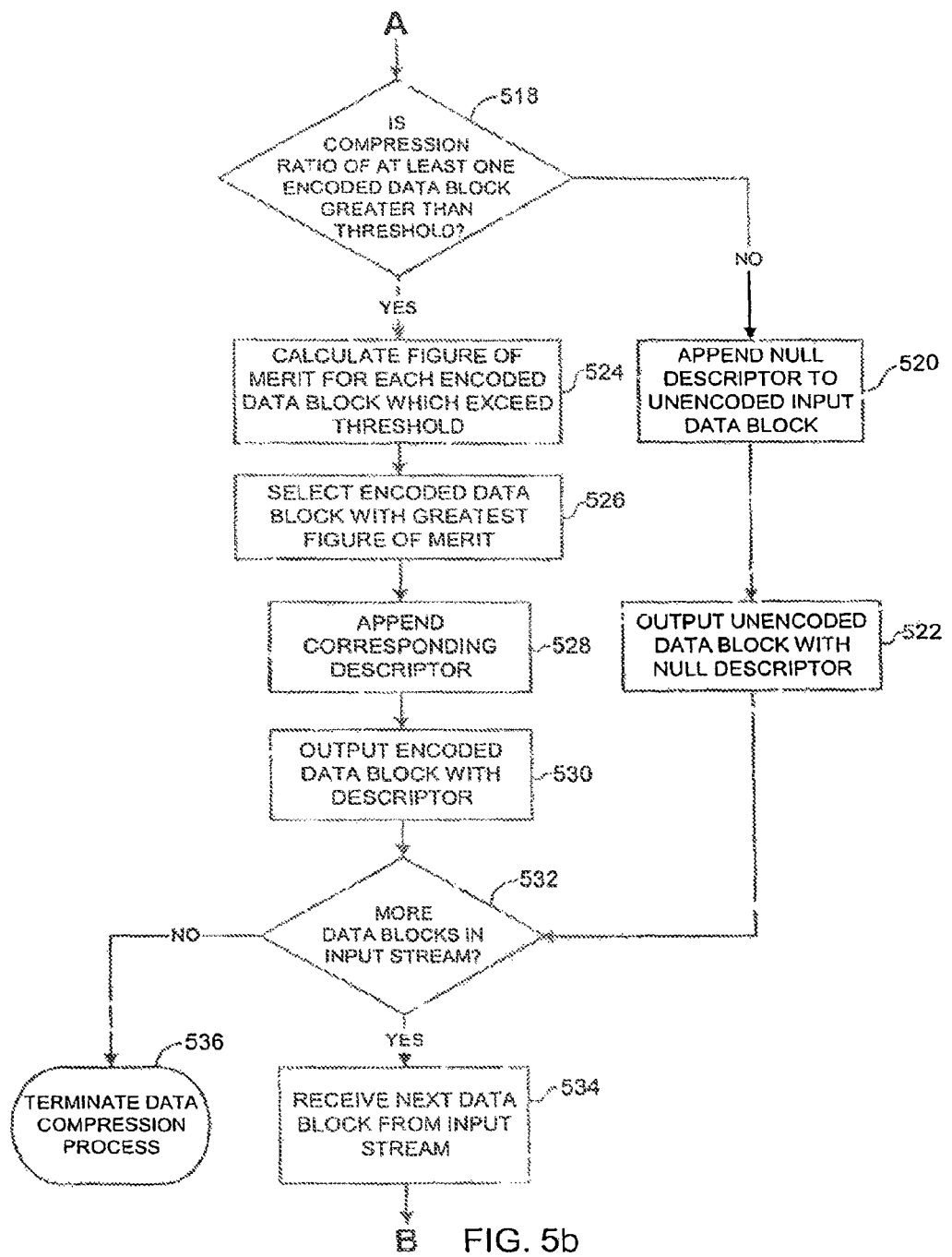

The operation of the data compression system of FIG. 4 will now be discussed in further detail with reference to the flow diagram of FIGS. 5*a* and 5*b*. A data stream comprising one or more data blocks is input into the data compression system and the first data block in the stream is received (step 500). The size of the first data block is then determined by the counter module 10 (step 502). The data block is then stored in the buffer 20 (step 504). The data block is then sent to the encoder module 30 and compressed by each (enabled) encoder in the encoder set E1 . . . En (step 506). Each encoded data block processed in the encoder module 30 is tagged with an encoder desirability factor that corresponds the particular encoding technique applied to the encoded data block (step 508). Upon completion of the encoding of the input data block, an encoded data block with its corresponding desirability factor is output from each (enabled) encoder E1 . . . En and maintained in a corresponding buffer (step 510), and the encoded data block size is counted (step 512).

Next, a compression ratio obtained by each enabled encoder is calculated by taking the ratio of the size of the input data block (as determined by the input counter 10) to the size of the encoded data block output from each enabled encoder (step 514). Each compression ratio is then compared with an a priori-specified compression ratio threshold (step 516). A determination is made as to whether the compression ratio of at least one of the encoded data blocks exceeds the threshold limit (step 518). If there are no encoded data blocks having a compression ratio that exceeds the compression ratio threshold limit (negative determination in step 518), then the original unencoded input data block is selected for output and a null data compression type descriptor (as discussed above) is appended thereto (step 520). Accordingly, the original unencoded input data block with its corresponding null data compression type descriptor is then output for subsequent data processing, storage, or transmittal (step 522).

On the other hand, if one or more of the encoded data blocks possess a compression ratio greater than the compression ratio threshold limit (affirmative result in step 518), then a figure of merit is calculated for each encoded data block having a compression ratio which exceeds the compression ratio threshold limit (step 524). Again, the figure of merit for a given encoded data block is comprised of a weighted average of the a priori user specified threshold and the corresponding encoder desirability factor associated with the encoded data block. Next, the encoded data block having the greatest figure of merit is selected for output (step 526). An appropriate data compression type descriptor is then appended (step 528) to indicate the data encoding technique applied to the encoded data block. The encoded data block (which has the greatest figure of merit) along with its corresponding data compression type descriptor is then output for subsequent data processing, storage, or transmittal (step 530).

After the encoded data block or the unencoded input data block is output (steps 530 and 522), a determination is made as to whether the input data stream contains additional data blocks to be processed (step 532). If the input data stream includes additional data blocks (affirmative result in step 532), then the next successive data block is received (step 534), its block size is counted (return to step 502) and the data compression process is iterated for each successive data block in the input data stream. Once the final input data block is processed (negative result in step 532), data compression of the input data stream is finished (step 536).

Figure 6:
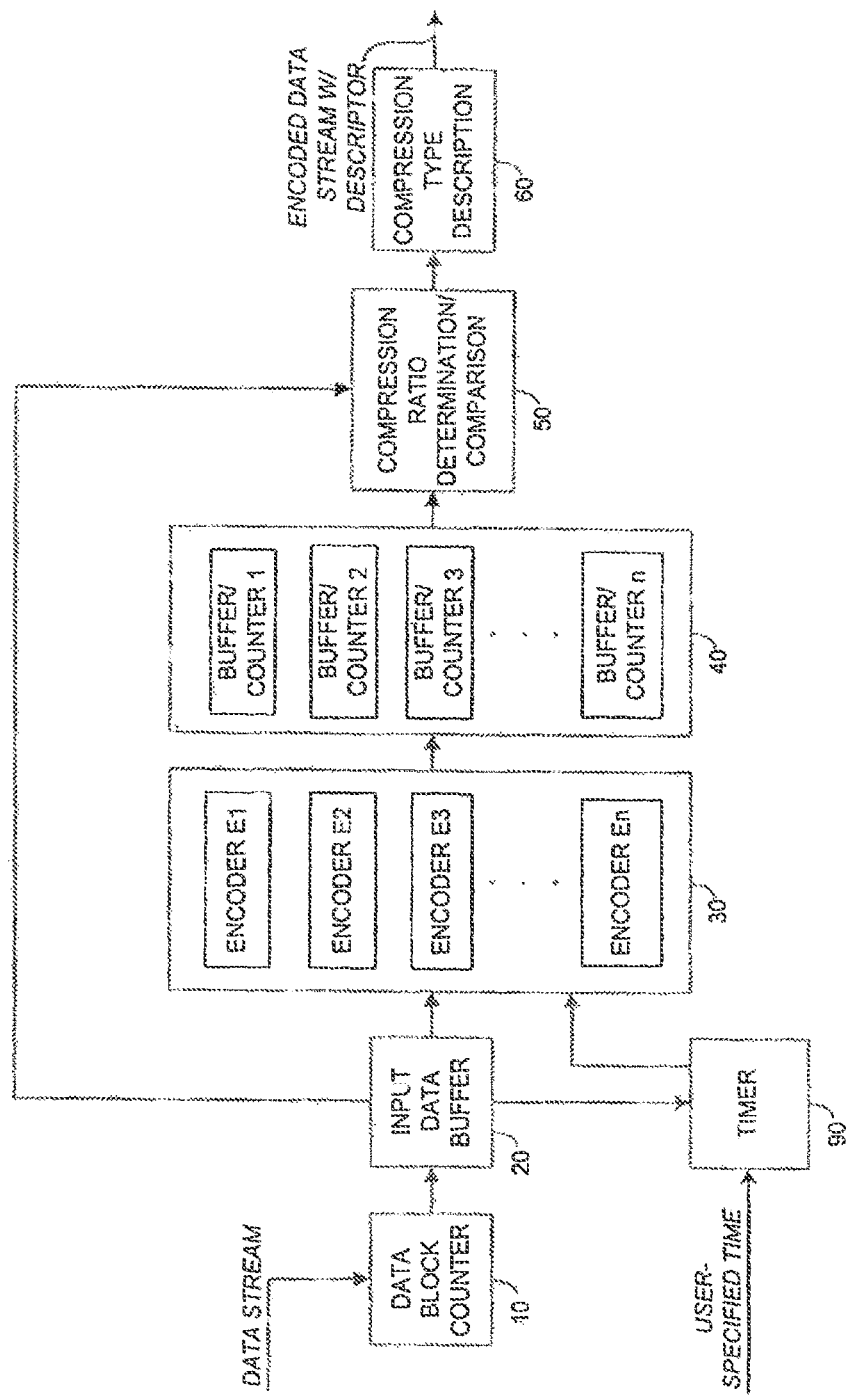
FIG. 6 is a block diagram of a content independent data compression system according to another embodiment of the present invention having an a priori specified timer that provides real-time or pseudo real-time of output data.

Referring now to FIG. 6, a block diagram illustrates a data compression system according to another embodiment of the present invention. The data compression system depicted in FIG. 6 is similar to the data compression system discussed in detail above with reference to FIG. 2 except that the embodiment of FIG. 6 includes an a priori specified timer that provides real-time or pseudo real-time output data. In particular, an interval timer 90, operatively coupled to the encoder module 30, is preloaded with a user specified time value. The role of the interval timer (as will be explained in greater detail below with reference to FIGS. 7*a* and 7*b*) is to limit the processing time for each input data block processed by the encoder module 30 so as to ensure that the real-time, pseudo real-time, or other time critical nature of the data compression processes is preserved.

Figure 7A:
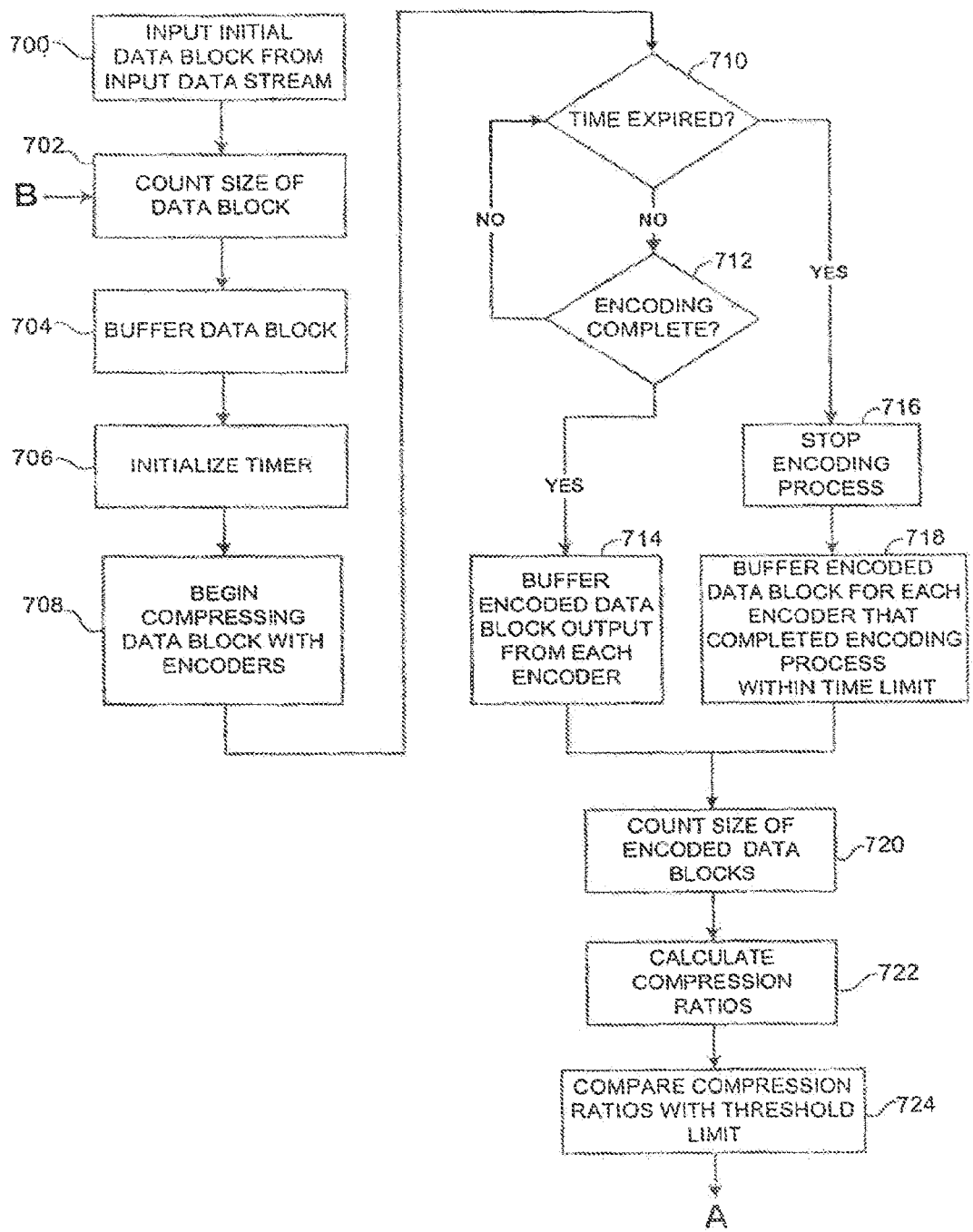
FIGS. 7a and 7b comprise a flow diagram of a data compression method according to another aspect of the present invention, which illustrates the operation of the data compression system of FIG. 6.
Figure 7B:
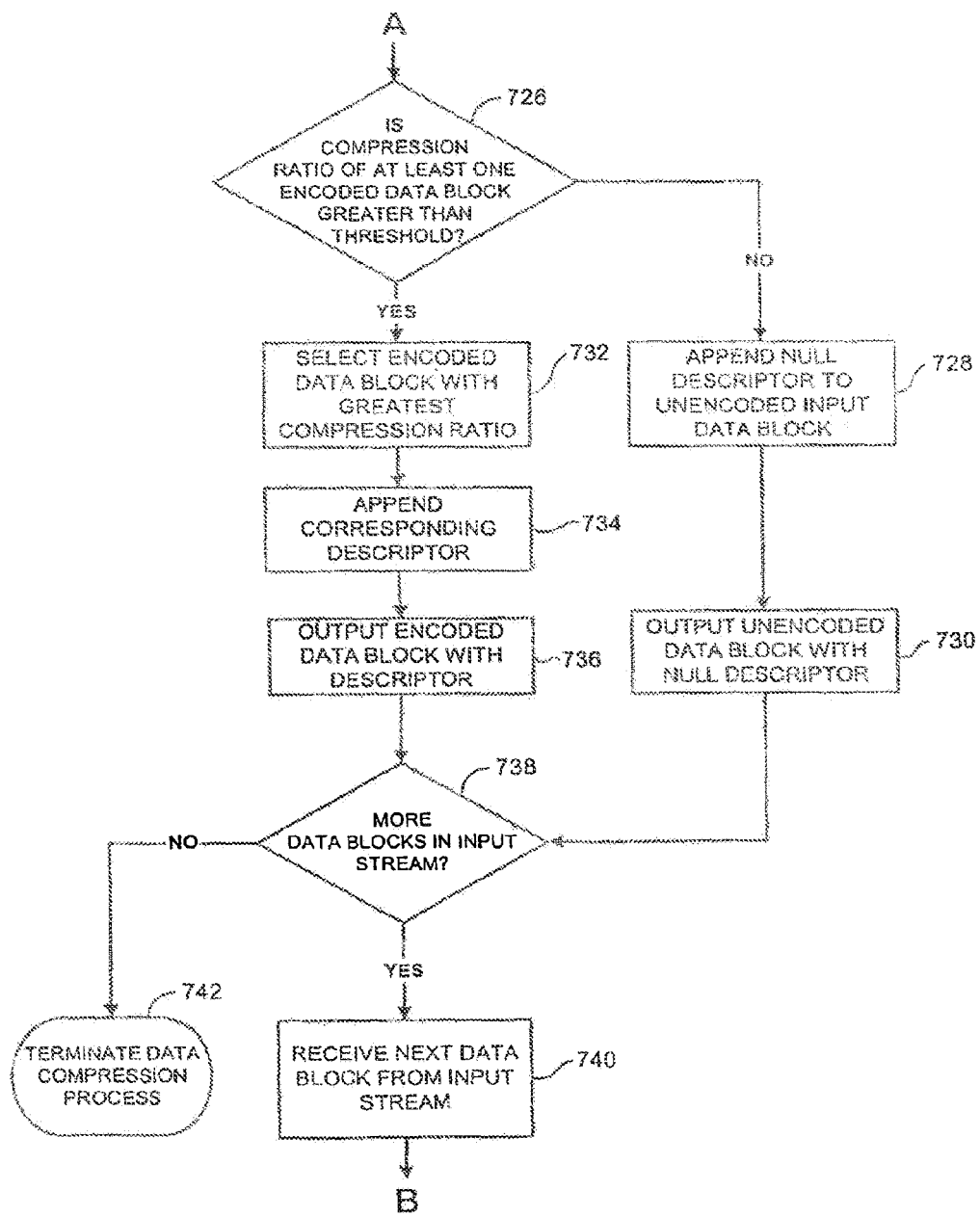

The operation of the data compression system of FIG. 6 will now be discussed in further detail with reference to the flow diagram of FIGS. 7a and 7b. A data stream comprising one or more data blocks is input into the data compression system and the first data block in the data stream is received (step 700), and its size is determined by the counter module 10 (step 702). The data block is then stored in buffer 20 (step 704).

Next, concurrent with the completion of the receipt and counting of the first data block, the interval timer 90 is initialized (step 706) and starts counting towards a user-specified time limit. The input data block is then sent to the encoder module 30 wherein data compression of the data block by each (enabled) encoder E1 . . . En commences (step 708). Next, a determination is made as to whether the user specified time expires before the completion of the encoding process (steps 710 and 712). If the encoding process is completed before or at the expiration of the timer, i.e., each encoder (E1 through En) completes its respective encoding process (negative result in step 710 and affirmative result in step 712), then an encoded data block is output from each (enabled) encoder E1 . . . En and maintained in a corresponding buffer (step 714).

On the other hand, if the timer expires (affirmative result in 710), the encoding process is halted (step 716). Then, encoded data blocks from only those enabled encoders E1 . . . En that have completed the encoding process are selected and maintained in buffers (step 718). It is to be appreciated that it is not necessary (or in some cases desirable) that some or all of the encoders complete the encoding process before the interval timer expires. Specifically, due to encoder data dependency and natural variation, it is possible that certain encoders may not operate quickly enough and, therefore, do not comply with the timing constraints of the end use. Accordingly, the time limit ensures that the real-time or pseudo real-time nature of the data encoding is preserved.

After the encoded data blocks are buffered (step 714 or 718), the size of each encoded data block is counted (step 720). Next, a compression ratio is calculated for each encoded data block by taking the ratio of the size of the input data block (as determined by the input counter 10) to the size of the encoded data block output from each enabled encoder (step 722). Each compression ratio is then compared with an a priori-specified compression ratio threshold (step 724). A determination is made as to whether the compression ratio of at least one of the encoded data blocks exceeds the threshold limit (step 726). If there are no encoded data blocks having a compression ratio that exceeds the compression ratio threshold limit (negative determination in step 726), then the original unencoded input data block is selected for output and a null data compression type descriptor is appended thereto (step 728). The original unencoded input data block with its corresponding null data compression type descriptor is then output for subsequent data processing, storage, or transmittal (step 730).

On the other hand, if one or more of the encoded data blocks possess a compression ratio greater than the compression ratio threshold limit (affirmative result in step 726), then the encoded data block having the greatest compression ratio is selected (step 732). An appropriate data compression type descriptor is then appended (step 734). The encoded data block having the greatest compression ratio along with its corresponding data compression type descriptor is then output for subsequent data processing, storage, or transmittal (step 736).

After the encoded data block or the unencoded input data block is output (steps 730 or 736), a determination is made as to whether the input data stream contains additional data blocks to be processed (step 738). If the input data stream includes additional data blocks (affirmative result in step 738), the next successive data block is received (step 740), its block size is counted (return to step 702) and the data compression process in repeated. This process is iterated for each data block in the input data stream, with each data block being processed within the user-specified time limit as discussed above. Once the final input data block is processed (negative result in step 738), data compression of the input data stream is complete (step 742).

Figure 8:
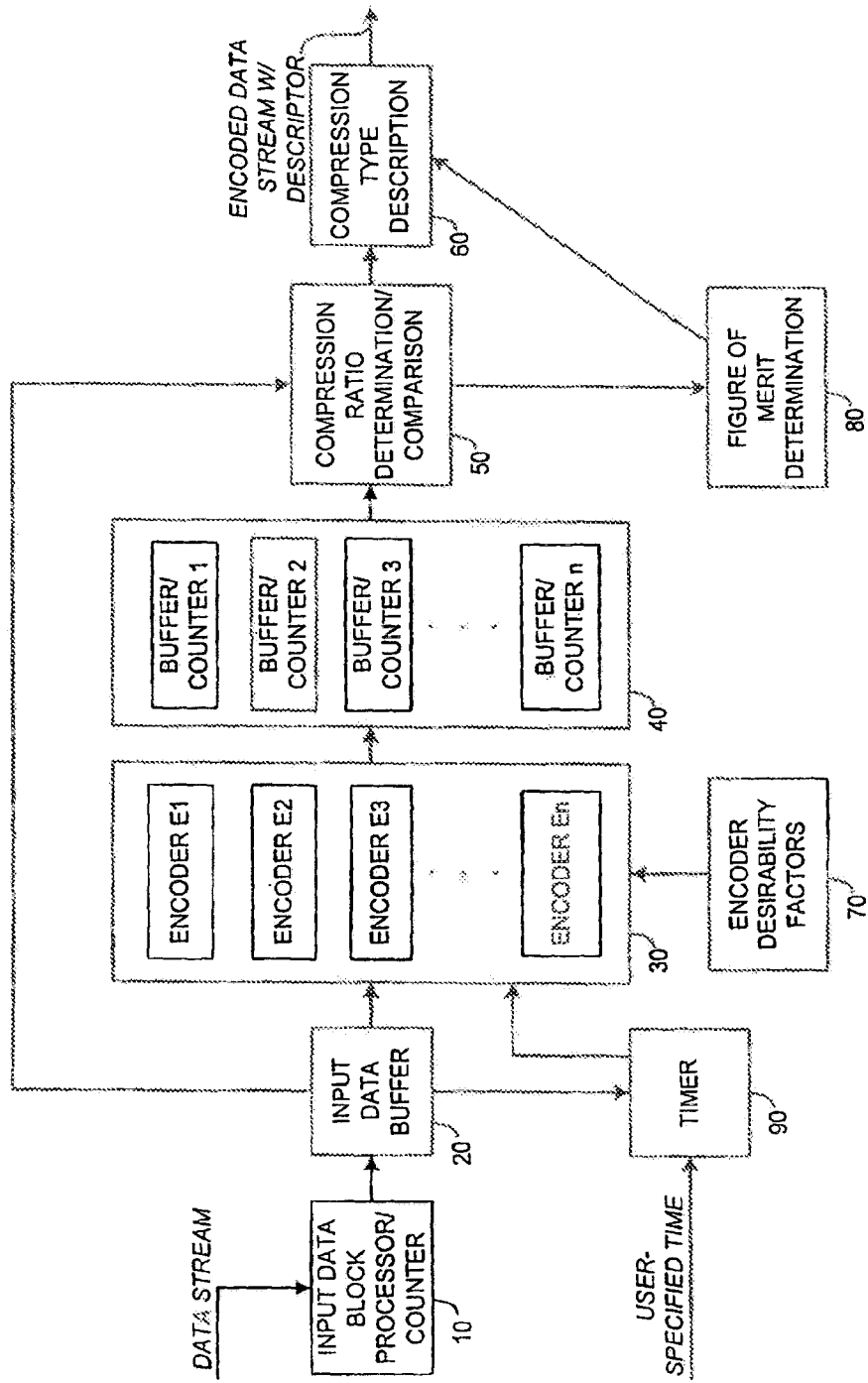
FIG. 8 is a block diagram of a content independent data compression system according to another embodiment having an a priori specified timer that provides real-time or pseudo real-time of output data and an enhanced metric for selecting an optimal encoding technique.

Referring now to FIG. 8, a block diagram illustrates a content independent data compression system according to another embodiment of the present system. The data compression system of FIG. 8 incorporates all of the features discussed above in connection with the system embodiments of FIGS. 2, 4, and 6. For example, the system of FIG. 8 incorporates both the a priori specified timer for providing real-time or pseudo real-time of output data, as well as the enhanced metric for selecting an optimal encoding technique. Based on the foregoing discussion, the operation of the system of FIG. 8 is understood by those skilled in the art.

Figure 9:
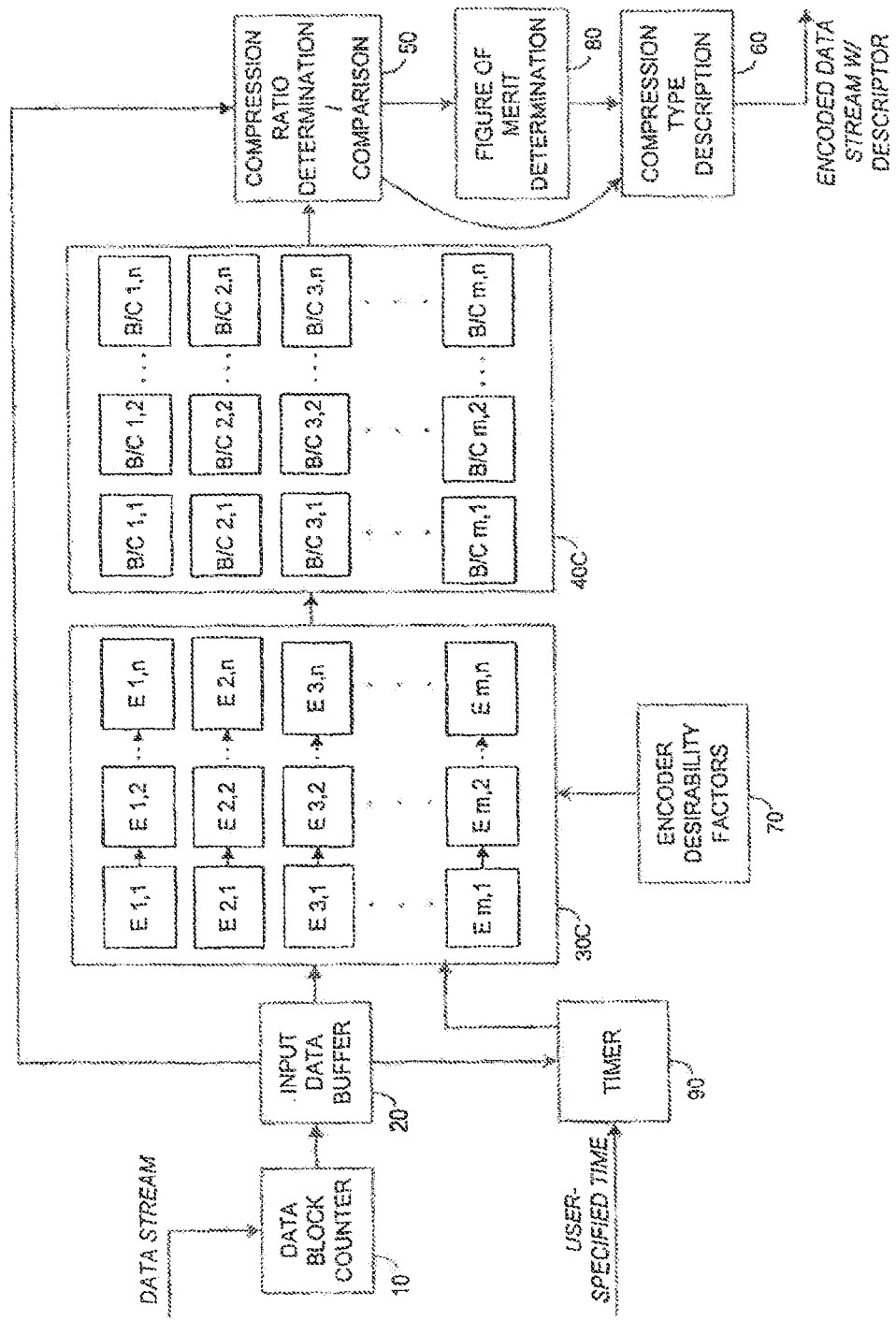
FIG. 9 is a block diagram of a content independent data compression system according to another embodiment of the present invention having an encoding architecture comprising a plurality of sets of serially cascaded encoders.

Referring now to FIG. 9, a block diagram illustrates a data compression system according to a preferred embodiment of the present invention. The system of FIG. 9 contains many of the features of the previous embodiments discussed above. However, this embodiment advantageously includes a cascaded encoder module 30c having an encoding architecture comprising a plurality of sets of serially cascaded encoders Em,n, where "m" refers to the encoding path (i.e., the encoder set) and where "n" refers to the number of encoders in the respective path. It is to be understood that each set of serially cascaded encoders can include any number of disparate and/or similar encoders (i.e., n can be any value for a given path m).

The system of FIG. 9 also includes a output buffer module 40c which comprises a plurality of buffer/counters B/Cm,n, each associated with a corresponding one of the encoders Em,n. In this embodiment, an input data block is sequentially applied to successive encoders (encoder stages) in the encoder path so as to increase the data compression ratio. For example, the output data block from a first encoder E1,1, is buffered and counted in B/C1,1, for subsequent processing by a second encoder E1,2. Advantageously, these parallel sets of sequential encoders are applied to the input data stream to effect content free lossless data compression. This embodiment provides for multi-stage sequential encoding of data with the maximum number of encoding steps subject to the available real-time, pseudo real-time, or other timing constraints.

As with each previously discussed embodiment, the encoders Em,n may include those lossless encoding techniques currently well known within the art, including: run length, Huffman, Lempel-Ziv Dictionary Compression, arithmetic coding, data compaction, and data null suppression. Encoding techniques are selected based upon their ability to effectively encode different types of input data. A full complement of encoders provides for broad coverage of existing and future data types. The input data blocks may be applied simultaneously to the encoder paths (i.e., the encoder paths may operate in parallel, utilizing task multiplexing on a single central processor, or via dedicated hardware, or by executing on a plurality of processor or dedicated hardware systems, or any combination thereof). In addition, an input data block may be sequentially applied to the encoder paths. Moreover, each serially cascaded encoder path may comprise a fixed (predetermined) sequence of encoders or a random sequence of encoders. Advantageously, by simultaneously or sequentially processing input data blocks via a plurality of sets of serially cascaded encoders, content free data compression is achieved.

Figure 10A:
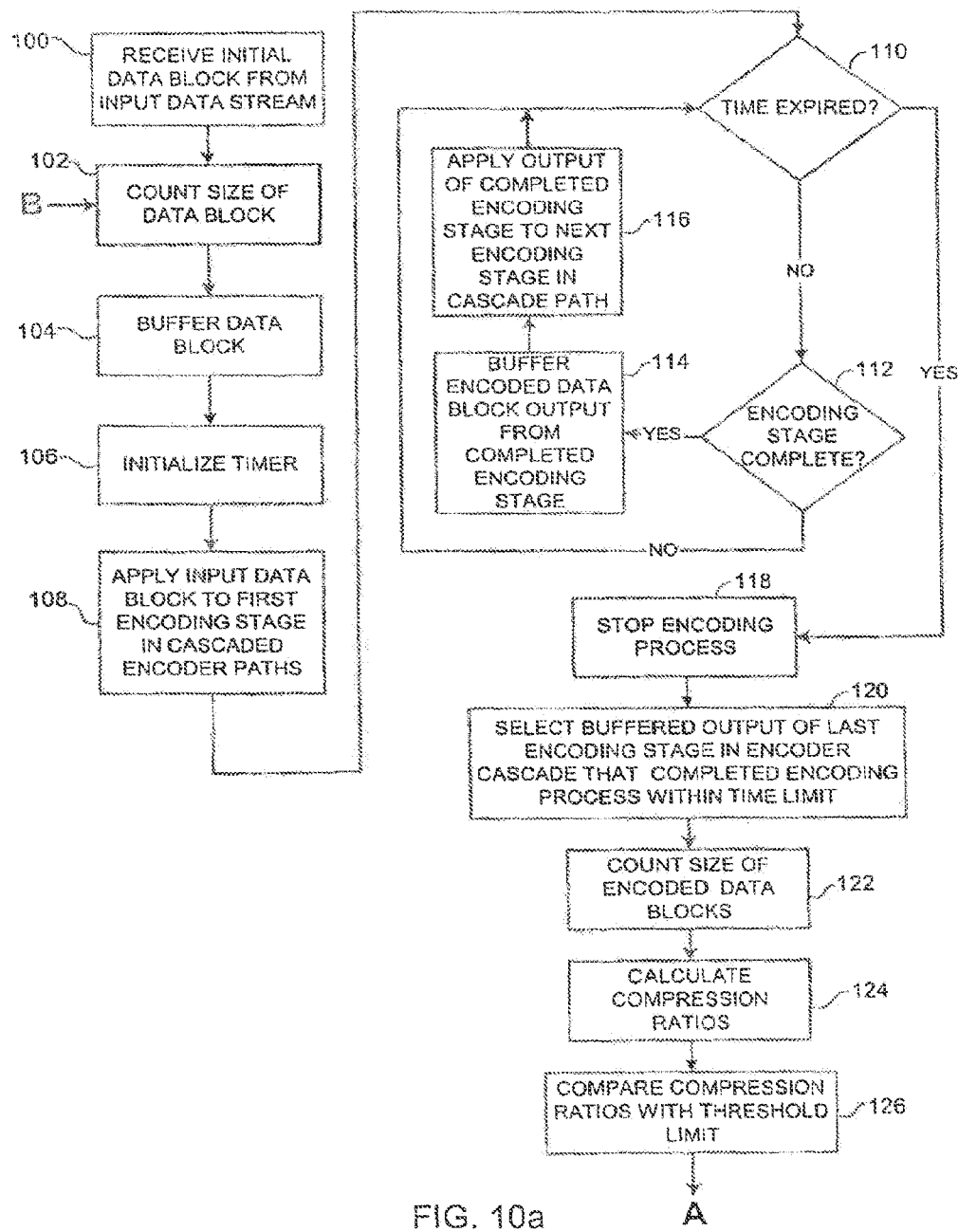
FIGS. 10a and 10b comprise a flow diagram of a data compression method according to another aspect of the present invention, which illustrates the operation of the data compression system of FIG. 9.
Figure 10B:
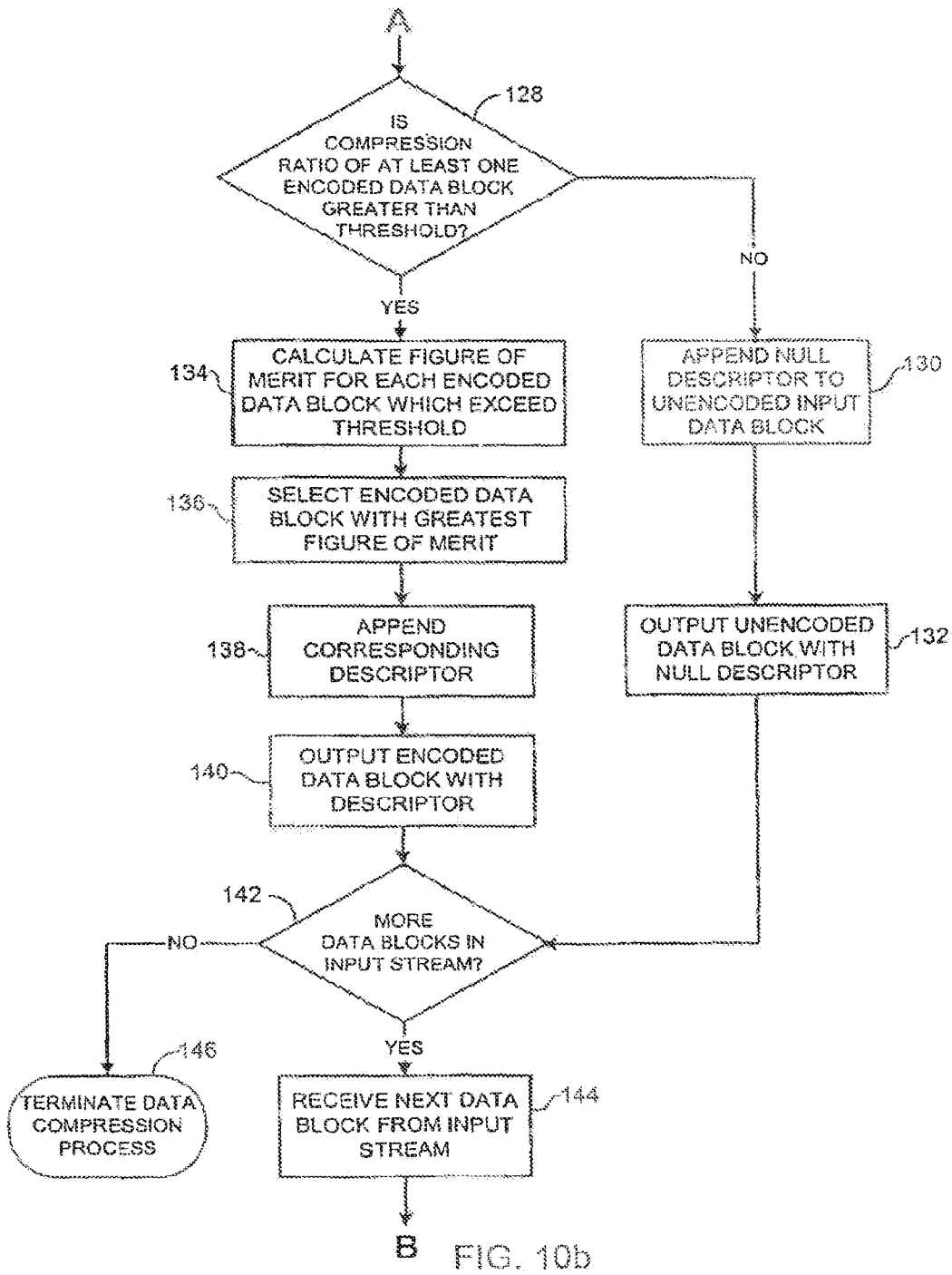

The operation of the data compression system of FIG. 9 will now be discussed in further detail with reference to the flow diagram of FIGS. 10a and 10b. A data stream comprising one or more data blocks is input into the data compression system and the first data block in the data stream is received (step 100), and its size is determined by the counter module 10 (step 102). The data block is then stored in buffer 20 (step 104).

Next, concurrent with the completion of the receipt and counting of the first data block, the interval timer 90 is initialized (step 106) and starts counting towards a user-specified time limit. The input data block is then sent to the cascade encoder module 30C wherein the input data block is applied to the first encoder (i.e., first encoding stage) in each of the cascaded encoder paths E1,1 . . . Em,1 (step 108). Next, a determination is made as to whether the user specified time expires before the completion of the first stage encoding process (steps 110 and 112). If the first stage encoding process is completed before the expiration of the timer, i.e., each encoder (E1,1 . . . Em,1) completes its respective encoding process (negative result in step 110 and affirmative result in step 112), then an encoded data block is output from each encoder E1,1 . . . Em,1 and maintained in a corresponding buffer (step 114). Then for each cascade encoder path, the output of the completed encoding stage is applied to the next successive encoding stage in the cascade path (step 116). This process (steps 110, 112, 114, and 116) is repeated until the earlier of the timer expiration (affirmative result in step 110) or the completion of encoding by each encoder stage in the serially cascaded paths, at which time the encoding process is halted (step 118).

Then, for each cascade encoder path, the buffered encoded data block output by the last encoder stage that completes the encoding process before the expiration of the timer is selected for further processing (step 120). Advantageously, the interim stages of the multi-stage data encoding process are preserved. For example, the results of encoder E1,1 are preserved even after encoder E1,2 begins encoding the output of encoder E1,1. If the interval timer expires after encoder E1,1 completes its respective encoding process but before encoder E1,2 completes its respective encoding process, the encoded data block from encoder E1,1 is complete and is utilized for calculating the compression ratio for the corresponding encoder path. The incomplete encoded data block from encoder E1,2 is either discarded or ignored.

It is to be appreciated that it is not necessary (or in some cases desirable) that some or all of the encoders in the cascade encoder paths complete the encoding process before the interval timer expires. Specifically, due to encoder data dependency, natural variation and the sequential application of the cascaded encoders, it is possible that certain encoders may not operate quickly enough and therefore do not comply with the timing constraints of the end use. Accordingly, the time limit, ensures that the real-time or pseudo real-time nature of the data encoding is preserved.

After the encoded data blocks are selected (step 120), the size of each encoded data block is counted (step 122). Next, a compression ratio is calculated for each encoded data block by taking the ratio of the size of the input data block (as determined by the input counter 10) to the size of the encoded data block output from each encoder (step 124). Each compression ratio is then compared with an a priori-specified compression ratio threshold (step 126). A determination is made as to whether the compression ratio of at least one of the encoded data blocks exceeds the threshold limit (step 128). If there are no encoded data blocks having a compression ratio that exceeds the compression ratio threshold limit (negative determination in step 128), then the original unencoded input data block is selected for output and a null data compression type descriptor is appended thereto (step 130). The original unencoded data block and its corresponding null data compression type descriptor is then output for subsequent data processing, storage, or transmittal (step 132).

On the other hand, if one or more of the encoded data blocks possess a compression ratio greater than the compression ratio threshold limit (affirmative result in step 128), then a figure of merit is calculated for each encoded data block having a compression ratio which exceeds the compression ratio threshold limit (step 134). Again, the figure of merit for a given encoded data block is comprised of a weighted average of the a priori user specified threshold and the corresponding encoder desirability factor associated with the encoded data block. Next, the encoded data block having the greatest figure of merit is selected (step 136). An appropriate data compression type descriptor is then appended (step 138) to indicate the data encoding technique applied to the encoded data block. For instance, the data type compression descriptor can indicate that the encoded data block was processed by either a single encoding type, a plurality of sequential encoding types, and a plurality of random encoding types. The encoded data block (which has the greatest figure of merit) along with its corresponding data compression type descriptor is then output for subsequent data processing, storage, or transmittal (step 140).

After the unencoded data block or the encoded data input data block is output (steps 132 and 140), a determination is made as to whether the input data stream contains additional data blocks to be processed (step 142). If the input data stream includes additional data blocks (affirmative result in step 142), then the next successive data block is received (step 144), its block size is counted (return to step 102) and the data compression process is iterated for each successive data block in the input data stream. Once the final input data block is processed (negative result in step 142), data compression of the input data stream is finished (step 146).

Figure 11:
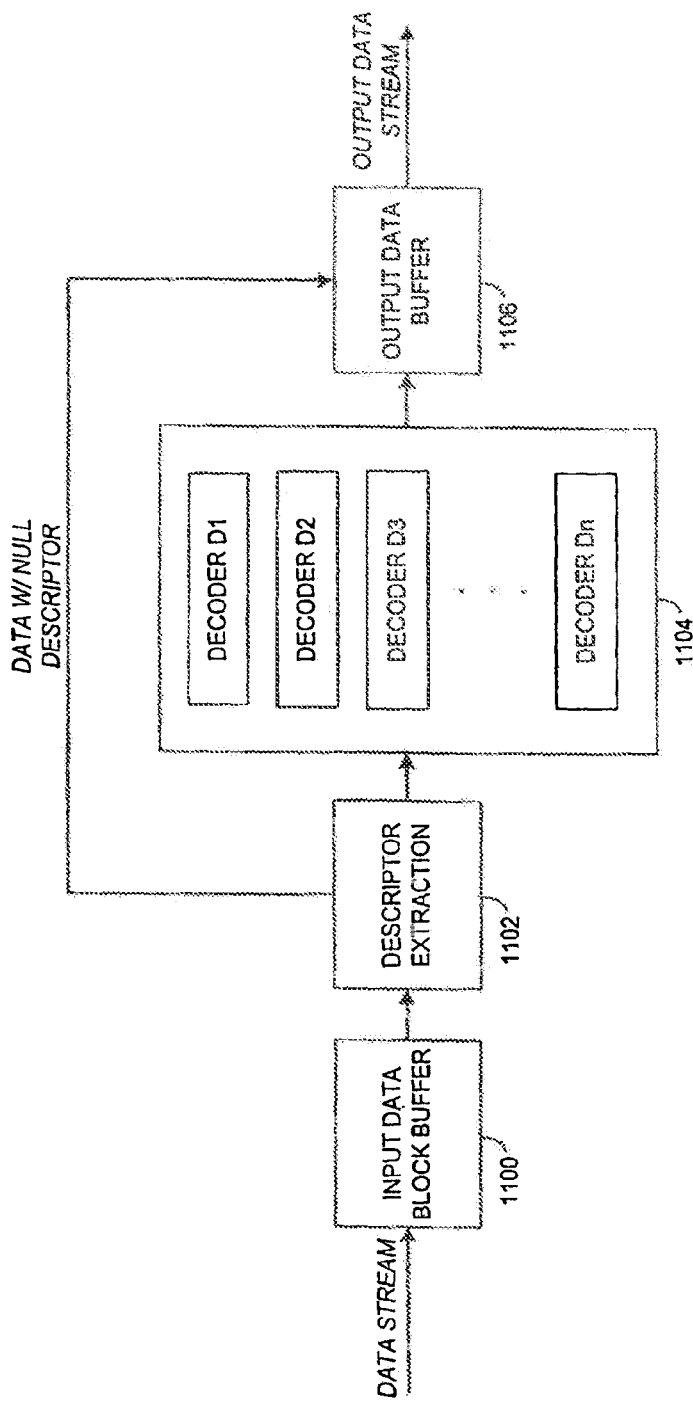
FIG. 11 is block diagram of a content independent data decompression system according to one embodiment of the present invention.

Referring now to FIG. 11, a block diagram illustrates a data decompression system according to one embodiment of the present invention. The data decompression system preferably includes an input buffer 1100 that receives as input an uncompressed or compressed data stream comprising one or more data blocks. The data blocks may range in size from individual bits through complete files or collections of multiple files. Additionally, the data block size may be fixed or variable. The input data buffer 1100 is preferably included (not required) to provide storage of input data for various hardware implementations. A descriptor extraction module 1102 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 1104 includes a plurality of decoders D1 . . . Dn for decoding the input data block using a decoder, set of decoders, or a sequential set of decoders corresponding to the extracted compression type descriptor. The decoders D1 . . . Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source. As with the data compression systems discussed above, the decoder module 1104 may include multiple decoders of the same type applied in parallel so as to reduce the data decoding time.

The data decompression system also includes an output data buffer 1106 for buffering the decoded data block output from the decoder module 1104.

Figure 12:
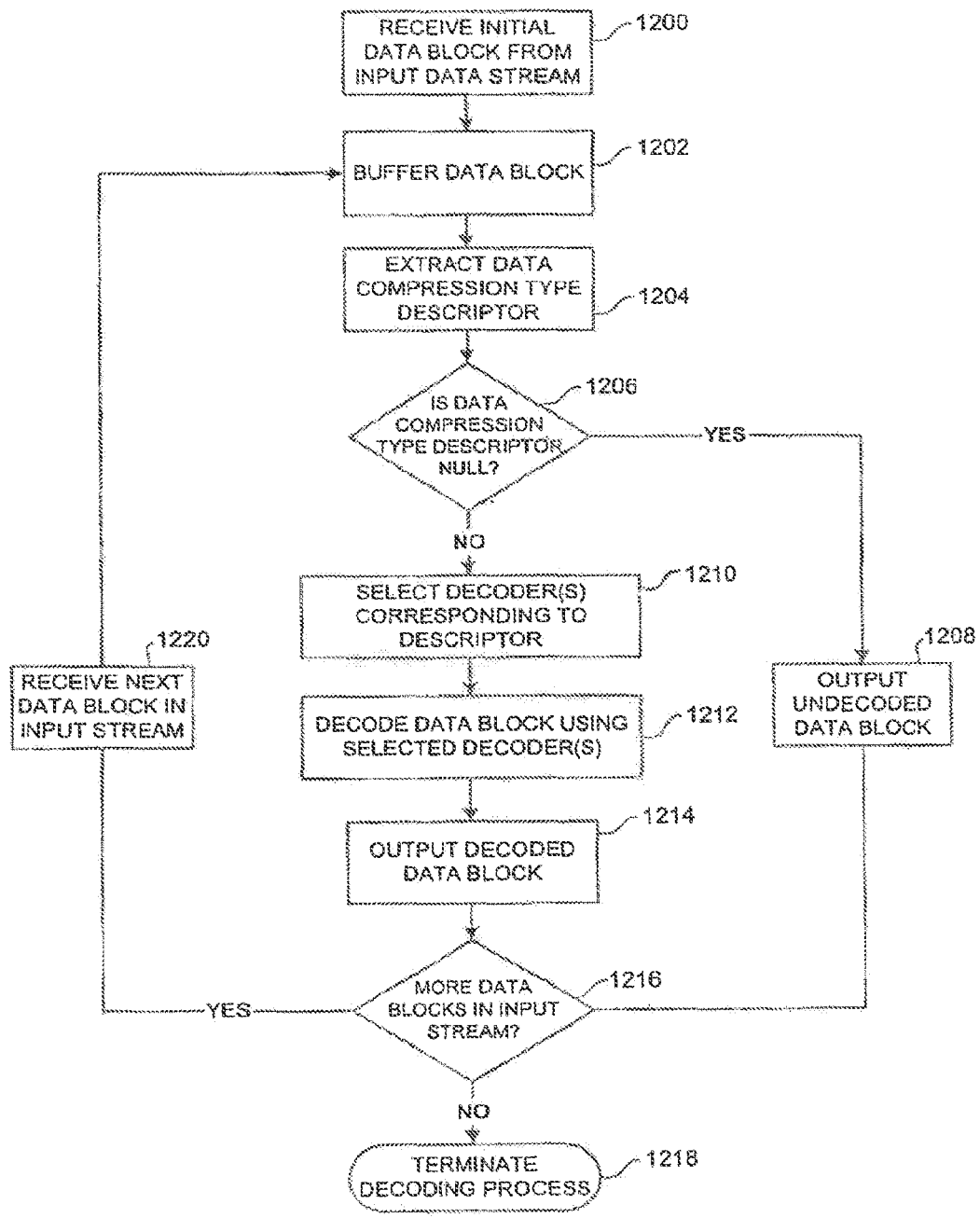
FIG. 12 is a flow diagram of a data decompression method according to one aspect of the present invention, which illustrates the operation of the data compression system of FIG. 11.

The operation of the data decompression system of FIG. 11 will be discussed in further detail with reference to the flow diagram of FIG. 12. A data stream comprising one or more data blocks of compressed or uncompressed data is input into the data decompression system and the first data block in the stream is received (step 1200) and maintained in the buffer (step 1202). As with the data compression systems discussed above, data decompression is performed on a per data block basis. The data compression type descriptor is then extracted from the input data block (step 1204). A determination is then made as to whether the data compression type descriptor is null (step 1206). If the data compression type descriptor is determined to be null (affirmative result in step 1206), then no decoding is applied to the input data block and the original undecoded data block is output (or maintained in the output buffer) (step 1208).

On the other hand, if the data compression type descriptor is determined to be any value other than null (negative result in step 1206), the corresponding decoder or decoders are then selected (step 1210) from the available set of decoders D1 . . . Dn in the decoding module 1104. It is to be understood that the data compression type descriptor may mandate the application of: a single specific decoder, an ordered sequence of specific decoders, a random order of specific decoders, a class or family of decoders, a mandatory or optional application of parallel decoders, or any combination or permutation thereof. The input data block is then decoded using the selected decoders (step 1212), and output (or maintained in the output buffer 1106) for subsequent data processing, storage, or transmittal (step 1214). A determination is then made as to whether the input data stream contains additional data blocks to be processed (step 1216). If the input data stream includes additional data blocks (affirmative result in step 1216), the next successive data block is received (step 1220), and buffered (return to step 1202). Thereafter, the data decompression process is iterated for each data block in the input data stream. Once the final input data block is processed (negative result in step 1216), data decompression of the input data stream is finished (step 1218).

Figure 13A:
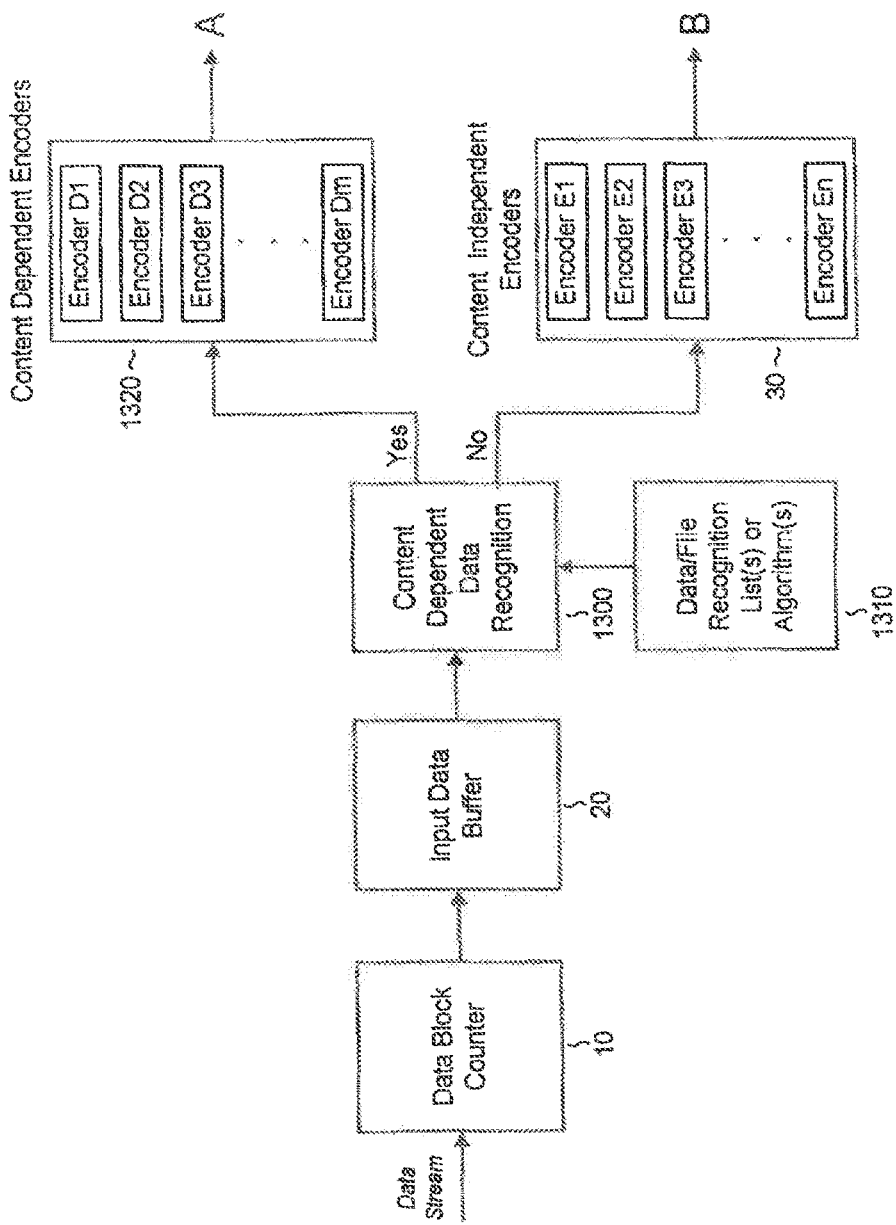
FIGS. 13a and 13b comprise a block diagram of a data compression system comprising content dependent and content independent data compression, according to an embodiment of the present invention.
Figure 13B:
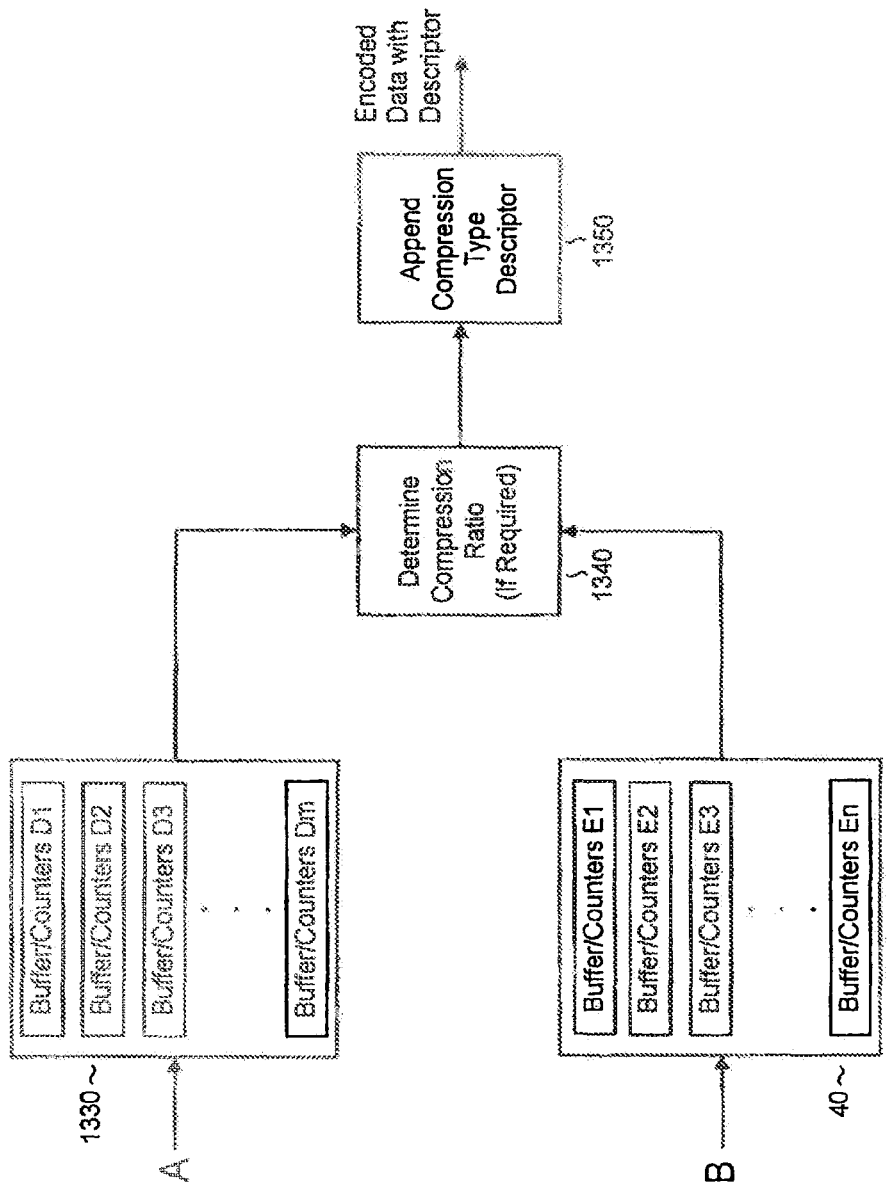
Figure 14A:
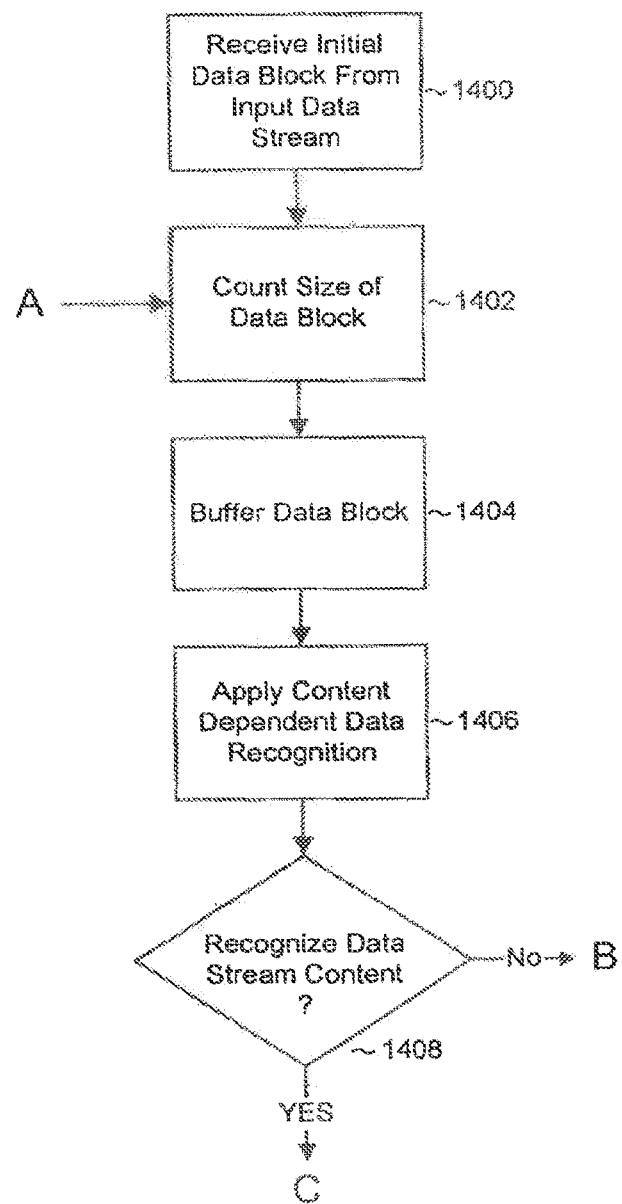
FIGS. 14a-14d comprise a flow diagram of a data compression method using both content dependent and content independent data compression, according to one aspect of the present invention.
Figure 14B:
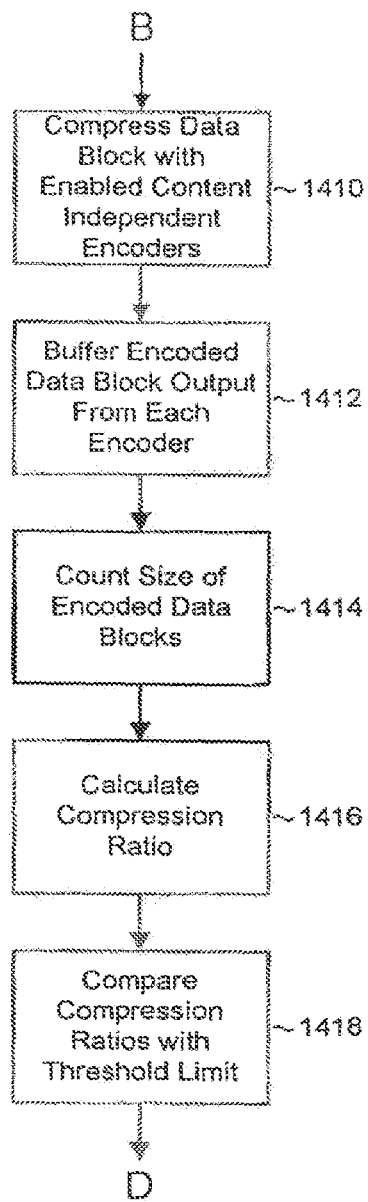
Figure 14C:
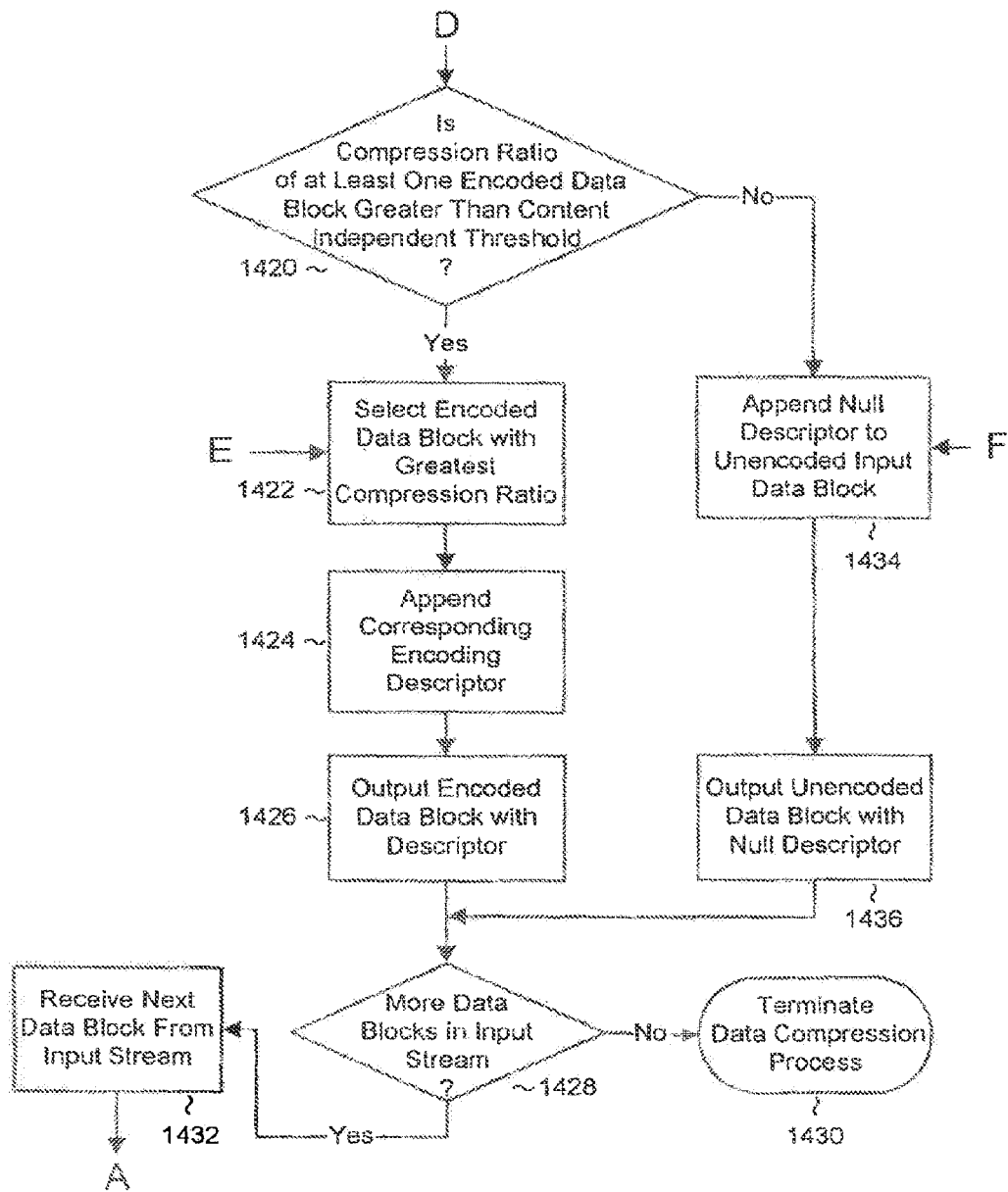
Figure 14D:
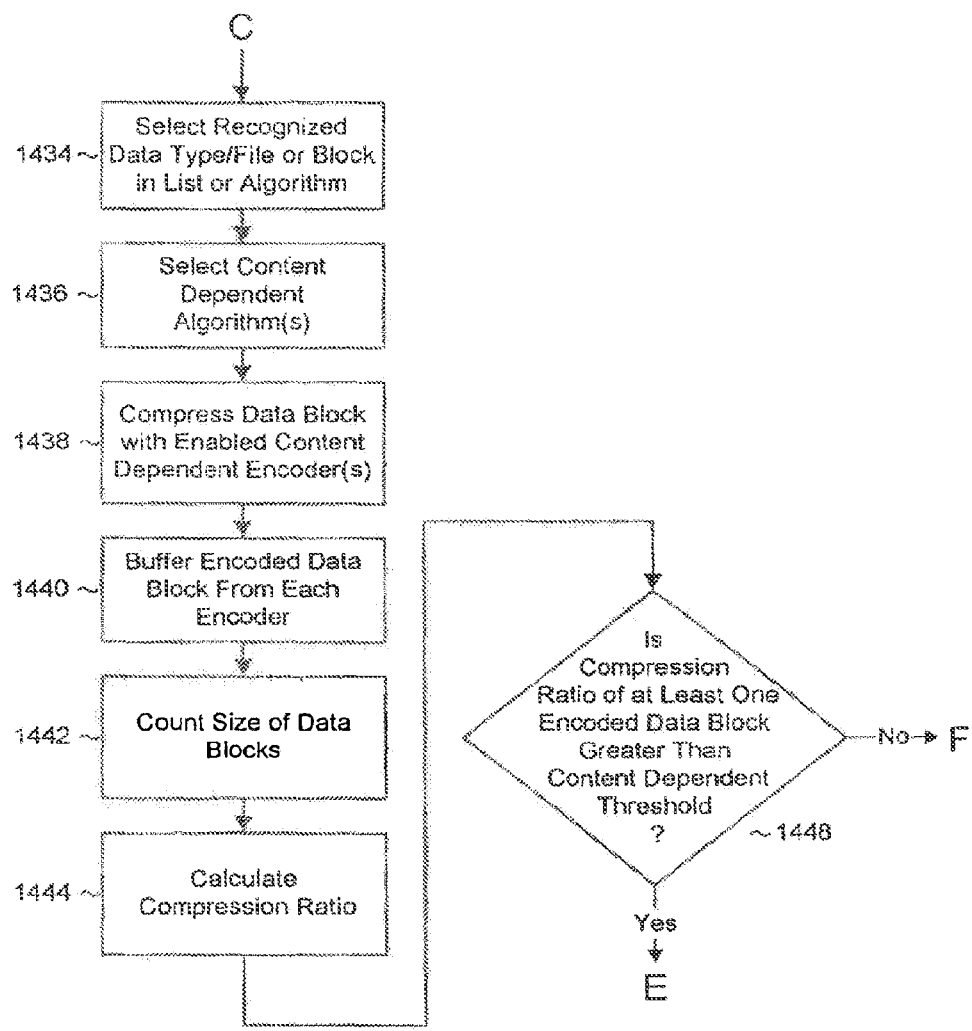

In other embodiments of the present invention described below, data compression is achieved using a combination of content dependent data compression and content independent data compression. For example, FIGS. 13*a* and 13*b* are block diagrams illustrating a data compression system employing both content independent and content dependent data compression according to one embodiment of the present invention, wherein content independent data compression is applied to a data block when the content of the data block cannot be identified or is not associable with a specific data compression algorithm. The data compression system comprises a counter module 10 that receives as input an uncompressed or compressed data stream. It is to be understood that the system processes the input data stream in data blocks that may range in size from individual bits through complete files or collections of multiple files. Additionally, the data block size may be fixed or variable. The counter module 10 counts the size of each input data block (i.e., the data block size is counted in bits, bytes, words, any convenient data multiple or metric, or any combination thereof).

An input data buffer 20, operatively connected to the counter module 10, may be provided for buffering the input data stream in order to output an uncompressed data stream in the event that, as discussed in further detail below, every encoder fails to achieve a level of compression that exceeds a priori specified content independent or content dependent minimum compression ratio thresholds. It is to be understood that the input data buffer 20 is not required for implementing the present invention.

A content dependent data recognition module 1300 analyzes the incoming data stream to recognize data types, data structures, data block formats, file substructures, file types, and/or any other parameters that may be indicative of either the data type/content of a given data block or the appropriate data compression algorithm or algorithms (in serial or in parallel) to be applied. Optionally, a data file recognition list(s) or algorithm(s) 1310 module may be employed to hold and/or determine associations between recognized data parameters and appropriate algorithms. Each data block that is recognized by the content data compression module 1300 is routed to a content dependent encoder module 1320, if not the data is routed to the content independent encoder module 30.

A content dependent encoder module 1320 is operatively connected to the content dependent data recognition module 1300 and comprises a set of encoders D1, D2, D3 . . . Dm. The encoder set D1, D2, D3 . . . Dm may include any number "n" of those lossless or lossy encoding techniques currently well known within the art such as MPEG4, various voice codecs, MPEG3, AC3, AAC, as well as lossless algorithms such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders and or codecs are preferably selected to provide a broad coverage of existing and future data types.

The content independent encoder module 30, which is operatively connected to the content dependent data recognition module 1300, comprises a set of encoders E1, E2, E3 . . . En. The encoder set E1, E2, E3 . . . En may include any number "n" of those lossless encoding techniques currently well known within the art such as run length, Huffman, Lempel-Ziv Dictionary Compression, arithmetic coding, data compaction, and data null suppression. Again, it is to be understood that the encoding techniques are selected based upon their ability to effectively encode different types of input data. It is to be appreciated that a full complement of encoders are preferably selected to provide a broad coverage of existing and future data types.

The encoder modules (content dependent 1320 and content independent 30) selectively receive the buffered input data blocks (or unbuffered input data blocks from the counter module 10) from module 1300 based on the results of recognition. Data compression is performed by the respective encoder modules wherein some or all of the encoders D1 . . . Dm or E1 . . . En processes a given input data block and outputs a corresponding set of encoded data blocks. It is to be appreciated that the system affords a user the option to enable/disable any one or more of the encoders D1 . . . Dm and E1 . . . En prior to operation. As is understood by those skilled in the art, such feature allows the user to tailor the operation of the data compression system for specific applications. It is to be further appreciated that the encoding process may be performed either in parallel or sequentially. In particular, the encoder set D1 through Dm of encoder module 1320 and/or the encoder set E1 through En of encoder module 30 may operate in parallel (i.e., simultaneously processing a given input data block by utilizing task multiplexing on a single central processor, via dedicated hardware, by executing on a plurality of processor or dedicated hardware systems, or any combination thereof). In addition, encoders D1 through Dm and E1 through Fn may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block. It should be further noted that one or more algorithms may be implemented in dedicated hardware such as an MPEG4 or MP3 encoding integrated circuit.

Buffer/counter modules 1330 and 40 are operatively connected to their respective encoding modules 1320 and 30, for buffering and counting the size of each of the encoded data blocks output from the respective encoder modules. Specifically, the content dependent buffer/counter 1330 comprises a plurality of buffer/counters BCD1, BCD2, BCD3 . . . BCDm, each operatively associated with a corresponding one of the encoders D1 . . . Dm. Similarly the content independent buffer/counters BCE1, BCE2, BCE3 . . . BCEn, each operatively associated with a corresponding one of the encoders E1 . . . En. A compression ratio module 1340, operatively connected to the content dependent output buffer/counters 1330 and content independent buffer/counters 40 determines the compression ratio obtained for each of the enabled encoders D1 . . . Dm and or E1 . . . En by taking the ratio of the size of the input data block to the size of the output data block stored in the corresponding buffer/counters BCD1, BCD2, BCD3 . . . BCDm and or BCE1, BCE2, BCE3 . . . BCEn. In addition, the compression ratio module 1340 compares each compression ratio with an a priori-specified compression ratio threshold limit to determine if at least one of the encoded data blocks output from the enabled encoders BCD1, BCD2, BCD3 . . . BCDm and or BCE1, BCE2, BCE3 . . . BCEn achieves a compression that meets an a priori-specified threshold. As is understood by those skilled in the art, the threshold limit maybe specified as any value inclusive of data expansion, no data compression or expansion, or any arbitrarily desired compression limit. It should be noted that different threshold values may be applied to content dependent and content independent encoded data. Further these thresholds may be adaptively modified based upon enabled encoders in either or both the content dependent or content independent encoder sets, along with any associated parameters. A compression type description module 1350, operatively coupled to the compression ratio module 1340, appends a corresponding compression type descriptor to each encoded data block which is selected for output so as to indicate the type of compression format of the encoded data block.

A mode of operation of the data compression system of FIGS. 13a and 13b will now be discussed with reference to the flow diagrams of FIGS. 14a-14d which illustrates a method for performing data compression using a combination of content dependent and content independent data compression. In general, content independent data compression is applied to a given data block when the content of a data block cannot be identified or is not associated with a specific data compression algorithm. More specifically, referring to FIG. 14a, a data stream comprising one or more data blocks is input into the data compression system and the first data block in the stream is received (step 1400). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1402). The data block is then stored in the buffer 20 (step 1404). The data block is then analyzed on a per block or multi-block basis by the content dependent data recognition module 1300 (step 1406). If the data stream content is not recognized utilizing the recognition list(s) or algorithms(s) module 1310 (step 1408) the data is routed to the content independent encoder module 30 and compressed by each (enabled) encoder E1 . . . En (step 1410). Upon completion of the encoding of the input data block, an encoded data block is output from each (enabled) encoder E1 . . . En and maintained in a corresponding buffer (step 1412), and the encoded data block size is counted (step 1414).

Next, a compression ratio is calculated for each encoded data block by taking the ratio of the size of the input data block (as determined by the input counter 10 to the size of each encoded data block output from the enabled encoders (step 1416). Each compression ratio is then compared with an apriori-specified compression ratio threshold (step 1418). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1420). If there are no encoded data blocks having a compression ratio that exceeds the compression ratio threshold limit (negative determination in step 1420), then the original unencoded input data block is selected for output and a null data compression type descriptor is appended thereto (step 1434). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1436).

On the other hand, if one or more of the encoded data blocks possess a compression ratio greater than the compression ratio threshold limit (affirmative result in step 1420), then the encoded data block having the greatest compression ratio is selected (step 1422). An appropriate data compression type descriptor is then appended (step 1424). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1426).

As previously stated the data block stored in the buffer 20 (step 1404) is analyzed on a per block or multi-block basis by the content dependent data recognition module 1300 (step 1406). If the data stream content is recognized utilizing the recognition list(s) or algorithms(s) module 1310 (step 1434) the appropriate content dependent algorithms are enabled and initialized (step 1436), and the data is routed to the content dependent encoder module 1320 and compressed by each (enabled) encoder D1 . . . Dm (step 1438). Upon completion of the encoding of the input data block, an encoded data block is output from each (enabled) encoder D1 . . . Dm and maintained in a corresponding buffer (step 1440), and the encoded data block size is counted (step 1442).

Next, a compression ratio is calculated for each encoded data block by taking the ratio of the size of the input data block (as determined by the input counter 10 to the size of each encoded data block output from the enabled encoders (step 1444). Each compression ratio is then compared with an a priori-specified compression ratio threshold (step 1448). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1420). If there are no encoded data blocks having a compression ratio that exceeds the compression ratio threshold limit (negative determination in step 1420), then the original unencoded input data block is selected for output and a null data compression type descriptor is appended thereto (step 1434). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1436).

On the other hand, if one or more of the encoded data blocks possess a compression ratio greater than the compression ratio threshold limit (affirmative result in step 1420), then the encoded data block having the greatest compression ratio is selected (step 1422). An appropriate data compression type descriptor is then appended (step 1424). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1426).

After the encoded data block or the unencoded data input data block is output (steps 1426 and 1436), a determination is made as to whether the input data stream contains additional data blocks to be processed (step 1428). If the input data stream includes additional data blocks (affirmative result in step 1428), the next successive data block is received (step 1432), its block size is counted (return to step 1402) and the data compression process in repeated. This process is iterated for each data block in the input data stream. Once the final input data block is processed (negative result in step 1428), data compression of the input data stream is finished (step 1430).

Since a multitude of data types may be present within a given input data block, it is often difficult and/or impractical to predict the level of compression that will be achieved by a specific encoder. Consequently, by processing the input data blocks with a plurality of encoding techniques and comparing the compression results, content free data compression is advantageously achieved. Further the encoding may be lossy or lossless dependent upon the input data types. Further if the data type is not recognized the default content independent lossless compression is applied. It is not a requirement that this process be deterministic—in fact a certain probability may be applied if occasional data loss is permitted. It is to be appreciated that this approach is scalable through future generations of processors, dedicated hardware, and software. As processing capacity increases and costs reduce, the benefits provided by the present invention will continue to increase. It should again be noted that the present invention may employ any lossless data encoding technique.

Figure 15A:
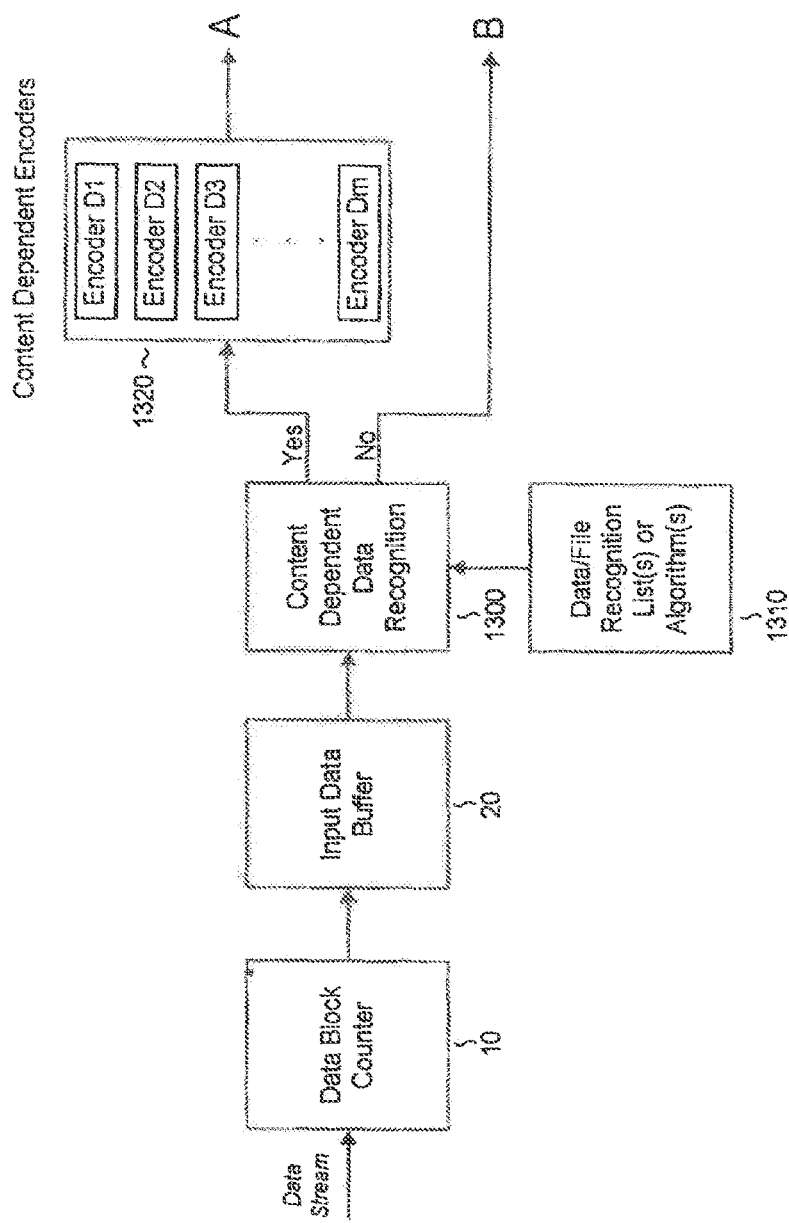
FIGS. 15a and 15b comprise a block diagram of a data compression system comprising content dependent and content independent data compression, according to another embodiment of the present invention.
Figure 15B:
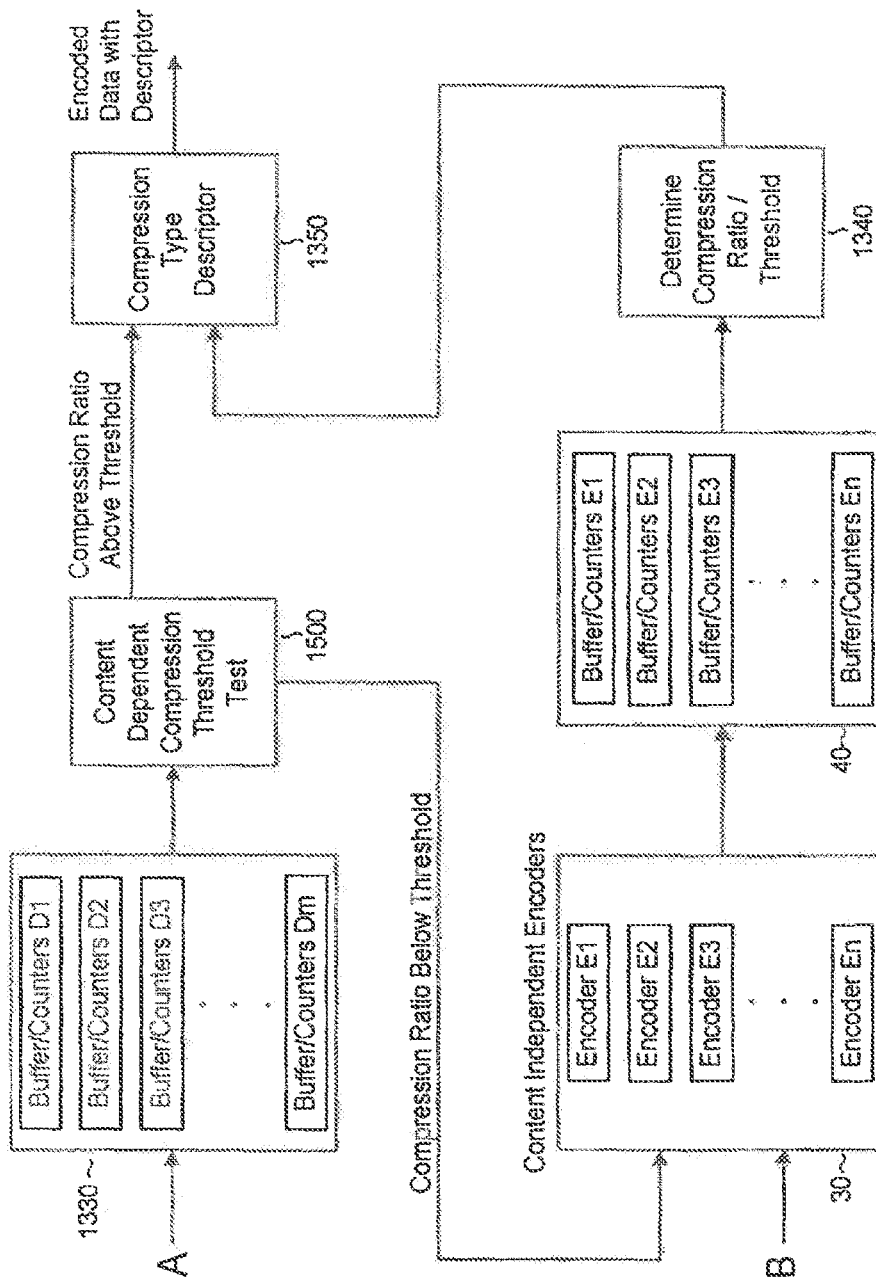
Figure 16A:
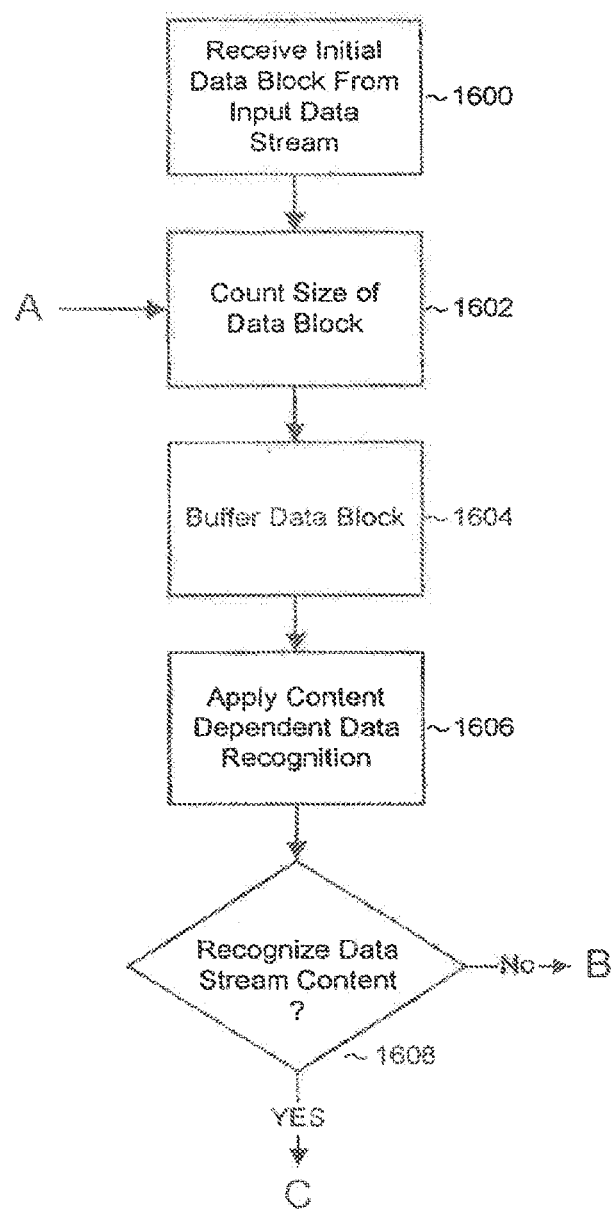
FIGS. 16a-16d comprise a flow diagram of a data compression method using both content dependent and content independent data compression, according to another aspect of the present invention.
Figure 16B:
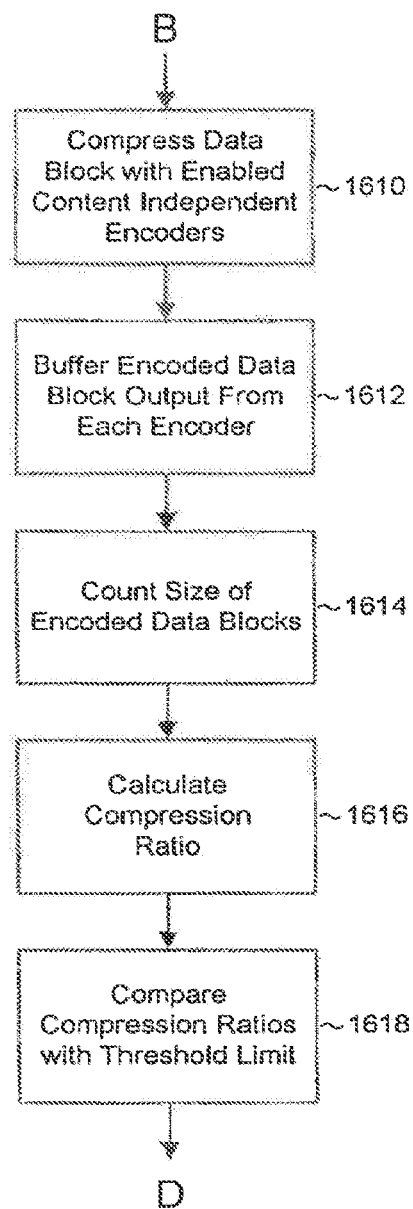
Figure 16C:
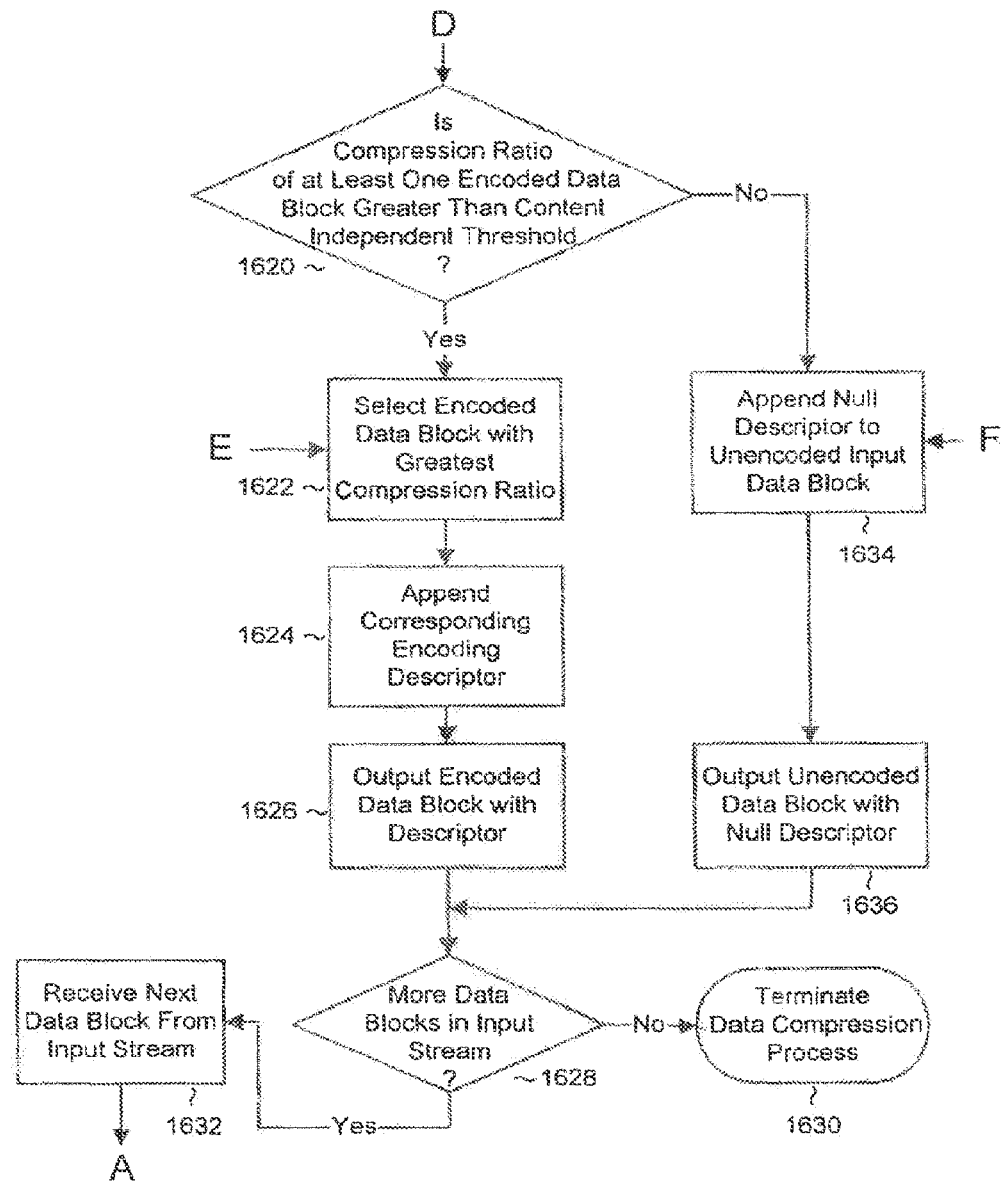
Figure 16D:
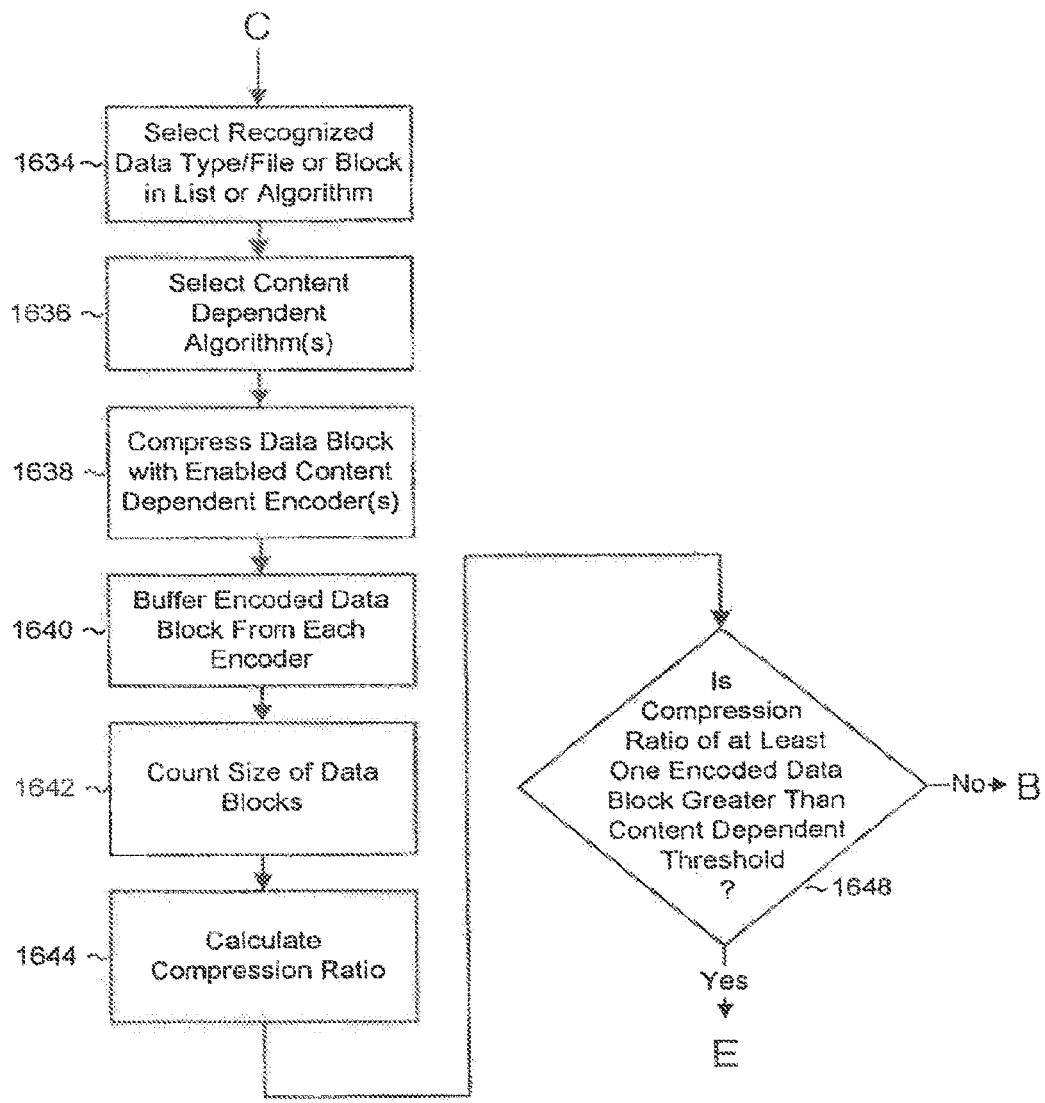

FIGS. 15*a* and 15*b* are block diagrams illustrating a data compression system employing both content independent and content dependent data compression according to another embodiment of the present invention. The system in FIGS. 15*a* and 15*b* is similar in operation to the system of FIGS. 13*a* and 13*b* in that content independent data compression is applied to a data block when the content of the data block cannot be identified or is not associable with a specific data compression algorithm. The system of FIGS. 15*a* and 15*b* additionally performs content independent data compression on a data block when the compression ratio obtained for the data block using the content dependent data compression does not meet a specified threshold.

A mode of operation of the data compression system of FIGS. 15*a* and 15*b* will now be discussed with reference to the flow diagram of FIGS. 16*a*-16*d*, which illustrates a method for performing data compression using a combination of content dependent and content independent data compression. A data stream comprising one or more data blocks is input into the data compression system and the first data block in the stream is received (step 1600). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1602). The data block is then stored in the buffer 20 (step 1604). The data block is then analyzed on a per block or multi-block basis by the content dependent data recognition module 1300 (step 1606). If the data stream content is not recognized utilizing the recognition list(s) or algorithms(s) module 1310 (step 1608) the data is routed to the content independent encoder module 30 and compressed by each (enabled) encoder E1 ... En (step 1610). Upon completion of the encoding of the input data block, an encoded data block is output from each (enabled) encoder E1 ... En and maintained in a corresponding buffer (step 1612), and the encoded data block size is counted (step 1614).

Next, a compression ratio is calculated for each encoded data block by taking the ratio of the size of the input data block (as determined by the input counter 10 to the size of each encoded data block output from the enabled encoders (step 1616). Each compression ratio is then compared with an a priori-specified compression ratio threshold (step 1618). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1620). If there are no encoded data blocks having a compression ratio that exceeds the compression ratio threshold limit (negative determination in step 1620), then the original unencoded input data block is selected for output and a null data compression type descriptor is appended thereto (step 1634). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1636).

On the other hand, if one or more of the encoded data blocks possess a compression ratio greater than the compression ratio threshold limit (affirmative result in step 1620), then the encoded data block having the greatest compression ratio is selected (step 1622). An appropriate data compression type descriptor is then appended (step 1624). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1626).

As previously stated the data block stored in the buffer 20 (step 1604) is analyzed on a per block or multi-block basis by the content dependent data recognition module 1300 (step 1606). If the data stream content is recognized utilizing the recognition list(s) or algorithms(s) module 1310 (step 1634) the appropriate content dependent algorithms are enabled and initialized (step 1636) and the data is routed to the content dependent encoder module 1620 and compressed by each (enabled) encoder D1 ... Dm (step 1638). Upon completion of the encoding of the input data block, an encoded data block is output from each (enabled) encoder D1 ... Dm and maintained in a corresponding buffer (step 1640), and the encoded data block size is counted (step 1642).

Next, a compression ratio is calculated for each encoded data block by taking the ratio of the size of the input data block (as determined by the input counter 10 to the size of each encoded data block output from the enabled encoders (step 1644). Each compression ratio is then compared with an a priori-specified compression ratio threshold (step 1648). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1648). If there are no encoded data blocks having a compression ratio that exceeds the compression ratio threshold limit (negative determination in step 1620), then the original unencoded input data block is routed to the content independent encoder module 30 and the process resumes with compression utilizing content independent encoders (step 1610).

After the encoded data block or the unencoded data input data block is output (steps 1626 and 1636), a determination is made as to whether the input data stream contains additional data blocks to be processed (step 1628). If the input data stream includes additional data blocks (affirmative result in step 1628), the next successive data block is received (step 1632), its block size is counted (return to step 1602) and the data compression process in repeated. This process is iterated for each data block in the input data stream. Once the final input data block is processed (negative result in step 1628), data compression of the input data stream is finished (step 1630).

Figure 17A:
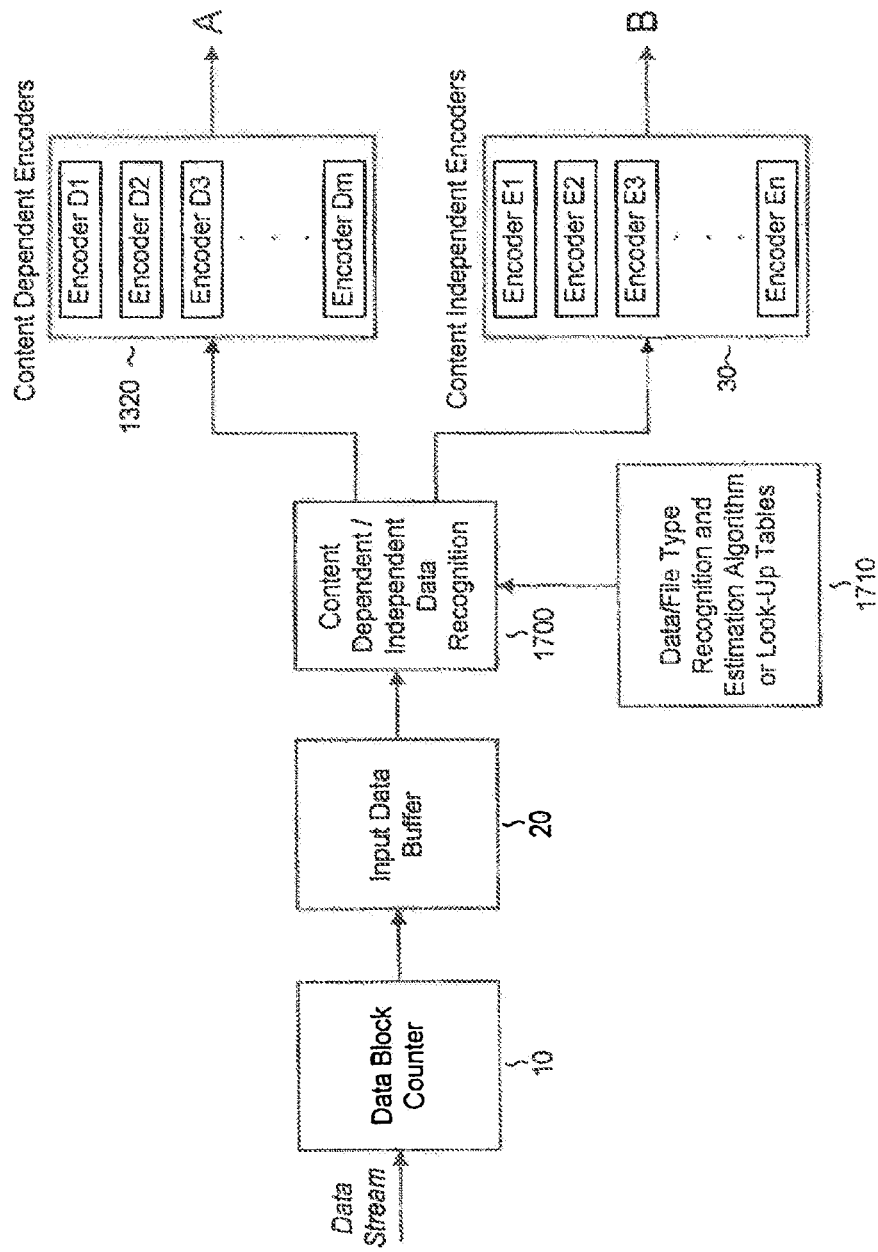
FIGS. 17a and 17b comprise a block diagram of a data compression system comprising content dependent and content independent data compression, according to another embodiment of the present invention.
Figure 17B:
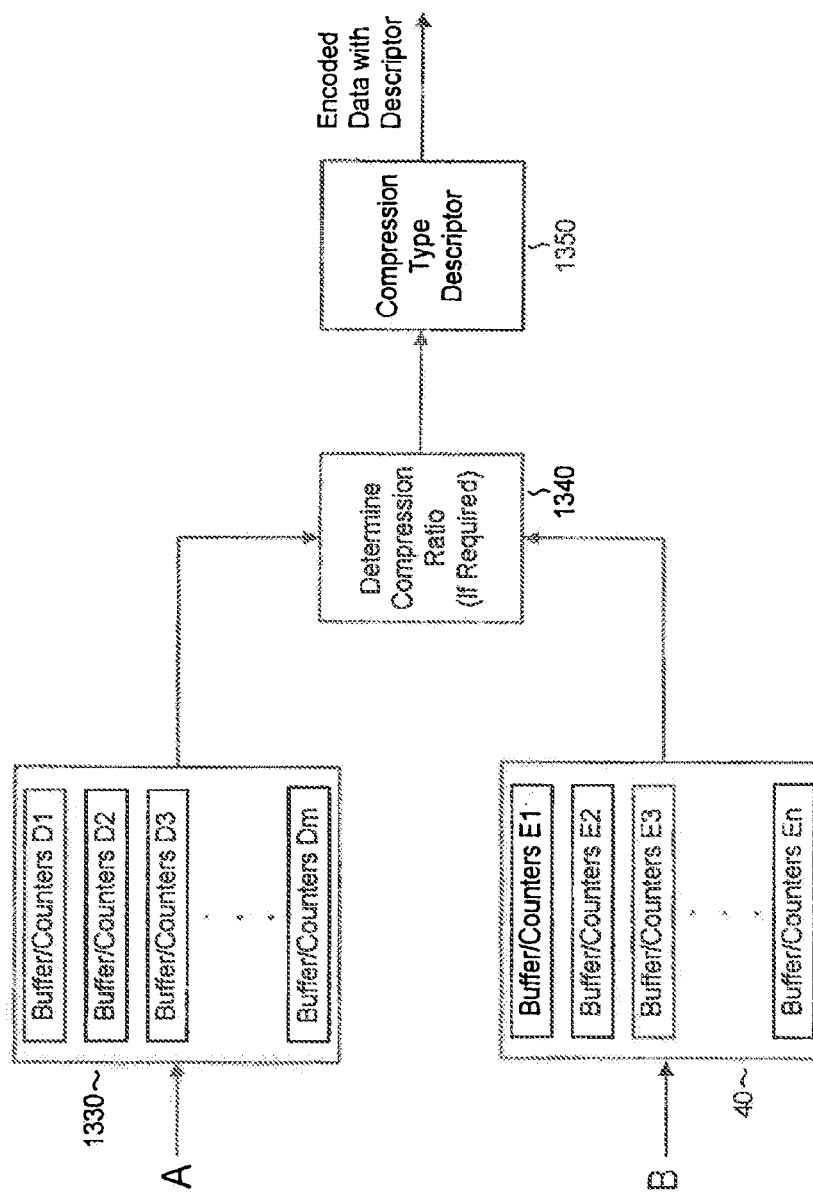
Figure 18A:
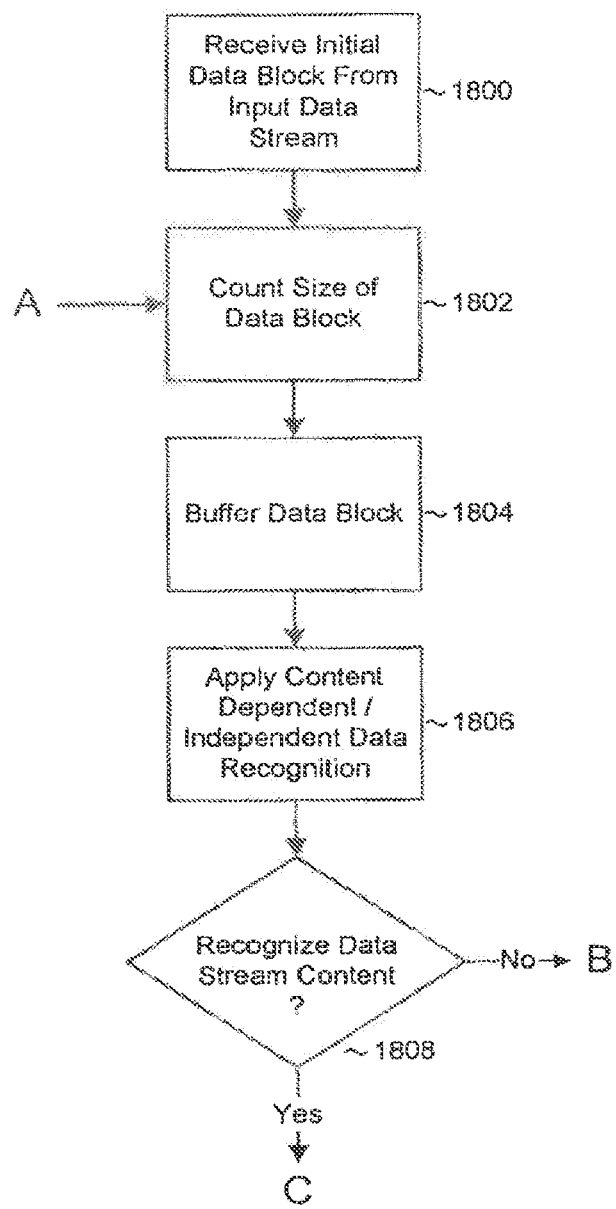
FIGS. 18a-18d comprise a flow diagram of a data compression method using both content dependent and content independent data compression, according to another aspect of the present invention.
Figure 18B:
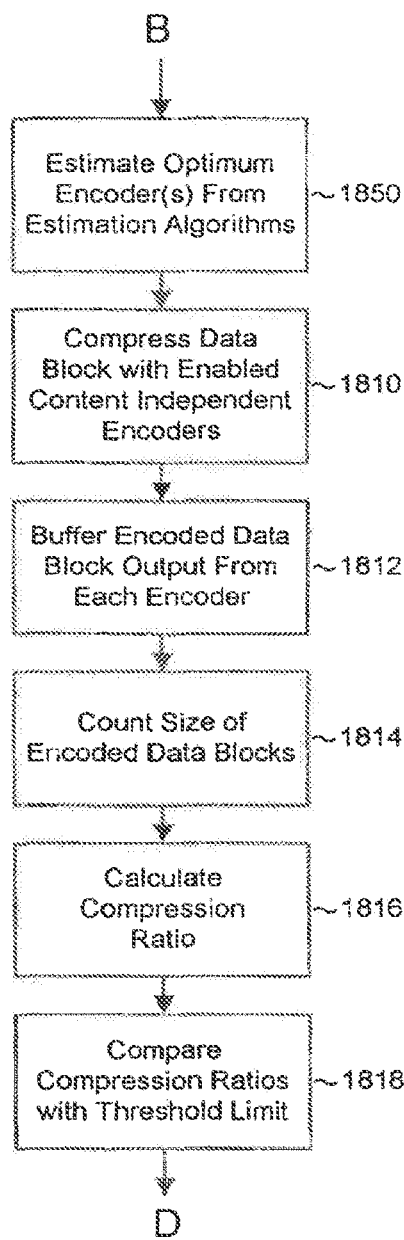
Figure 18C:
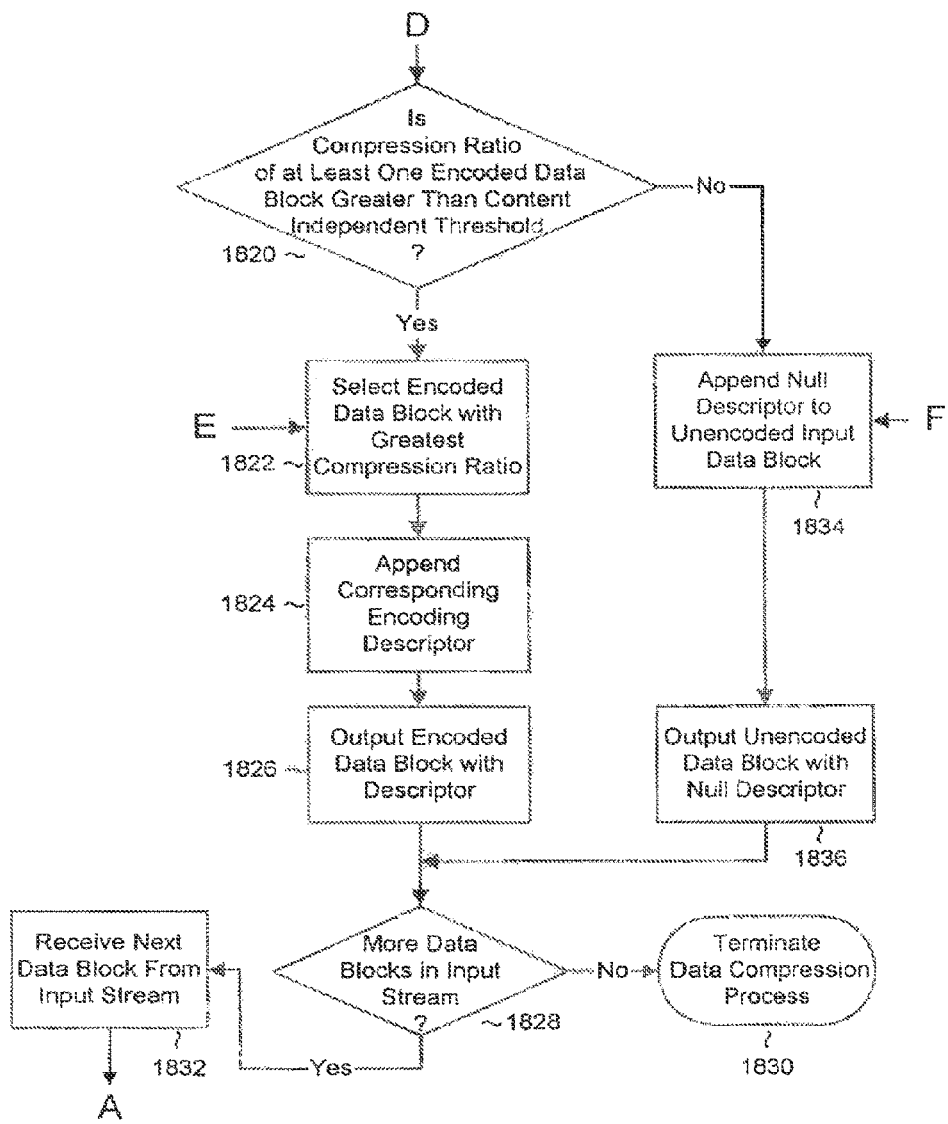
Figure 18D:
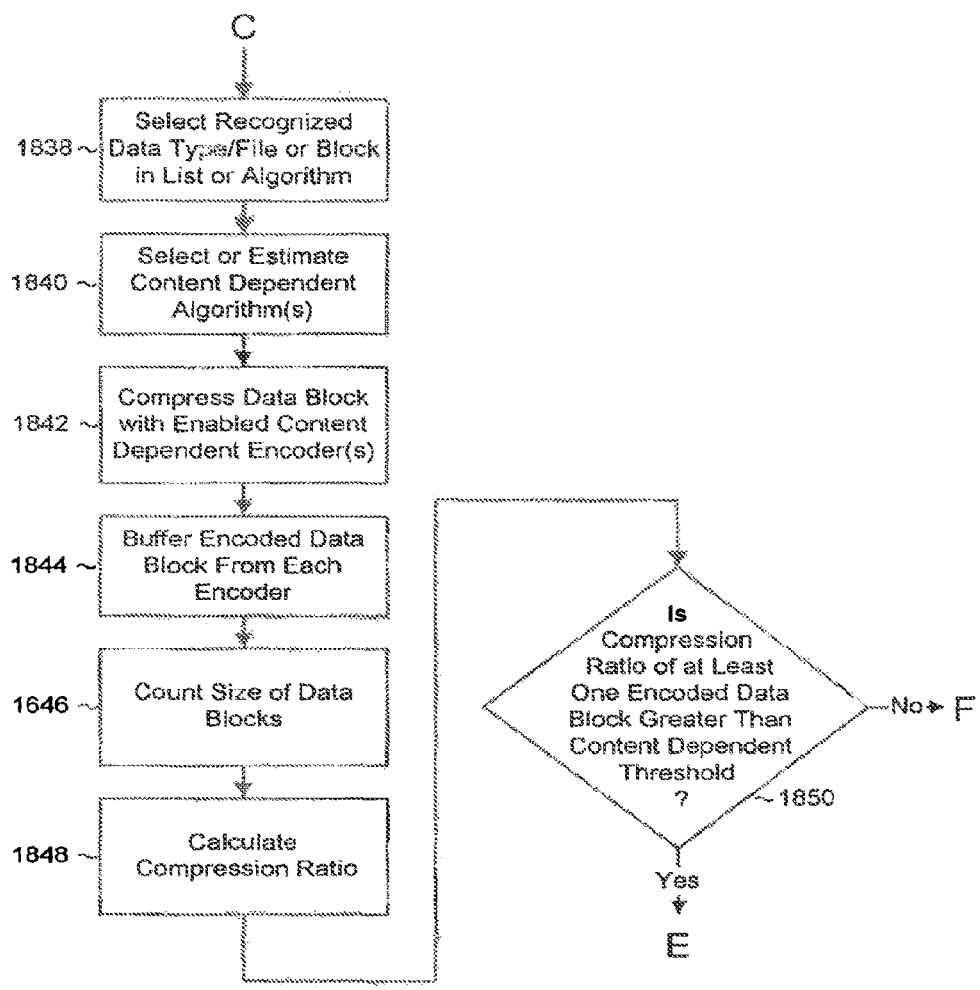

FIGS. 17*a* and 17*b* are block diagrams illustrating a data compression system employing both content independent and content dependent data compression according to another embodiment of the present invention. The system in FIGS. 17*a* and 17*b* is similar in operation to the system of FIGS. 13*a* and 13*b* in that content independent data compression is applied to a data block when the content of the data Nock cannot be identified or is not associable with a specific data compression algorithm. The system of FIGS. 17*a* and 17*b* additionally uses a priori estimation algorithms or look-up tables to estimate the desirability of using content independent data compression encoders and/or content dependent data compression encoders and selecting appropriate algorithms or subsets thereof based on such estimation.

More specifically, a content dependent data recognition and or estimation module 1700 is utilized to analyze the incoming data stream for recognition of data types, data strictures, data block formats, file substructures, file types, or any other parameters that may be indicative of the appropriate data compression algorithm or algorithms (in serial or in parallel) to be applied. Optionally, a data file recognition list(s) or algorithm(s) 1710 module may be employed to hold associations between recognized data parameters and appropriate algorithms. If the content data compression module recognizes a portion of the data, that portion is routed to the content dependent encoder module 1320, if not the data is routed to the content independent encoder module 30. It is to be appreciated that process of recognition (modules 1700 and 1710) is not limited to a deterministic recognition, but may further comprise a probabilistic estimation of which encoders to select for compression from the set of encoders of the content dependent module 1320 or the content independent module 30. For example, a method may be employed to compute statistics of a data block whereby a determination that the locality of repetition of characters in a data stream is determined is high can suggest a text document, which may be beneficially compressed with a lossless dictionary type algorithm. Further the statistics of repeated characters and relative frequencies may suggest a specific type of dictionary algorithm. Long strings will require a wide dictionary file while a wide diversity of strings may suggest a deep dictionary. Statistics may also be utilized in algorithms such as Huffman where various character statistics will dictate the choice of different Huffman compression tables. This technique is not limited to lossless algorithms but may be widely employed with lossy algorithms. Header information in frames for video files can imply a specific data resolution. The estimator then may select the appropriate lossy compression algorithm and compression parameters (amount of resolution desired). As shown in previous embodiments of the present invention, desirability of various algorithms and now associated resolutions with lossy type algorithms may also be applied in the estimation selection process.

A mode of operation of the data compression system of FIGS. 17a and 17b will now be discussed with reference to the flow diagrams of FIGS. 18a-18d. The method of FIGS. 18a-18d use a priori estimation algorithms or look-up tables to estimate the desirability or probability of using content independent data compression encoders or content dependent data compression encoders, and select appropriate or desirable algorithms or subsets thereof based on such estimates. A data stream comprising one or more data blocks is input into the data compression system and the first data block in the stream is received (step 1800). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1802). The data block is then stored in the buffer 20 (step 1804). The data block is then analyzed on a per block or multi-block basis by the content dependent/content independent data recognition module 1700 (step 1806). If the data stream content is not recognized utilizing the recognition list(s) or algorithms(s) module 1710 (step 1808) the data is to the content independent encoder module 30. An estimate of the best content independent encoders is performed (step 1850) and the appropriate encoders are enabled and initialized as applicable. The data is then compressed by each (enabled) encoder E1 . . . En (step 1810). Upon completion of the encoding of the input data block, an encoded data block is output from each (enabled) encoder E1 . . . En and maintained in a corresponding buffer (step 1812), and the encoded data block size is counted (step 1814).

Next, a compression ratio is calculated for each encoded data block by taking the ratio of the size of the input data block (as determined by the input counter 10 to the size of each encoded data block output from the enabled encoders (step 1816). Each compression ratio is then compared with an a priori-specified compression ratio threshold (step 1818). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1820). If there are no encoded data blocks having a compression ratio that exceeds the compression ratio threshold limit (negative determination in step 1820), then the original unencoded input data block is selected for output and a null data compression type descriptor is appended thereto (step 1834). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1836).

On the other hand, if one or more of the encoded data blocks possess a compression ratio greater than the compression ratio threshold limit (affirmative result in step 1820), then the encoded data block having the greatest compression ratio is selected (step 1822). An appropriate data compression type descriptor is then appended (step 1824). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1826).

As previously stated the data block stored in the buffer 20 (step 1804) is analyzed on a per block or multi-block basis by the content dependent data recognition module 1300 (step 1806). If the data stream content is recognized or estimated utilizing the recognition list(s) or algorithms(s) module 1710 (affirmative result in step 1808) the recognized data type/file or block is selected based on a list or algorithm (step 1838) and an estimate of the desirability of using the associated content dependent algorithms can be determined (step 1840). For instance, even though a recognized data type may be associated with three different encoders, an estimation of the desirability of using each encoder may result in only one or two of the encoders being actually selected for use. The data is routed to the content dependent encoder module 1320 and compressed by each (enabled) encoder D1 . . . Dm (step 1842). Upon completion of the encoding of the input data block, an encoded data block is output from each (enabled) encoder D1 . . . Dm and maintained in a corresponding buffer (step 1844), and the encoded data block size is counted (step 1846).

Next, a compression ratio is calculated for each encoded data block by taking the ratio of the size of the input data block (as determined by the input counter 10 to the size of each encoded data block output from the enabled encoders (step 1848). Each compression ratio is then compared with an a priori-specified compression ratio threshold (step 1850). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1820). If there are no encoded data blocks having a compression ratio that exceeds the compression ratio threshold limit (negative determination in step 1820), then the original unencoded input data block is selected for output and a null data compression type descriptor is appended thereto (step 1834). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1836).

On the other hand, if one or more of the encoded data blocks possess a compression ratio greater than the compression ratio threshold limit (affirmative result in step 1820), then the encoded data block having the greatest compression ratio is selected (step 1822). An appropriate data compression type descriptor is then appended (step 1824). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1826).

After the encoded data block or the unencoded data input data block is output (steps 1826 and 1836), a determination is made as to whether the input data stream contains additional data blocks to be processed (step 1828). If the input data stream includes additional data blocks (affirmative result in step 1428), the next successive data block is received (step 1832), its block size is counted (return to step 1802) and the data compression process in repeated. This process is iterated for each data block in the input data stream. Once the final input data block is processed (negative result in step 1828), data compression of the input data stream is finished (step 1830).

It is to be appreciated that in the embodiments described above with reference to FIGS. 13-18, an a priori specified time limit or any other real-time requirement may be employed to achieve practical and efficient real-time operation.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method of decompressing in a data decompression engine one or more compressed data blocks included in one or more data packets, the one or more data packets being transmitted in sequence from one of an internal or an external source to the data decompression engine, wherein a data packet from among the one or more data packets comprises a header containing control information followed by one or more compressed data blocks of the data packet, the method comprising:

applying a plurality of decompression techniques to the one or more compressed data blocks using the data decompression engine;

identifying one or more associated recognizable data tokens of the data packet;
  wherein the one or more associated recognizable data tokens identifies a selected compression encoder used to compress the one or more compressed data blocks associated with the data packet; and
  wherein the selected compression encoder was selected based on content of a data block on which a compression algorithm was applied to provide the compressed data block;

applying one or more decompression decoders to the compressed data block corresponding to the data packet based on the one or more associated recognizable data tokens;

decompressing the compressed data block with an appropriate decompression decoder if the one or more associated recognizable data tokens indicates that the data block was encoded utilizing content dependent data compression; and decompressing the compressed data block with an appropriate decompression decoder if the one or more associated recognizable data tokens indicates that the data block was encoded utilizing content independent data compression.

2. The method of claim 1, wherein the decompressing is performed by an entity different than the compression encoder performing the compression.

3. The method of claim 1, wherein the one or more recognizable data tokens include values corresponding to one or more decoding techniques to be applied by the one or more decompression decoders.

4. The method of claim 1, wherein the step of decompressing the compressed data block with the appropriate decompression decoder, when the one or more recognizable data tokens indicate that the compressed data block was encoded utilizing content independent data compression occurs prior to the step of decompressing the compressed data block with the appropriate decompression decoder, when the one or more recognizable data tokens indicate that the compressed data block was encoded utilizing content dependent data compression.

5. The method of claim 1, wherein:
the applying the one or more data compression decoders includes applying a plurality of data compression decoders; and
the applying the one or more decompression decoders further includes applying a plurality of the one or more decompression decoders to decompress a plurality of compressed data blocks from among the one or more compressed data blocks corresponding to the data packet.

6. The method of claim 5, wherein the applying the one or more decompression decoders further includes:
applying a plurality of the one or more decompression decoders to decompress a plurality of the one or more data packets to provide a plurality of decompressed data packets.

7. The method of claim 6, further comprising:
generating one or more decompressed data blocks in sequence from the plurality of decompressed data packets.

8. The method of claim 1, wherein the method of decompressing the one or more compressed data blocks is performed in real-time.

9. The method of claim 1, wherein the one or more decompression decoders and their associated compression encoders utilize techniques to permit data that was selected and compressed by the selected compression encoder to be fully recovered when decompressed by the one or more decompression decoders.

10. The method of claim 1, wherein the one or more decompression decoders and their associated compression encoders utilize lossy techniques.

11. The method of claim 1, wherein the appropriate decompression decoder selected when the one or more recognizable data tokens indicate that the compressed data block was encoded utilizing content independent data compression applies a different decompression algorithm than the appropriate decompression decoder selected when the one or more recognizable data tokens indicate that the compressed data block was encoded utilizing content dependent data compression.

12. The method of claim 1, wherein the appropriate decompression decoder selected when the one or more recognizable data tokens indicate that the compressed data block was encoded utilizing content independent data compression applies the same decompression algorithm than the appropriate decompression decoder selected when the one or more recognizable data tokens indicate that the compressed data block was encoded utilizing content dependent data compression.

13. The method of claim 1, wherein the appropriate decompression decoder selected when the one or more recognizable data tokens indicate that the compressed data block was encoded utilizing content independent data compression is the same decompression decoder as the appropriate decompression decoder selected when the one or more recognizable data tokens indicate that the compressed data block was encoded utilizing content dependent data compression.

14. A system for decompressing, one or more compressed data blocks included in one or more data packets using a data decompression engine, the one or more data packets being transmitted in sequence from a source that is internal or external to the data decompression engine, wherein a data packet from among the one or more data packets comprises a header containing control information followed by one or more compressed data blocks of the data packet the system comprising:
a data decompression processor configured to analyze the data packet to identify one or more recognizable data tokens associated with the data packet, the one or more recognizable data identifying a selected encoder used to compress one or more data blocks to provide the one or more compressed data blocks, the encoder being selected based on content of the one or more data blocks on which a compression algorithm was applied;
one or more decompression decoders configured to decompress a compressed data block from among the one or more compressed data blocks associated with the data packet based on the one or more recognizable data tokens; wherein:
the one or more decompression decoders are further configured to decompress the compressed data block utilizing content dependent data decompression to provide a first decompressed data block when the one or more recognizable data tokens indicate that the data block was encoded utilizing content dependent data compression; and
the one or more decompression decoders are further configured to decompress the compressed data block utilizing content independent data decompression to provide a second decompressed data block when the one or more recognizable data tokens indicate that the data block was encoded utilizing content independent data compression; and
an output interface, coupled to the data decompression engine, configured to output a decompressed data packet including the first or the second decompressed data block.

15. The system of claim 14, wherein the one or more decompression decoders are separate from the selected encoder used to compress the one or more data blocks.

16. The system of claim 14, wherein the one or more recognizable data tokens include values corresponding to one or more applied decoding techniques utilized by the one or more decompression decoders.

17. The system of claim 14, wherein the one or more decompression decoders are further configured to decompress the compressed data block utilizing one or more appropriate decoders for the data block encoded with content independent data compression prior to further decoding the data block utilizing one or more appropriate decoders for the data block encoded with content dependent data compression.

18. The system of claim 14, wherein the one or more decompression decoders are further configured to decompress a subset of the one or more compressed data blocks corresponding to the data packet.

19. The system of claim 18, wherein the one or more decompression decoders are further configured to decompress a subset of the one or more data packets.

20. The system of claim 14, wherein the one or more decompression decoders are further configured to decompress the compressed data block in real-time.

21. A method of compressing a plurality of data blocks residing in data packets, the data packets being transmitted in sequence from a source that is internal or external to a source of the compression method, the one or more compressed data packets including one or more compressed data blocks, wherein a data packet from among the one or more data packets comprises a header containing control information followed by one or more compressed data blocks of the data packet, the method comprising:

applying a plurality of compression techniques to the plurality of data blocks using a data compression engine;

analyzing content of a data block from among the plurality of data blocks to determine any characteristic, attribute, or parameter of the data block, wherein the analyzing of the data within the data block excludes analyzing based on a descriptor that is indicative of the characteristic, attribute, or parameter of the data block;

selecting one or more encoders based on the characteristic, attribute, or parameter of the data block and a file, wherein the file indicates the characteristic, attribute, or parameter of the data block and their associated encoders;

compressing the data block with the selected one or more encoders utilizing content dependent data compression when the characteristic, attribute, or parameter of the data residing within the data block is recognized as associated with an encoder utilizing content dependent data compression;

compressing the data block with the selected one or more encoders utilizing content independent data compression when the characteristic, attribute, or parameter of the data residing within the data block is not recognized as associated with an encoder utilizing content dependent data compression; and providing a recognizable data token which identifies the selected one or more encoders utilized for compression of the data block in the one or more data blocks transmitted in sequence.

22. The method of claim 21, wherein a plurality of the one or more encoders are applied to compress the plurality of data blocks.

23. The method of claim 21, further comprising:

transmitting one or more data packets in sequence from outputs of the one or more encoders.

24. The method of claim 21, wherein the data blocks contain financial data.

25. The method of claim 21, wherein the method of compressing the plurality of data blocks is performed in real-time.

26. The method of claim 21, wherein the encoders are lossy, and wherein the compression permits the compressed data block to be recovered in full when decompressed.

27. A system for compressing a plurality of data blocks that are compressed and placed into the payload portion of a data packet from among one or more data packets, the data packets being transmitted in sequence from a source that is internal or external to the compression system, wherein the data packet comprises a header containing control information followed by the plurality of compressed data blocks of the data packet, the system comprising:

a data compression processor configured to analyze content of a data block to determine any characteristic, attribute, or parameter of the data block, where in the analyizing of the data within the data block excludes analyzing based on a descriptor that is indicative of the any characteristic attribute or parameter of the data block;

one or more compression encoders configured to be selected based on the characteristic, attribute, or parameter of the data block and a file, wherein the file indicates the characteristic, attribute, or parameter of the data block and their associated compression encoders; wherein:

the data block is compressed by the selected one or more compression encoders utilizing content dependent data compression when the characteristic, attribute, or parameter of the data block is recognized as being associated with an encoder utilizing content dependent data compression; and the data block is compressed by the selected one or more compression encoders utilizing content independent data compression when the characteristic, attribute, or parameter of the data block is not recognized as being associated with an encoder utilizing content dependent data compression; and an output interface, coupled to the data compression processor, configured to output a recognizable data token identifying the selected one or more compression encoders, the recognizable data token including any recognizable data token representative of one or more values in the compressed data packet.

28. The system of claim 27, wherein the one or more compression encoders are further configured to compress a plurality of data blocks associated with the compressed data packet.

29. The system of claim 28, wherein the one or more compression encoders are further configured to output a plurality of compressed data blocks.

30. The system of claim 27, wherein the one or more compression encoders are further configured to compress the data blocks in real-time.

* * * * *